(12) United States Patent
Mizuno et al.

(10) Patent No.: US 12,421,340 B2
(45) Date of Patent: Sep. 23, 2025

(54) CURABLE COMPOSITION, CURED PRODUCT, COLOR FILTER, SOLID-STATE IMAGING ELEMENT, AND IMAGE DISPLAY DEVICE

(71) Applicant: FUJIFILM Corporation, Tokyo (JP)

(72) Inventors: Akio Mizuno, Shizuoka (JP); Yushi Kaneko, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 729 days.

(21) Appl. No.: 17/680,309

(22) Filed: Feb. 25, 2022

(65) Prior Publication Data

US 2022/0177627 A1    Jun. 9, 2022

Related U.S. Application Data

(63) Continuation of application No. PCT/JP2020/030730, filed on Aug. 12, 2020.

(30) Foreign Application Priority Data

Aug. 27, 2019    (JP) .................................. 2019-154275

(51) Int. Cl.

| C08F 265/06 | (2006.01) |
| C08F 2/08 | (2006.01) |
| C08G 63/127 | (2006.01) |
| C08K 5/00 | (2006.01) |
| C08K 5/33 | (2006.01) |
| C08K 5/3417 | (2006.01) |
| C08K 5/56 | (2006.01) |
| G02B 5/22 | (2006.01) |
| C08G 63/688 | (2006.01) |

(52) U.S. Cl.
CPC .............. *C08F 265/06* (2013.01); *C08F 2/08* (2013.01); *C08G 63/127* (2013.01); *C08K 5/0041* (2013.01); *C08K 5/33* (2013.01); *C08K 5/3417* (2013.01); *C08K 5/56* (2013.01); *G02B 5/223* (2013.01); *C08G 63/688* (2013.01)

(58) Field of Classification Search
CPC ..... C08G 63/127; C08G 63/688; C08G 63/91
See application file for complete search history.

(56) References Cited

U.S. PATENT DOCUMENTS

| 11,152,413 B2 | 10/2021 | Takishita et al. |
| 2017/0174869 A1 | 6/2017 | Arayama et al. |

FOREIGN PATENT DOCUMENTS

| JP | 2008246469 | 10/2008 |
| JP | 2010072293 | 4/2010 |
| JP | 2010152224 | 7/2010 |
| JP | 2010152224 A | * 7/2010 |
| JP | 2010235739 A | * 10/2010 |
| JP | 2011099919 | 5/2011 |
| JP | 2013254127 | 12/2013 |
| JP | 2014149542 | 8/2014 |
| JP | 2019078878 | 5/2019 |
| JP | 2019105820 | 6/2019 |

(Continued)

OTHER PUBLICATIONS

JP-2010235739-A (Oct. 21, 2010); machine translation. (Year: 2010).*

(Continued)

*Primary Examiner* — Rip A Lee
(74) *Attorney, Agent, or Firm* — JCIPRNET

(57) ABSTRACT

Provided are a curable composition including a pigment, a curable compound, and a resin A having a constitutional unit represented by Formula (1), a constitutional unit represented by Formula (2), and a constitutional unit having a molecular weight of 1,000 or less and represented by Formula (3); a cured product of the curable composition; a color filter including the cured product; and a solid-state imaging element and an image display device including the color filter. $X^1$ represents an (m+2)-valent organic group, $X^2$ and $X^3$ represent a trivalent organic group, m represents an integer of 1 to 4, $L^2$'s each independently represent O or NR, $L^3$'s each independently represent a carbonyl group, O, or NR, R represents a hydrogen atom, an alkyl group, or an aryl group, $P^1$ represents a group having a polymer chain, $R^1$'s each independently represent a substituent, and $R^3$ represents a group having a polymerizable group.

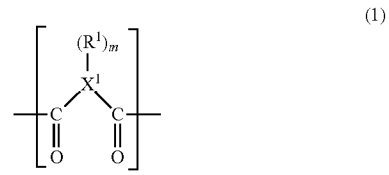

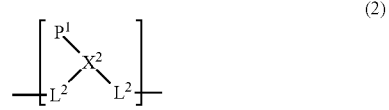

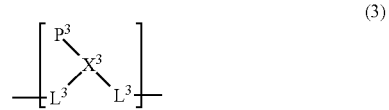

17 Claims, No Drawings

(56) References Cited

FOREIGN PATENT DOCUMENTS

| | | | | |
|---|---|---|---|---|
| JP | 2019139230 | 8/2019 | | |
| JP | 2020003590 | 1/2020 | | |
| JP | 2020038334 | 3/2020 | | |
| JP | 2020038335 | 3/2020 | | |
| JP | 2020050854 | 4/2020 | | |
| JP | 2020063413 | 4/2020 | | |
| JP | 2020066702 | 4/2020 | | |
| JP | 2020070426 | 5/2020 | | |
| JP | 2020076046 | 5/2020 | | |
| JP | 2020101575 | 7/2020 | | |
| JP | 2020132787 | 8/2020 | | |
| KR | 10-2016-0099656 A * | 8/2016 | ............. | C09B 69/10 |
| WO | WO-2015115415 A1 * | 8/2015 | ............. | C09B 69/10 |
| WO | 2016035695 | 3/2016 | | |
| WO | 2019039172 | 2/2019 | | |
| WO | WO-2020044720 A1 * | 3/2020 | ................ | C08F 2/44 |

OTHER PUBLICATIONS

JP-2010152224-A (Jul. 8, 2010); machine translation. (Year: 2010).*
"International Search Report (Form PCT/ISA/210) of PCT/JP2020/030730," mailed on Nov. 2, 2020, with English translation thereof, pp. 1-4.
"Written Opinion of the International Searching Authority (Form PCT/ISA/237)" of PCT/JP2020/030730, mailed on Nov. 2, 2020, with English translation thereof, pp. 1-8.
"Notice of Reasons for Refusal of Japan Counterpart Application", issued on Jan. 10, 2023, with English translation thereof, p. 1-p. 6.
Office Action of Japan Counterpart Application, with English translation thereof, issued on May 9, 2023, pp. 1-5.
"Notice of Reasons for Refusal of Japan Related Application", issued on Jun. 18, 2024, with English translation thereof, p1-p6.
"Office Action of Japan Counterpart Application", issued on Nov. 5, 2024, with English translation thereof, pp. 1-3.

* cited by examiner

CURABLE COMPOSITION, CURED PRODUCT, COLOR FILTER, SOLID-STATE IMAGING ELEMENT, AND IMAGE DISPLAY DEVICE

CROSS-REFERENCE TO RELATED APPLICATIONS

This application is a continuation application of International Application No. PCT/JP2020/030730, filed Aug. 12, 2020, the disclosure of which is incorporated herein by reference in its entirety. Further, this application claims priority from Japanese Patent Application No. 2019-154275, filed Aug. 27, 2019, the disclosure of which is incorporated herein by reference in its entirety.

BACKGROUND OF THE INVENTION

1. Field of the Invention

The present disclosure relates to a curable composition, a cured product, a color filter, a solid-state imaging element, and an image display device.

2. Description of the Related Art

As a digital camera, a mobile phone with a camera, and the like have been further spreading, there has been a greatly increasing demand for a solid-state imaging element such as a charge coupled device (CCD) image sensor. A color filter has been used as a key device in a display or an optical element. The color filter normally includes pixels (colored patterns) of three primary colors of red, green, and blue, and acts to separate transmitted light into the three primary colors. The color filter is formed of a composition including a colorant such as a pigment.

As a dispersant used in a pigment composition in the related art, for example, a dispersant disclosed in JP2008-246469A has been known.

In addition, as a composition for a color filter in the related art, for example, curable compositions disclosed in JP2019-78878A or JP2013-254127A have been known.

SUMMARY OF THE INVENTION

An object to be achieved by the embodiment according to the present disclosure is to provide a curable composition having excellent dispersion stability and moisture resistance of a cured product to be obtained.

Another object to be achieved by the embodiment according to the present disclosure is a cured product of the above-described curable composition, a color filter including the cured product, and a solid-state imaging element or an image display device including the color filter.

Methods for achieving the objects described above include the following aspects.

<1> A curable composition comprising:
a pigment;
a curable compound; and
a resin A having a constitutional unit represented by Formula (1), a constitutional unit represented by Formula (2), and a constitutional unit which has a molecular weight of 1,000 or less and is represented by Formula (3).

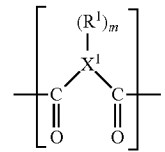

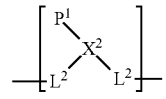

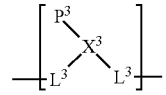

In Formulae (1) to (3), $X^1$ represents an (m+2)-valent organic group, $X^2$ and $X^3$ represent a trivalent organic group, m represents an integer of 1 to 4, $L^2$'s each independently represent O or NR, $L^3$'s each independently represent a carbonyl group, O, or NR, R represents a hydrogen atom, an alkyl group, or an aryl group, $P^1$ represents a group having a polymer chain, $R^1$'s each independently represent a substituent, and $R^3$ represents a group having a polymerizable group.

<2> The curable composition according to <1>,
in which $R^1$'s are each independently an acid group or a salt of an acid group.
<3> The curable composition according to <1> or <2>,
in which $R^1$'s are each independently a carboxy group or a salt of a carboxy group.
<4> The curable composition according to any one of <1> to <3>,
in which $X^1$ is an (m+2)-valent organic group having an aromatic ring.
<5> The curable composition according to any one of <1> to <4>,
in which m is 2.
<6> The curable composition according to any one of <1> to <5>,
in which $L^2$ is O or NH.
<7> The curable composition according to any one of <1> to <6>,
in which $X^2$ is a trivalent aliphatic hydrocarbon group having a thioether bond.
<8> The curable composition according to any one of <1> to <7>,
in which $P^1$ is a group having a polyacrylic resin chain, a polyester chain, or a polyether chain.
<9> The curable composition according to any one of <1> to <8>,
in which $L^3$ is O or NR and $X^3$ is a trivalent aliphatic hydrocarbon group.
<10> The curable composition according to any one of <1> to <9>,
in which $L^3$ is a carbonyl group and $X^3$ is a trivalent organic group having an aromatic ring.
<11> The curable composition according to any one of <1> to <10>,
in which $R^3$ is a group having an ethylenically unsaturated group.
<12> The curable composition according to any one of <1> to <11>, further comprising:
a polymerization initiator.

<13> The curable composition according to <12>,
in which the polymerization initiator includes an oxime compound.

<14> The curable composition according to any one of <1> to <13>, further comprising:
a pigment derivative.

<15> A cured product obtained by curing the curable composition according to any one of <1> to <14>.

<16> A color filter comprising:
the cured product according to <15>.

<17> A solid-state imaging element comprising:
the color filter according to <16>.

<18> An image display device comprising:
the color filter according to <16>.

According to the embodiment according to the present disclosure, a curable composition having excellent dispersion stability and moisture resistance of a cured product to be obtained is provided.

According to another embodiment according to the present disclosure, a cured product of the above-described curable composition, a color filter including the cured product, and a solid-state imaging element or an image display device including the color filter are provided.

DESCRIPTION OF THE PREFERRED EMBODIMENTS

Hereinafter, the contents of the present disclosure will be described in detail. The configuration requirements will be described below based on the representative embodiments of the present disclosure, but the present disclosure is not limited to such embodiments.

In the present disclosure, a term "to" showing a range of numerical values is used as a meaning including a lower limit value and an upper limit value disclosed before and after the term.

In a range of numerical values described in stages in the present disclosure, the upper limit value or the lower limit value described in one range of numerical values may be replaced with an upper limit value or a lower limit value of the range of numerical values described in other stages. In addition, in a range of numerical values described in the present disclosure, the upper limit value or the lower limit value of the range of numerical values may be replaced with values shown in the examples.

Further, in the present disclosure, in a case where a plurality of substances corresponding to each component in a composition is present, the amount of each component in the composition means the total amount of the plurality of substances present in the composition, unless otherwise specified.

In addition, regarding a term of group (atomic group) in the present disclosure, a term with no description of "substituted" and "unsubstituted" includes both a group not including a substituent and a group including a substituent. For example, an "alkyl group" includes not only an alkyl group having no substituent (unsubstituted alkyl group), but also an alkyl group having a substituent (substituted alkyl group).

In the present disclosure, unless otherwise specified, "Me" represents a methyl group, "Et" represents an ethyl group, "Pr" represents a propyl group, "Bu" represents a butyl group, and "Ph" represents a phenyl group.

In the present disclosure, the concept of "(meth)acryl" includes both acryl and methacryl, and the concept of "(meth)acryloyl" includes both acryloyl and methacryloyl.

In addition, in the present disclosure, a term "step" includes not only the independent step but also a step in which intended purposes are achieved even in a case where the step cannot be precisely distinguished from other steps.

In the present disclosure, a "total solid content" refers to a total mass of components obtained by removing a solvent from the whole composition of the composition. In addition, a "solid content" is a component obtained by removing a solvent as described above, and for example, the component may be solid or may be liquid at 25° C.

In the present disclosure, the "main chain" represents a relatively longest binding chain in a molecule of a polymer compound constituting a resin, in which in a case where the binding chain has a ring structure, the entire ring structure is represented as the main chain, and the "side chain" represents an atomic group branched from the main chain.

In addition, in the present disclosure, "mass %" is identical to "weight %" and "part by mass" is identical to "part by weight".

Furthermore, in the present disclosure, a combination of two or more preferred aspects is a more preferred aspect.

In addition, the weight-average molecular weight (Mw) and the number-average molecular weight (Mn) in the present disclosure are molecular weights in terms of polystyrene used as a standard substance, which are detected by using a solvent tetrahydrofuran (THF), a differential refractometer, and a gel permeation chromatography (GPC) analysis apparatus using TSKgel GMHxL, TSKgel G4000HxL, and TSKgel G2000HxL (all trade names manufactured by Tosoh Corporation) as columns, unless otherwise specified.

In the present disclosure, a pigment means a colorant which is hardly dissolved in a solvent. For example, as the pigment, both of the solubility in 100 g of water at 23° C. and 100 g of propylene glycol monomethyl ether acetate at 23° C. is preferably 0.1 g or less and more preferably 0.01 g or less.

Hereinafter, the present disclosure will be described in detail.

Curable Composition

A curable composition according to an embodiment of the present disclosure includes a pigment, a curable compound, and a resin A having a constitutional unit represented by Formula (1), a constitutional unit represented by Formula (2), and a constitutional unit which has a molecular weight of 1,000 or less and is represented by Formula (3).

In Formulae (1) to (3), $X^1$ represents an (m+2)-valent organic group, $X^2$ and $X^3$ represent a trivalent organic group, m represents an integer of 1 to 4, $L^2$'s each independently represent O or NR, $L^3$'s each independently represent a carbonyl group, O, or NR, R represents a hydrogen atom, an alkyl group, or an aryl group, P' represents a group having a polymer chain, $R^1$'s each independently represent a substituent, and $R^3$ represents a group having a polymerizable group.

The curable composition according to the embodiment of the present disclosure can be preferably used as a curable composition for a solid-state imaging element.

In addition, the curable composition according to the embodiment of the present disclosure can be preferably used as a curable composition for a color filter. Specifically, the curable composition according to the embodiment of the present disclosure can be preferably used as a curable composition for forming a pixel of a color filter, and can be more preferably used as a curable composition for forming a pixel of a color filter used in a solid-state imaging element.

In recent years, as the number of pixels of an image sensor has increased, the pattern has been finer and thinner. Along with this, the present inventors have found that, in a curable composition including a pigment in the related art, dispersion stability and moisture resistance of a cured product to be obtained may not be sufficient.

Therefore, as a result of intensive studies, the present inventors have found that, by adopting the above-described aspect, the dispersion stability and moisture resistance of the cured product to be obtained are excellent.

Since the resin A having the constitutional unit represented by Formula (1), the constitutional unit represented by Formula (2), and the constitutional unit which has a molecular weight of 1,000 or less and is represented by Formula (3) is included, it is presumed that the curable composition according to the embodiment of the present disclosure has excellent moisture resistance without impairing dispersibility.

In addition, since the resin A has a constitutional unit having a polymerizable group (constitutional unit represented by Formula (3)) inside a main chain of the resin, and the molecular weight of the constitutional unit represented by Formula (3) is 1,000 or less, it is presumed that an easily hydrolyzable group in the main chain, polymerizable group, or the like is located relatively inside the resin, and the cured product to be obtained has excellent moisture resistance.

In addition, since the curable composition according to the embodiment of the present disclosure includes the resin A having the constitutional unit represented by Formula (1), the constitutional unit represented by Formula (2), and the constitutional unit which has a molecular weight of 1,000 or less and is represented by Formula (3), it is presumed that, due to each polar structure of the resin A, developability is excellent and adhesiveness of the cured product to be obtained is also excellent.

Hereinafter, details of each component included in the curable composition according to the embodiment of the present disclosure, physical property values, and the like will be described.

<Resin A>

The curable composition according to the embodiment of the present disclosure includes a resin A having a constitutional unit represented by Formula (1), a constitutional unit represented by Formula (2), and a constitutional unit which has a molecular weight of 1,000 or less and is represented by Formula (3).

—Constitutional Unit Represented by Formula (1)—

The resin A has a constitutional unit represented by Formula (1).

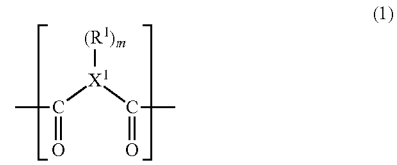

In Formula (1), $X^1$ represents an (m+2)-valent organic group, m represents an integer of 1 to 4, and $R^1$'s each independently represent a substituent.

From the viewpoint of developability, dispersion stability, and moisture resistance and adhesiveness of the cured product to be obtained, $R^1$'s in Formula (1) are each independently preferably an acid group or a salt of an acid group.

As the above-described acid group, from the viewpoint of developability, dispersion stability, and moisture resistance and adhesiveness of the cured product to be obtained, a carboxy group, a sulfo group, or a phosphonic acid group is preferable, a carboxy group or a sulfo group is more preferable, and a carboxy group is particularly preferable.

A counter cation forming the salt in the above-described salt of the acid group is not particularly limited, but an alkali metal ion, an alkaline earth metal ion, or a primary to quaternary ammonium ion is preferable, an alkali metal ion or a quaternary ammonium ion is more preferable, and an alkali metal ion is particularly preferable. In addition, the counter cation may be a monovalent cation or a divalent or higher cation as long as the compound as a whole is electrically neutral, but a monovalent cation is preferable.

Among these, as $R^1$, from the viewpoint of developability, dispersion stability, and moisture resistance and adhesiveness of the cured product to be obtained, a carboxy group or a salt of a carboxy group is particularly preferable.

From the viewpoint of developability, dispersion stability, and moisture resistance and adhesiveness of the cured product to be obtained, m in Formula (1) is preferably an integer of 1 to 3, more preferably 1 or 2, and particularly preferably 2.

As $X^1$ in Formula (1), from the viewpoint of moisture resistance of the cured product to be obtained, an (m+2)-valent organic group having an aliphatic ring or an aromatic ring is preferable, an (m+2)-valent organic group having an aromatic ring is more preferable, an (m+2)-valent hydrocarbon group having a cyclohexane ring structure or a benzene ring structure is still more preferable, and an (m+2)-valent hydrocarbon group having a benzene ring structure is particularly preferable.

Preferred examples of the (m+2)-valent hydrocarbon group having an aliphatic ring structure or an aromatic ring structure include groups shown below. A wavy line portion represents a bonding position with the carbonyl group or $R^1$ in Formula (1).

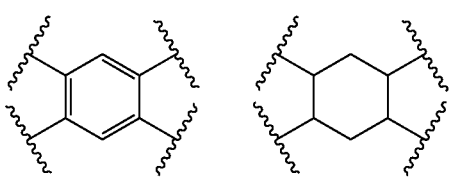

-continued

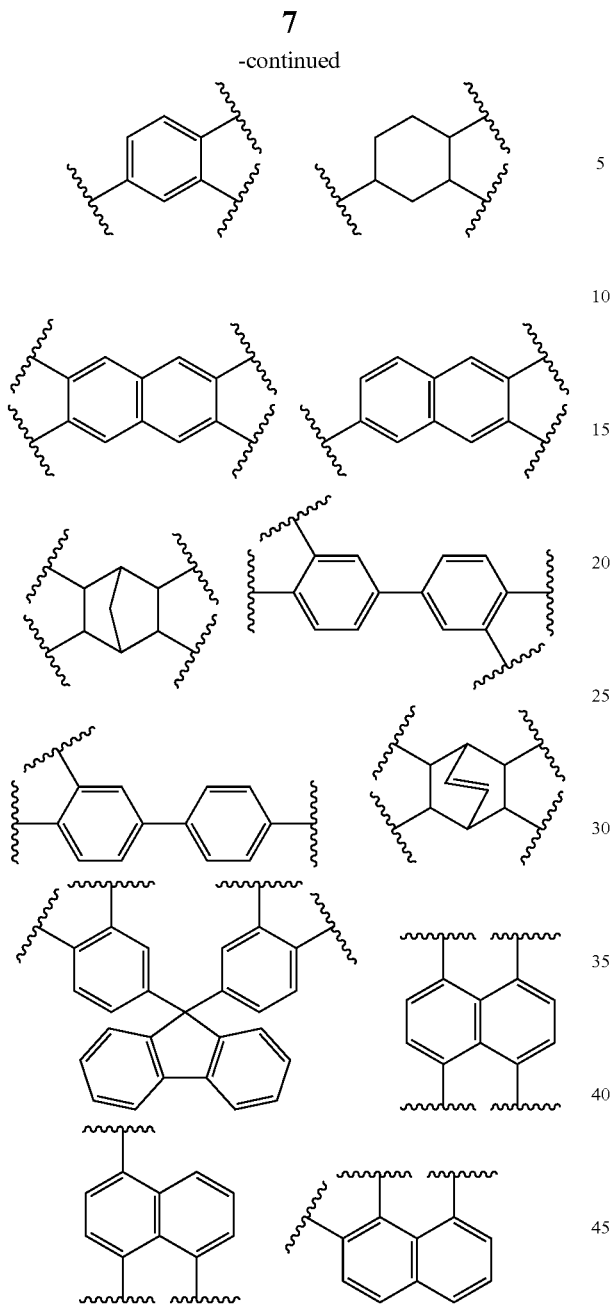

In addition, preferred examples of the constitutional unit represented by Formula (1) include a constitutional unit formed from an aromatic tricarboxylic acid anhydride and a constitutional unit formed from an aromatic tetracarboxylic acid anhydride. Examples of the aromatic tricarboxylic acid anhydride and the aromatic tetracarboxylic acid anhydride include compounds having the following structures.

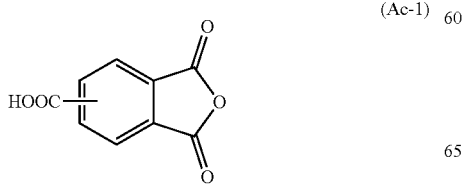
(Ac-1)

-continued

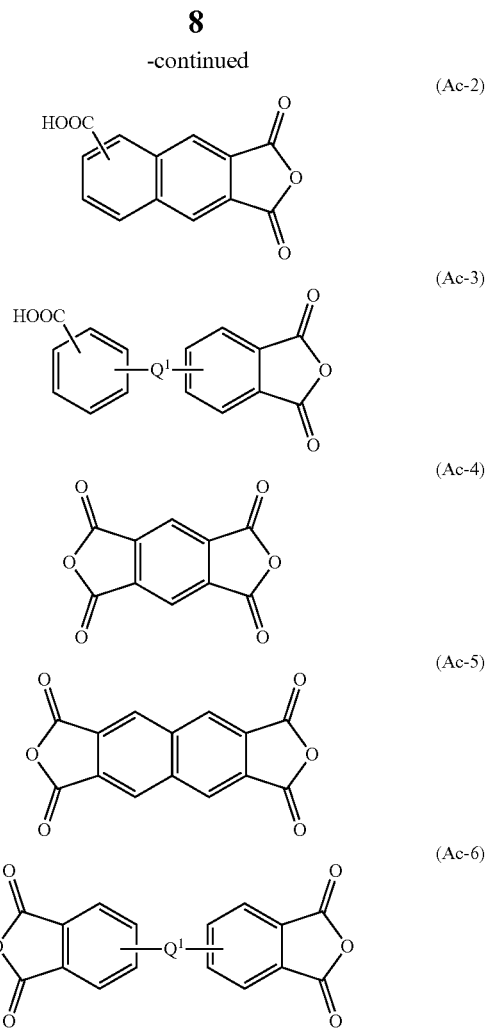

In the formulae, $Q^1$ represents a single bond, —O—, —CO—, —COOCH$_2$CH$_2$OCO—, —SO$_2$—, —C(CF$_3$)$_2$—, a group represented by Formula (Q-1), or a group represented by Formula (Q-2).

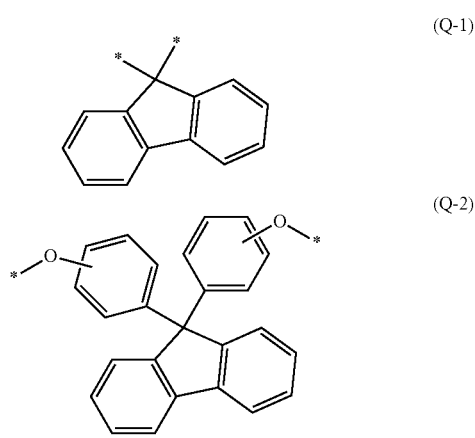

Specific examples of the aromatic tricarboxylic acid anhydride include a benzenetricarboxylic acid anhydride (1,2,3-benzenetricarboxylic acid anhydride, trimellitic acid anhydride [1,2,4-benzenetricarboxylic acid anhydride], and the like), a naphthalenetricarboxylic acid anhydride (1,2,4- naphthalenetricarboxylic acid anhydride, 1,4,5-naphthalenetricarboxylic acid anhydride, 2,3,6-naphthalenetricarboxylic acid anhydride, 1,2,8-naphthalenetricarboxylic acid anhydride, and the like), 3,4,4'-benzophenonetricarboxylic acid anhydride, 3,4,4'-biphenylethertricarboxylic acid anhydride, 3,4,4'-biphenyltricarboxylic acid anhydride, 2,3,2'-biphenyltricarboxylic acid anhydride, 3,4,4'-biphenylmethanetricarboxylic acid anhydride, and 3,4,4'-biphenylsulfonetricarboxylic acid anhydride.

Specific examples of the aromatic tetracarboxylic acid anhydride include pyromellitic acid dianhydride, ethylene glycol dianhydrous trimellitic acid ester, propylene glycol dianhydrous trimellitic acid ester, butylene glycol dianhydrous trimellitic acid ester, 3,3',4,4'-benzophenonetetracarboxylic acid dianhydride, 3,3',4,4'-biphenylsulfonetetracarboxylic acid dianhydride, 1,4,5,8-naphthalenetetracarboxylic acid dianhydride, 2,3,6,7-naphthalenetetracarboxylic acid dianhydride, 3,3',4,4'-biphenylethertetracarboxylic acid dianhydride, 3,3',4,4'-dimethyldiphenylsilanetetracarboxylic acid dianhydride, 3,3',4,4'-tetraphenylsilanetetracarboxylic acid dianhydride, 1,2,3,4-frantetracarboxylic acid dianhydride, 4,4'-bis(3,4-dicarboxyphenoxy)diphenylsulfide dianhydride, 4,4'-bis(3,4-dicarboxyphenoxy)diphenylsulfone dianhydride, 4,4'-bis(3,4-dicarboxyphenoxy) diphenylpropane dianhydride, 3,3',4,4'-perfluoroisopropyridendiphthalic acid dianhydride, 3,3',4,4'-biphenyltetracarboxylic acid dianhydride, bis(phthalic acid) phenylphosphineoxide dianhydride, p-phenylene-bis(triphenylphthalic acid) dianhydride, m-phenylene-bis(triphenylphthalic acid) dianhydride, bis(triphenylphthalic acid)-4,4'-diphenylether dianhydride, bis(triphenylphthalic acid)-4,4'-diphenylmethane dianhydride, 9,9-bis(3,4-dicarboxyphenyl) fluorene dianhydride, 9,9-bis[4-(3,4-dicarboxyphenoxy)phenyl]fluorene dianhydride, 3,4-dicarboxy-1,2,3,4-tetrahydro-1-naphthalenesuccinic acid dianhydride, and 3,4-dicarboxy-1,2,3,4-tetrahydro-6-methyl-1-naphthalenesuccinic acid dianhydride.

In addition, specific examples of a group obtained by removing two carbonyl groups from the constitutional unit represented by Formula (1) include a group represented by Formula (Ar-1), a group represented by Formula (Ar-2), and a group represented by Formula (Ar-3).

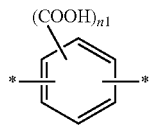

(Ar-1)

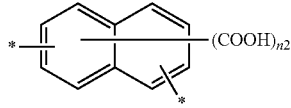

(Ar-2)

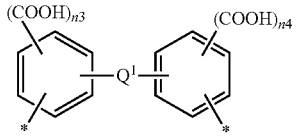

(Ar-3)

In Formula (Ar-1), n1 represents an integer of 1 to 4, and is preferably 1 or 2 and more preferably 2.

In Formula (Ar-2), n2 represents an integer of 1 to 8, and is preferably an integer of 1 or 4, more preferably 1 or 2, and still more preferably 2.

In Formula (Ar-3), n3 and n4 each independently represent an integer of 0 to 4, and are preferably an integer of 0 or 2, more preferably 1 or 2, and still more preferably 1. However, at least one of n3 or n4 is an integer of 1 or more.

In Formula (Ar-3), $Q^1$ represents a single bond, —O—, —CO—, —COOCH$_2$CH$_2$OCO—, —SO$_2$—, —C(CF$_3$)$_2$—, the above-described group represented by Formula (Q-1), or the above-described group represented by Formula (Q-2).

The resin A may have one kind of the above-described constitutional unit represented by Formula (1), or may have two or more kinds thereof.

From the viewpoint of developability, dispersion stability, and moisture resistance and adhesiveness of the cured product to be obtained, the content of the constitutional unit represented by Formula (1) is preferably 0.1 mass % to 50 mass %, more preferably 1 mass % to 30 mass %, still more preferably 2 mass % to 20 mass %, and particularly preferably 6 mass % to 15 mass % with respect to the total mass of the resin A.

—Constitutional Unit Represented by Formula (2)—

The resin A has a constitutional unit represented by Formula (2).

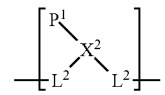

(2)

In Formula (2), $X^2$ represents a trivalent organic group, $L^2$'s each independently represent O or NR, R represents a hydrogen atom, an alkyl group, or an aryl group, and $P^1$ represents a group having a polymer chain.

From the viewpoint of moisture resistance and adhesiveness of the cured product to be obtained, $L^2$'s in Formula (2) are each independently preferably O or NH and more preferably O.

In addition, it is preferable that two $L^2$'s in Formula (2) have the same group.

$X^2$ in Formula (2) may be an aliphatic group, an aromatic group, or a group of a combination of these groups, but from the viewpoint of moisture resistance and adhesiveness of the cured product to be obtained, an aliphatic group is preferable.

In addition, from the viewpoint of moisture resistance and adhesiveness of the cured product to be obtained, $X^2$ in Formula (2) is preferably a trivalent group having a sulfur atom, more preferably a trivalent group having a thioether bond, and particularly preferably a trivalent aliphatic group having a thioether bond.

Further, from the viewpoint of moisture resistance and adhesiveness of the cured product to be obtained, the number of carbon atoms in $X^2$ in Formula (2) is preferably 1 to 30, more preferably 2 to 15, still more preferably 3 to 8, particularly preferably 3 to 6, and most preferably 3.

Among these, from the viewpoint of moisture resistance and adhesiveness of the cured product to be obtained, $X^2$ in Formula (2) is preferably a group represented by Formula (X-1) and more preferably a group represented by Formula (X-2).

(X-1)

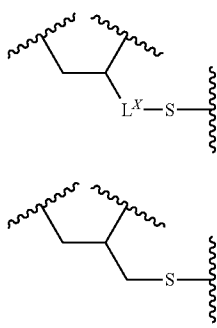

(X-2)

(P-2)
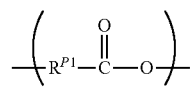

(P-3)
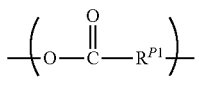

(P-4)
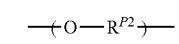

(P-5)
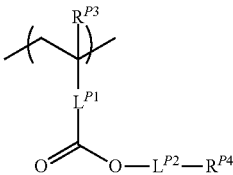

In Formulae (X-1) and (X-2), LX represents an alkylene group having 1 to 8 carbon atoms, and a wavy line portion represents a bonding position with $L^2$ or $P^1$.

In addition, in Formulae (X-1) and (X-2), it is preferable that $P^1$ in Formula (2) is bonded to the sulfur atom.

As $P^1$ in Formula (2), from the viewpoint of developability, dispersion stability, and moisture resistance and adhesiveness of the cured product to be obtained, a group having an acrylic resin chain, a polyester chain, a polyether chain, or a polymer chain of a combination of two or more of these chains is preferable, a group having an acrylic resin chain, a polyester chain, or a polyether chain is more preferable, and a group having an acrylic resin chain is particularly preferable.

In addition, as the above-described acrylic resin chain, from the viewpoint of developability, dispersion stability, and moisture resistance and adhesiveness of the cured product to be obtained, an acrylic resin chain obtained by copolymerizing two or more kinds of alkyl (meth)acrylate compounds is preferable, an acrylic resin chain obtained by copolymerizing n-butyl (meth)acrylate and another alkyl (meth)acrylate compound is more preferable, and an acrylic resin chain obtained by copolymerizing n-butyl (meth)acrylate and methyl (meth)acrylate or ethyl (meth)acrylate is particularly preferable.

From the viewpoint of developability, dispersion stability, and moisture resistance and adhesiveness of the cured product to be obtained, the weight-average molecular weight of the polymer chain in $P^1$ in Formula (2) is preferably 500 to 20,000. The lower limit is more preferably 600 or more and still more preferably 1,000 or more. The upper limit is more preferably 10,000 or less, still more preferably 5,000 or less, and particularly preferably 3,000 or less.

In addition, the polymer chain in $P^1$ in Formula (2) and $X^2$ in Formula (2) may be bonded through a linking group or may be directly bonded, but it is preferable to be directly bonded. In addition, the number of atoms in the above-described linking group is preferably 1 to 30 and more preferably 2 to 20.

The polymer chain in $P^1$ in Formula (2) is preferably a polymer chain having a constitutional unit represented by any one of Formulae (P-1) to (P-5), and more preferably a polymer chain having a constitutional unit represented by Formula (P-5).

(P-1)
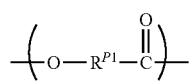

In the formulae, $R^{P1}$ and $R^{P2}$ each represent an alkylene group. As the alkylene group represented by $R^{P1}$ and $R^{P2}$, a linear or branched alkylene group having 1 to 20 carbon atoms is preferable, a linear or branched alkylene group having 2 to 16 carbon atoms is more preferable, and a linear or branched alkylene group having 3 to 12 carbon atoms is still more preferable.

In the formulae, $R^{P3}$ represents a hydrogen atom or a methyl group.

In the formulae, $L^{P1}$ represents a single bond or an arylene group and $L^{P2}$ represents a single bond or a divalent linking group. $L^{P1}$ is preferably a single bond. Examples of the divalent linking group represented by $L^{P2}$ include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, —NHCO—, —CONH—, and a group formed by a combination of two or more these groups.

$R^{P4}$ represents a hydrogen atom or a substituent. Examples of the substituent include a hydroxy group, a carboxy group, an alkyl group, an aryl group, a heteroaryl group, an alkoxy group, an aryloxy group, a heteroaryloxy group, an alkylthioether group, an arylthioether group, a heteroarylthioether group, and an ethylenically unsaturated group.

In addition, the polymer chain in $P^1$ in Formula (2) also preferably has a constitutional unit having an acid group. Examples of the acid group include a carboxy group, a phosphoric acid group, a sulfo group, and a phenolic hydroxy group. According to this aspect, the dispersibility of the pigment in the composition can be further improved. Furthermore, developability can also be further improved. The content of the constitutional unit having an acid group is preferably 1 mass % to 30 mass %, more preferably 2 mass % to 20 mass %, and still more preferably 3 mass % to 10 mass % with respect to the total mass of the polymer chain.

The resin A may have one kind of the above-described constitutional unit represented by Formula (2), or may have two or more kinds thereof.

From the viewpoint of developability, dispersion stability, and moisture resistance and adhesiveness of the cured product to be obtained, the content of the constitutional unit represented by Formula (2) is preferably 50 mass % to 98 mass %, more preferably 60 mass % to 95 mass %, and particularly preferably 70 mass % to 90 mass % with respect to the total mass of the resin A.

—Constitutional Unit Represented by Formula (3)—

The resin A has a constitutional unit which has a molecular weight of 1,000 or less and is represented by Formula (3).

In Formula (3), $X^3$ represents a trivalent organic group, $L^3$'s each independently represent a carbonyl group, O, or NR, R represents a hydrogen atom, an alkyl group, or an aryl group, and $R^3$ represents a group having a polymerizable group.

In Formula (3), from the viewpoint of moisture resistance of the cured product to be obtained, it is preferable that $L^3$ is O or NR and $X^3$ is a trivalent aliphatic group, it is more preferable that $L^3$ is O or NH and $X^3$ is a trivalent aliphatic group having a thioether bond, and it is particularly preferable that $L^3$ is O.

In Formula (3), in a case where $L^3$ is O or NR, a preferred aspect of $X^3$ is the same as the preferred aspect of $X^2$ in Formula (2).

In addition, from the viewpoint of producing suitability, $L^3$ in Formula (3) is preferably O or NR, more preferably O or NH, and particularly preferably O.

Further, from the viewpoint of moisture resistance of the cured product to be obtained, the resin A preferably has both the constitutional unit represented by Formula (3), in which $L^3$ is O or NR, and the constitutional unit represented by Formula (3), in which $L^3$ is a carbonyl group.

In addition, in Formula (3), from the viewpoint of developability and dispersion stability, it is preferable that $L^3$ is a carbonyl group and $X^3$ is a trivalent organic group having an aromatic ring.

In Formula (3), in a case where $L^3$ is a carbonyl group, a preferred aspect of $X^3$ is the same as the preferred aspect of $X^1$ in a case where m in Formula (1) is 1 and $X^1$ is an (m+2)-valent hydrocarbon group having an aromatic ring structure.

From the viewpoint of moisture resistance of the cured product to be obtained, $R^3$ in Formula (3) is preferably a group having an ethylenically unsaturated group.

In addition, examples of the above-described ethylenically unsaturated group include a (meth)acryloxy group, a styryl group (vinylaryl group), a (meth)acrylamide group, an allyl group, a vinyl ether group, and a vinyl ester group. Among these, from the viewpoint of moisture resistance of the cured product to be obtained, a (meth)acryloxy group, a styryl group, a (meth)acrylamide group, or an allyl group is preferable, a (meth)acryloxy group, a styryl group, or a (meth)acrylamide group is more preferable, and a (meth)acryloxy group or a styryl group is particularly preferable.

The number of polymerizable groups in $R^3$ in Formula (3) is not particularly limited, but from the viewpoint of moisture resistance and adhesiveness of the cured product to be obtained, is preferably 1 to 10, more preferably 1 to 6, still more preferably 1 or 2, and particularly preferably 1.

In $R^3$ of Formula (3), the above-described polymerizable group may be directly bonded to $X^3$ in Formula (3), or may be bonded thereto through a linking group.

The number of carbon atoms in the above-described linking group is not particularly limited, but from the viewpoint of developability, dispersion stability, and moisture resistance of the cured product to be obtained, it is preferable to be 1 to 40, more preferable to be 1 to 20, still more preferable to be 2 to 9, and particularly preferable to be 3 to 5.

In addition, the above-described linking group is preferably an aliphatic group, and a divalent aliphatic hydrocarbon group or a group in which one or more divalent aliphatic hydrocarbon groups are bonded to one or more structures selected from the group consisting of an ether bond, an ester bond, an amide bond, a urethane bond, and a urea bond is preferable.

Further, the above-described linking group may have a substituent such as a hydroxy group and an amino group. Among these, from the viewpoint of developability, dispersion stability, and moisture resistance of the cured product to be obtained, preferred examples of the substituent include a hydroxy group.

Further, the minimum number of atoms connecting the main chain of the resin A and the polymerizable group is not particularly limited, but from the viewpoint of developability and dispersion stability, it is preferable to be 1 to 40, more preferable to be 1 to 15, still more preferable to be 1 to 9, and particularly preferable to be 1 to 5.

From the viewpoint of developability, dispersion stability, and moisture resistance and adhesiveness of the cured product to be obtained, the molecular weight of the constitutional unit represented by Formula (3) is preferably 100 to 1,000, more preferably 100 to 700, and particularly preferably 100 to 500.

The resin A may have one kind of the above-described constitutional unit represented by Formula (3), or may have two or more kinds thereof.

From the viewpoint of developability, dispersion stability, and moisture resistance and adhesiveness of the cured product to be obtained, the content of the constitutional unit represented by Formula (3) is preferably 0.1 mass % to 50 mass %, more preferably 0.5 mass % to 20 mass %, still more preferably 1 mass % to 15 mass %, and particularly preferably 2 mass % to 10 mass % with respect to the total mass of the resin A.

The resin A may have a constitutional unit other than the constitutional units represented by Formulae (1) to (3).

The other constitutional units are not particularly limited, and examples thereof include a constitutional unit formed from a polyvalent carboxylic acid compound, a polyhydric alcohol compound, a polyvalent amine compound, a hydroxycarboxylic acid compound, a polyvalent isocyanate compound, or the like.

The resin A may have one kind of the above-described other constitutional unit, may have two or more kinds of the above-described other constitutional units, or may not have the above-described other constitutional units.

From the viewpoint of developability, dispersion stability, and moisture resistance and adhesiveness of the cured product to be obtained, the total content of the constitutional unit represented by Formulae (1) to (3) is preferably 50 mass % or more, more preferably 80 mass % or more, still more preferably 90 mass % or more, and particularly preferably 95 mass % to 100 mass % with respect to the total mass of the resin A.

A terminal structure of the resin A is not particularly limited, and is a known terminal structure depending on reaction termination conditions (quenching conditions) and isolation conditions in a case of producing the resin A.

Examples thereof include a hydrogen atom, a hydroxy group, an alkoxy group, a carboxy group, and an amino group.

Specific examples of the resin A include compounds shown below, but it is needless to say that the resin A is not limited thereto.

| | Formula (1) | Formula (2) | Formula (3) | Mass proportion of each constitutional unit | | | C=C value (mmol/g) | Acid value (mgKOH/g) | Molecular weight Mw |
|---|---|---|---|---|---|---|---|---|---|
| | | | | Formula (1) | Formula (2) | Formula (3) | | | |
| Dispersant A1 | 1-A | 2-A | 3-A | 5 | 87 | 8 | 0.22 | 37 | 8,000 |
| Dispersant A2 | 1-A | 2-A | 3-A | 5 | 87 | 8 | 0.22 | 37 | 12,000 |
| Dispersant A3 | 1-A | 2-A | 3-A | 5 | 87 | 8 | 0.22 | 37 | 18,000 |
| Dispersant A4 | 1-A | 2-A | 3-A | 2 | 79 | 18 | 0.51 | 40 | 8,000 |
| Dispersant A5 | 1-A | 2-A | 3-A | 12 | 81 | 7 | 0.21 | 72 | 8,000 |
| Dispersant A6 | 1-A | 2-A | 3-A | 10 | 72 | 18 | 0.48 | 81 | 8,000 |
| Dispersant A7 | 1-A | 2-A | 3-B | 9.4 | 86.5 | 4.1 | 0.20 | 37 | 8,200 |
| Dispersant A8 | 1-A | 2-A | 3-C | 9.5 | 87.4 | 3.1 | 0.24 | 34 | 8,000 |
| Dispersant A9 | 1-A | 2-A | 3-D | 9.5 | 87.4 | 3.1 | 0.28 | 32 | 8,000 |
| Dispersant A10 | 1-A | 2-A | 3-E | 9.5 | 87.4 | 3.1 | 0.14 | 39 | 8,200 |
| Dispersant A11 | 1-A | 2-A | 3-F | 9.5 | 87.4 | 3.1 | 0.21 | 42 | 8,400 |
| Dispersant A12 | 1-A | 2-A | 3-G | 9.5 | 87.9 | 2.6 | 0.22 | 35 | 8,000 |
| Dispersant A13 | 1-A | 2-A | 3-H | 9.7 | 89.5 | 0.8 | 0.21 | 37 | 8,000 |
| Dispersant A14 | 1-B | 2-A | 3-A | 5 | 87 | 8 | 0.22 | 35 | 8,000 |
| Dispersant A15 | 1-C | 2-A | 3-A | 4.6 | 87.4 | 8 | 0.21 | 37 | 9,000 |
| Dispersant A16 | 1-D | 2-A | 3-A | 7 | 85.8 | 7.2 | 0.21 | 36 | 7,500 |
| Dispersant A17 | 1-A | 2-B | 3-A | 6.3 | 84.5 | 9.2 | 0.22 | 37 | 8,000 |
| Dispersant A18 | 1-A | 2-C | 3-A | 4.9 | 87.1 | 8 | 0.22 | 35 | 8,000 |
| Dispersant A19 | 1-A | 2-D | 3-A | 4.7 | 87.4 | 7.9 | 0.22 | 35 | 8,000 |
| Dispersant A20 | 1-A | 2-E | 3-A | 4.7 | 87.4 | 7.9 | 0.22 | 35 | 8,000 |
| Dispersant B1 | 1-A | 2-A | 3-I | 9.5 | 87.4 | 3.1 | 0.19 | 49 | 8,000 |
| Dispersant B2 | 1-A | 2-A | 3-I | 9.5 | 87.4 | 3.1 | 0.19 | 49 | 12,000 |
| Dispersant B3 | 1-A | 2-A | 3-I | 9.5 | 87.4 | 3.1 | 0.19 | 49 | 18,000 |
| Dispersant B4 | 1-A | 2-A | 3-I | 9.5 | 82.3 | 8.2 | 0.51 | 49 | 8,000 |
| Dispersant B5 | 1-A | 2-A | 3-I | 9.0 | 78.3 | 12.7 | 0.80 | 46 | 8,000 |
| Dispersant B6 | 1-A | 2-A | 3-I | 14.3 | 82.5 | 3.2 | 0.20 | 73 | 8,000 |
| Dispersant B7 | 1-A | 2-A | 3-I | 16.4 | 80.4 | 3.2 | 0.20 | 85 | 8,000 |
| Dispersant B8 | 1-A | 2-A | 3-I | 15.5 | 65.8 | 18.7 | 1.20 | 80 | 7,500 |
| Dispersant B9 | 1-A | 2-A | 3-J | 9.3 | 86.1 | 4.6 | 0.20 | 48 | 8,500 |
| Dispersant B10 | 1-A | 2-A | 3-K | 9.3 | 86.1 | 4.6 | 0.20 | 47 | 8,500 |
| Dispersant B11 | 1-A | 2-A | 3-L | 9.3 | 85.7 | 5.0 | 0.20 | 46 | 8,500 |
| Dispersant B12 | 1-A | 2-A | 3-M | 9.2 | 84.3 | 6.5 | 0.20 | 46 | 8,700 |
| Dispersant B13 | 1-A | 2-A | 3-N | 9.5 | 87.4 | 3.1 | 0.21 | 47 | 8,700 |
| Dispersant B14 | 1-A | 2-A | 3-O | 9.4 | 87 | 3.6 | 0.20 | 47 | 8,800 |
| Dispersant B15 | 1-A | 2-A | 3-P | 9.4 | 86.5 | 4.1 | 0.20 | 47 | 8,000 |

-continued

|  | Formula (1) | Formula (2) | Formula (3) | Mass proportion of each constitutional unit | | | C=C value (mmol/g) | Acid value (mgKOH/g) | Molecular weight Mw |
|---|---|---|---|---|---|---|---|---|---|
|  |  |  |  | Formula (1) | Formula (2) | Formula (3) |  |  |  |
| Dispersant B16 | 1-A | 2-A | 3-Q | 9.5 | 87.4 | 3.1 | 0.19 | 47 | 8,000 |
| Dispersant B17 | 1-B | 2-A | 3-I | 9.5 | 87.4 | 3.1 | 0.19 | 47 | 8,000 |
| Dispersant B18 | 1-C | 2-A | 3-I | 11.1 | 85.8 | 3.1 | 0.19 | 49 | 9,000 |
| Dispersant B19 | 1-D | 2-A | 3-I | 12.5 | 84.5 | 3 | 0.19 | 48 | 7,500 |
| Dispersant B20 | 1-A | 2-B | 3-I | 9.7 | 87.1 | 3.2 | 0.20 | 50 | 8,000 |
| Dispersant B21 | 1-A | 2-C | 3-I | 9.5 | 87.4 | 3.1 | 0.19 | 47 | 8,000 |
| Dispersant B22 | 1-A | 2-D | 3-I | 9.5 | 87.4 | 3.1 | 0.19 | 47 | 8,000 |
| Dispersant B23 | 1-A | 2-E | 3-R | 9.3 | 85.7 | 5 | 0.21 | 46 | 8,000 |
| Disperant C1 | 1-A | 2-A | 3-I 3-A | 6.2 | 85.6 | 3.1 5.1 | 0.33 | 40 | 8,000 |
| Disperant C2 | 1-A | 2-A 2-F | 3-I | 12.8 | 27.5 55.1 | 4.6 | 0.49 | 32 | 8,500 |
| Disperant C3 | 1-A | 2-A 2-G | 3-I | 14.8 | 51.3 29.5 | 4.4 | 0.40 | 38 | 8,500 |

In the dispersants A1 to A20, B1 to B23, and C1 to C3, the mass proportion of the constitutional unit represented by Formula (3) in the resin is calculated on the assumption that all polymerizable groups are introduced into one per constitutional unit.

Each of the above-described constitutional units is shown below.

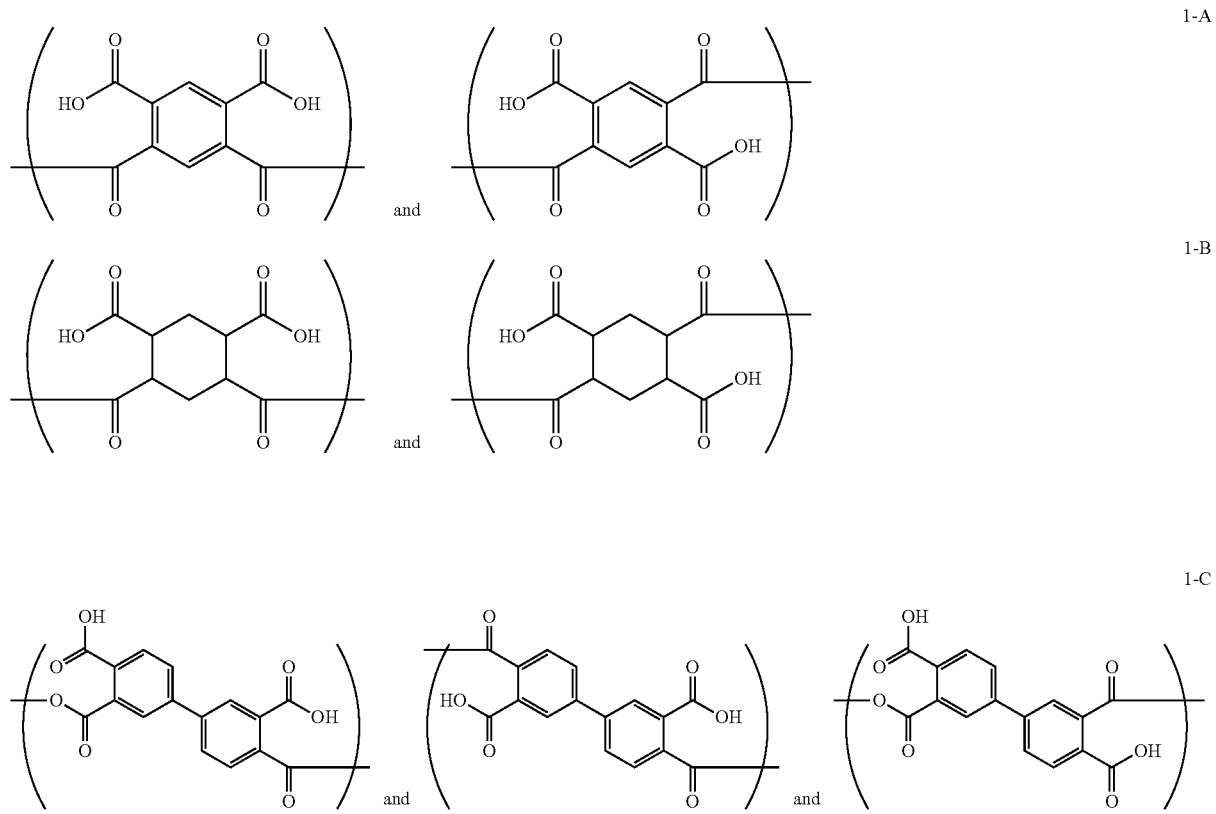

-continued
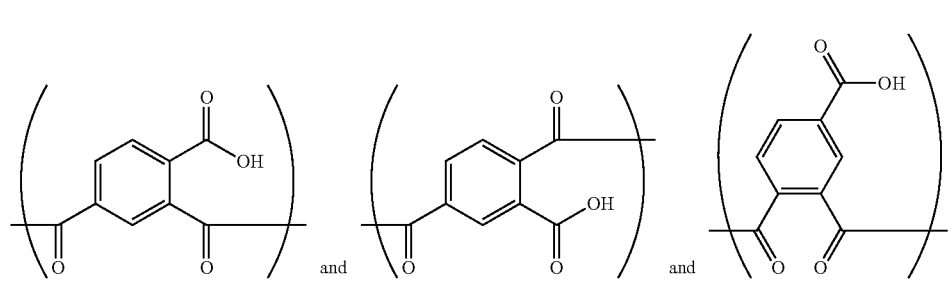
1-D
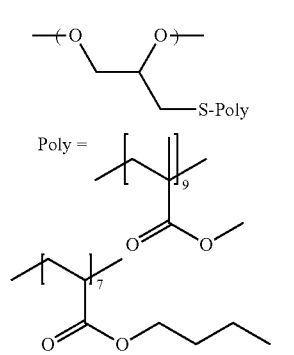
2-A
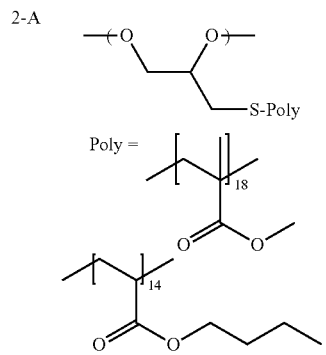
2-B
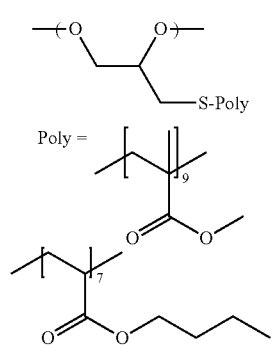
2-C
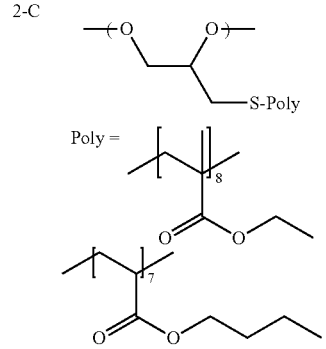
2-D
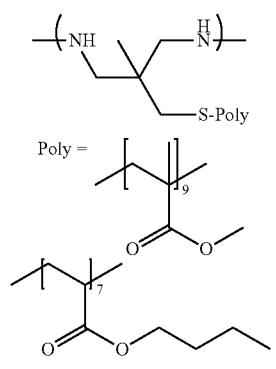
2-E
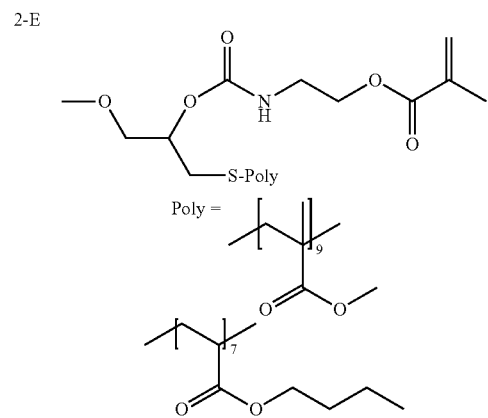
2-F -continued
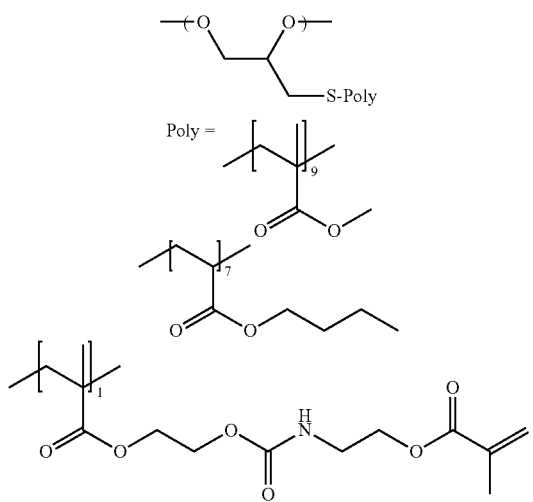
2-G
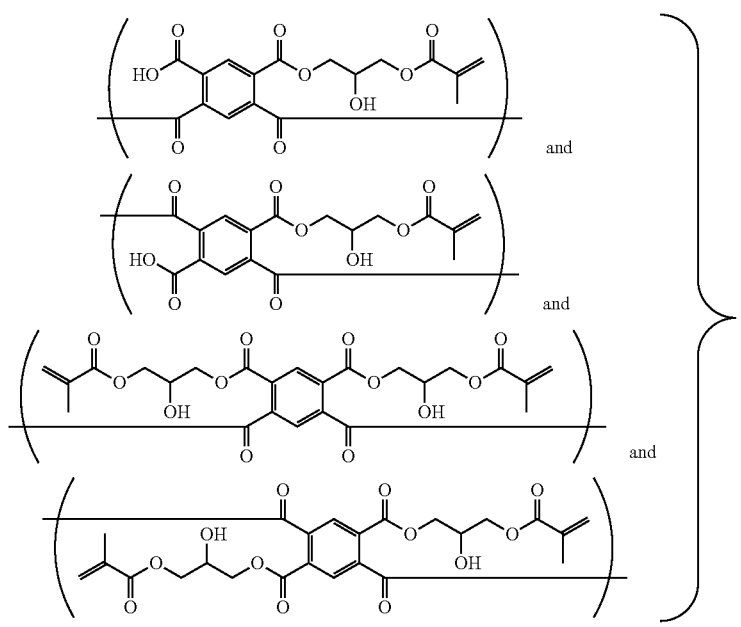
3-A
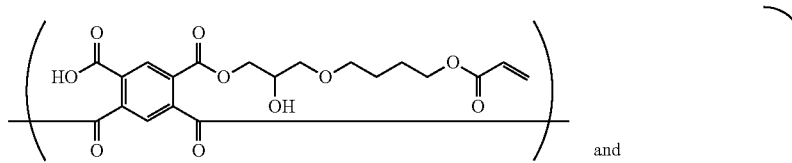
3-B -continued
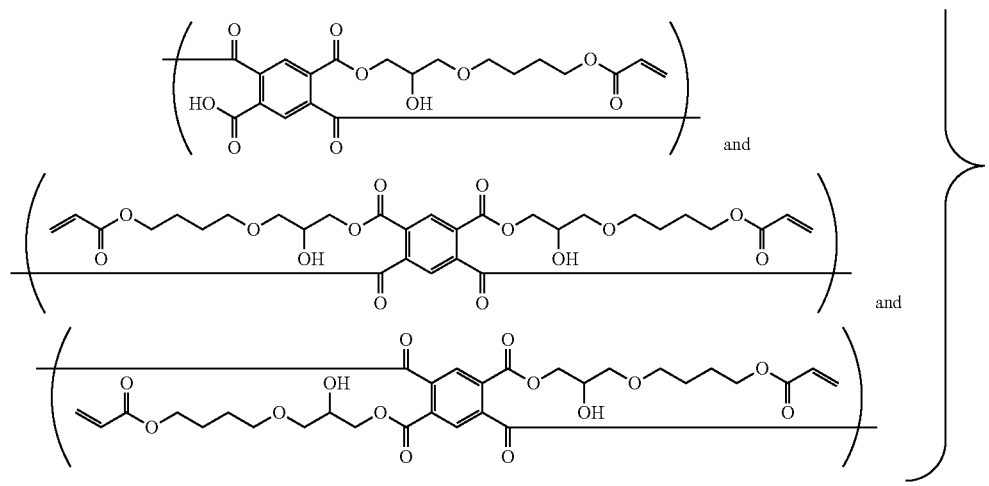
and
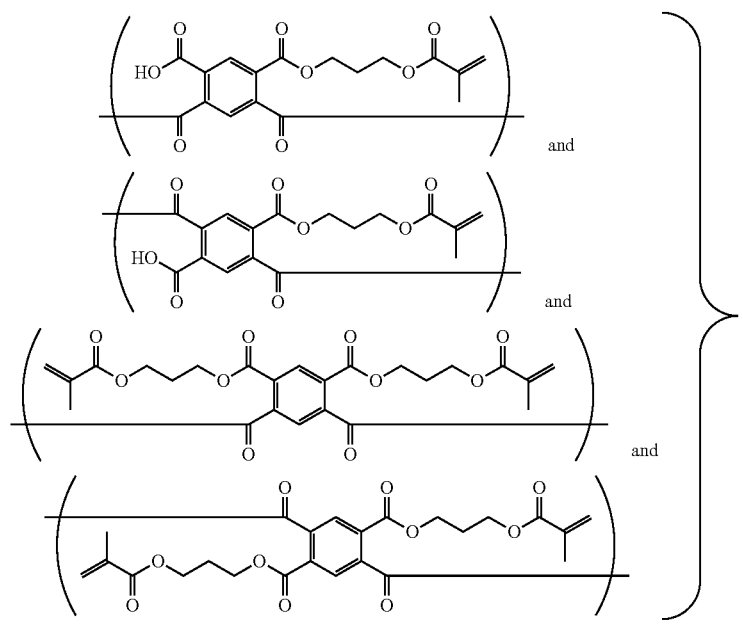
3-C -continued
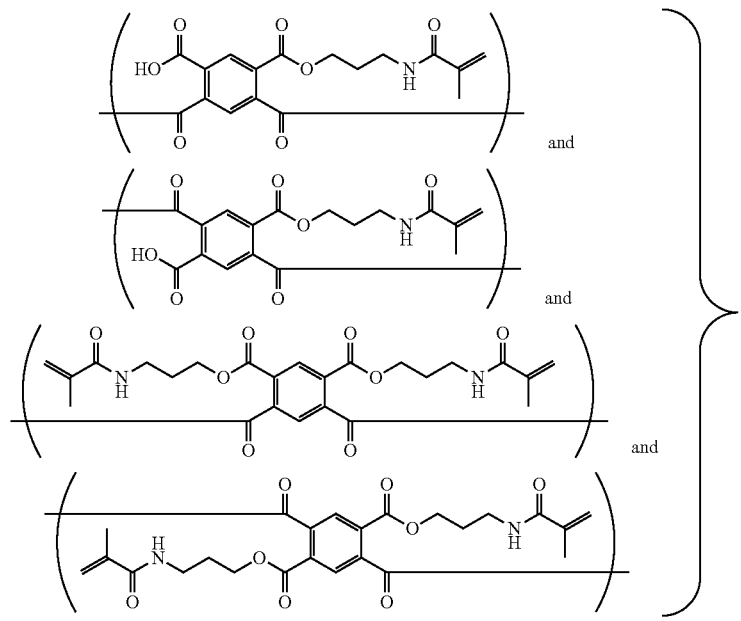
and
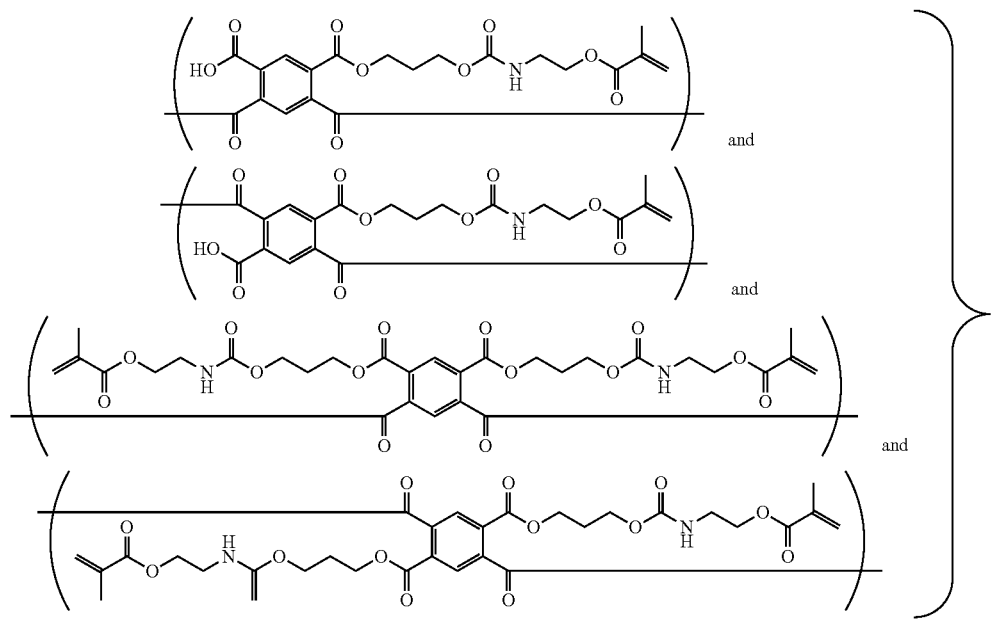
and
3-D
3-E
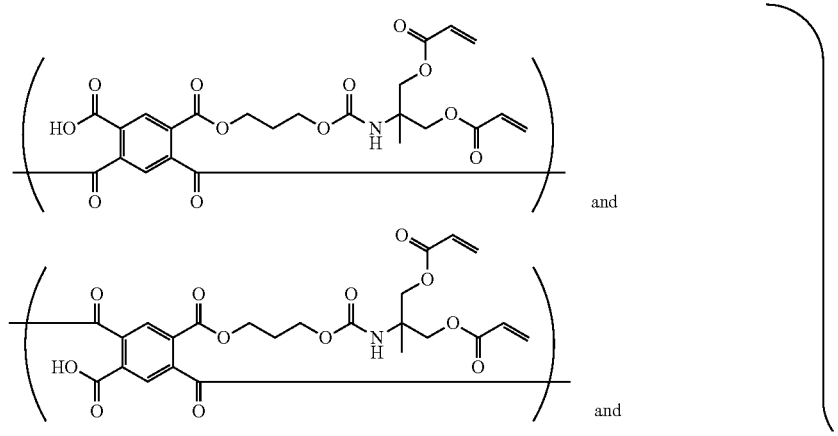
and
3-F

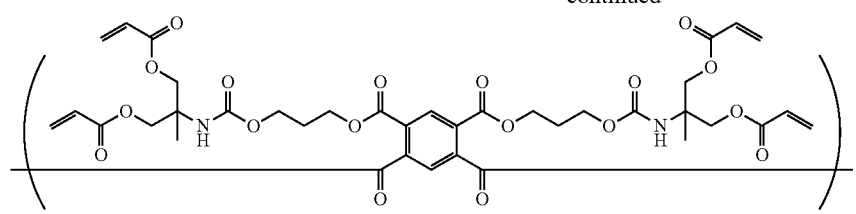
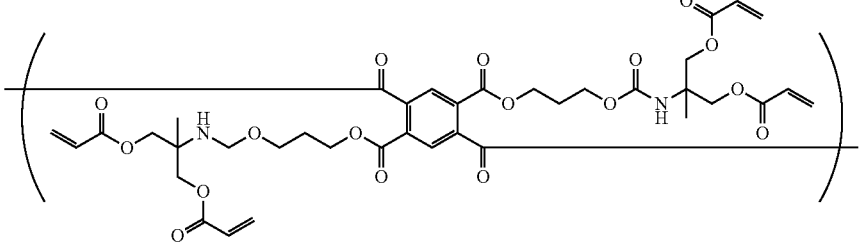
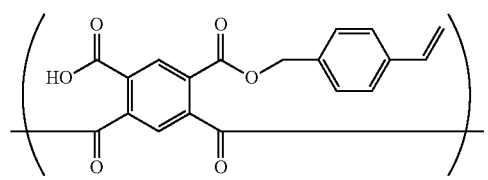 and 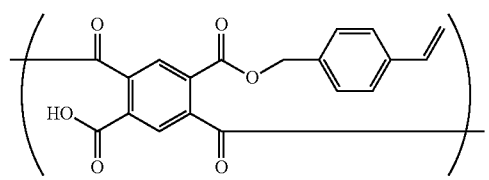 and
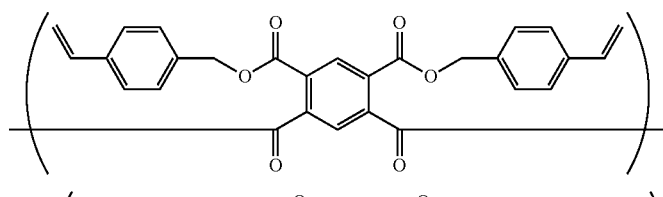 and
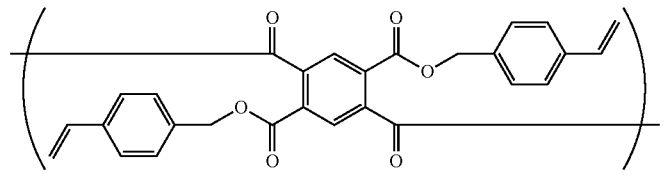
3-G
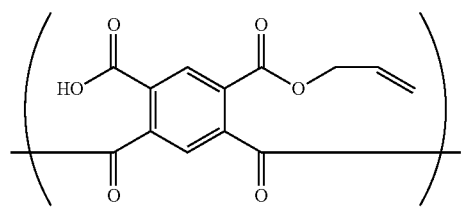 and 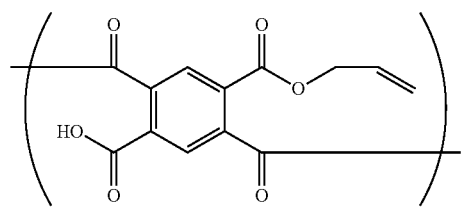 and
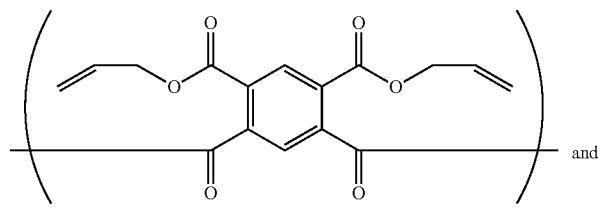 and
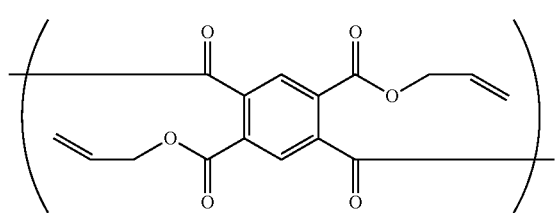
3-H

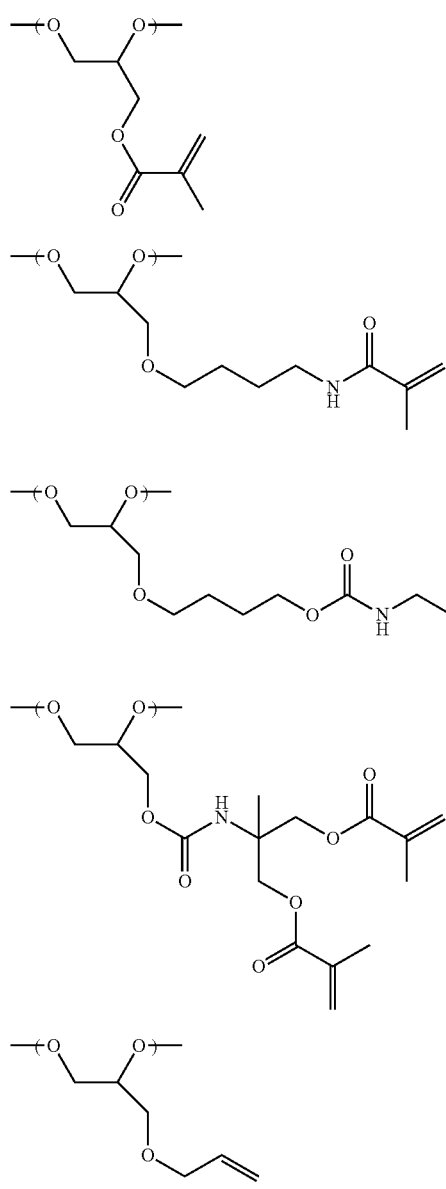
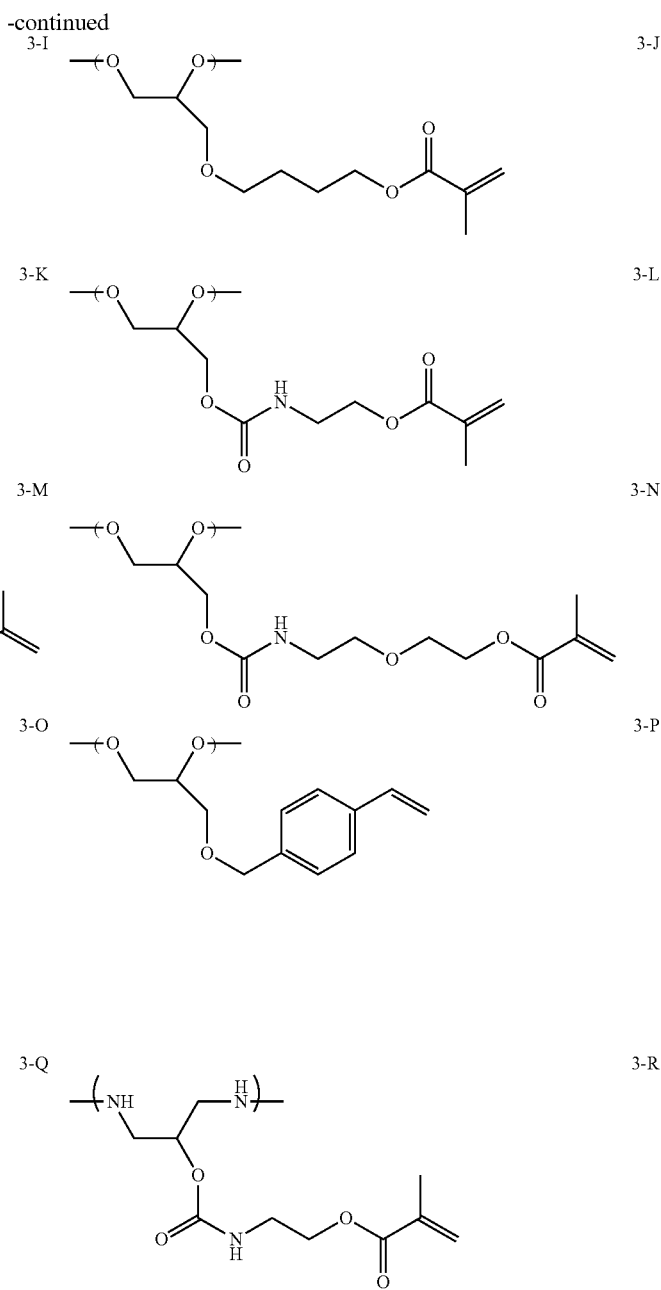

As described above, the above-described constitutional units 3-A to 3-H may further have a constitutional unit in which a group having a polymerizable group is introduced into both of the two carboxy groups on an aromatic ring, in addition to a constitutional unit in which a group having a polymerizable group is introduced into one of two carboxy groups on an aromatic ring.

In addition, in the dispersants A1 to A20, B1 to B23, and C1 to C3, it is presumed that the above-described constitutional units 3-A to 3-H are a constitutional unit in which the constitutional units shown above are mixed.

From the viewpoint of developability, dispersion stability, and adhesiveness of the cured product to be obtained, the weight-average molecular weight (Mw) of the resin A is preferably 3,000 or more, more preferably 3,000 to 30,000, still more preferably 3,000 to 15,000, and particularly preferably 5,000 to 10,000.

From the viewpoint of developability, curing properties, and adhesiveness of the cured product to be obtained, the ethylenically unsaturated bonding value (also referred to as "C=C value") of the resin A is preferably 0.01 mmol/g to 2.0 mmol/g, more preferably 0.1 mmol/g to 1.5 mmol/g, still more preferably 0.1 mmol/g to 1.0 mmol/g, and particularly preferably 0.15 mmol/g to 0.6 mmol/g.

The ethylenically unsaturated bonding value of the resin A refers to a molar amount of ethylenically unsaturated bonds per 1 g of the solid content of the resin A, and is measured by the following method.

<<Method for Preparing Sample>>

0.2 g of propyl benzoate (164-04893 manufactured by FUJIFILM Wako Pure Chemical Corporation) is weighed and mixed with 50 g of deuterated dimethyl sulfoxide (deuterated DMSO) (534-74585 manufactured by FUJIF- ILM Wako Pure Chemical Corporation) to prepare a deuterated DMSO with internal standard. Next, 0.03 g (expressed in terms of solid contents) of the resin A is weighed and mixed with 1.7 g of the deuterated DMSO with internal standard to produce a measurement sample.

<<Measuring Method of Nuclear Magnetic Resonance (NMR) Spectroscopy>>

The measurement sample is transferred to a sample tube for NMR, and NMR is measured ($^1$H-NMR, 400 MHz, DMSO, method integrating accumulate number: 16 times).

<<Analysis Method of NMR Spectrum>>

The peak of internal standard (propyl benzoate) is obtained at 7.90 ppm to 8.04 ppm, and the bias and slop are adjusted to set the integrated value to 2. The peak of the ethylenically unsaturated group is obtained at 6.25 ppm to 6.38 ppm, and the bias and slop are adjusted to record the integrated value.

<<Calculation Method>>

The ethylenically unsaturated bonding value is calculated by the expression shown below. For the ethylenically unsaturated bonding value in the present disclosure, the average value of three times adjusted and measured separately is adopted.

Ethylenically unsaturated bonding value [mmol/g]=(Integrated value of ethylenically unsaturated group×Weighed value [g] of deuterated DMSO with internal standard× Internal standard concentration [mmol/g])/(Weighed value [g] of resin A)

From the viewpoint of developability, the acid value of the resin A is preferably 20 mgKOH/g to 100 mgKOH/g, more preferably 30 mgKOH/g to 80 mgKOH/g, and particularly preferably 30 mgKOH/g to 60 mgKOH/g.

The acid value of the resin A represents a mass of potassium hydroxide required to neutralize acidic components per 1 g of solid content of the sample. The acid value of the resin A is measured as follows. That is, a measurement sample is dissolved in a mixed solvent of tetrahydrofuran/water=9/1 (mass ratio), and the obtained solution is subjected to neutralization titration with a 0.1 mol/L sodium hydroxide aqueous solution at 25° C. using a potentiometric titrator (trade name: AT-510, manufactured by KYOTO ELECTRONICS MANUFACTURING CO., LTD.). An inflection point of a titration pH curve is set as a titration end point, and the acid value is calculated from the following equation.

$$A = 56.11 \times Vs \times 0.5 \times f/w$$

A: acid value (mgKOH/g)

Vs: amount (mL) of the 0.1 mol/L sodium hydroxide aqueous solution used for the titration f: titer of the 0.1 mol/L sodium hydroxide aqueous solution w: mass (g) of the measurement sample (expressed in terms of solid contents)

The curable composition according to the embodiment of the present disclosure may include only one kind of the resin A or two or more kinds thereof.

The content of the resin A is preferably 1 mass % to 50 mass % with respect to the total solid content of the curable composition. The lower limit is more preferably 3 mass % or more, still more preferably 5 mass % or more, and particularly preferably 10 mass % or more. The upper limit is more preferably 45 mass % or less and particularly preferably 40 mass % or less.

<Pigment>

The curable composition according to the embodiment of the present disclosure includes a pigment.

Examples of the pigment include a white pigment, a black pigment, a chromatic pigment, and a near-infrared absorbing pigment. In the present disclosure, the white pigment includes not only a pure white pigment but also a bright gray (for example, grayish-white, light gray, and the like) pigment close to white. In addition, the pigment may be an inorganic pigment or an organic pigment, but from the viewpoint that dispersion stability is more easily improved, an organic pigment is preferable. In addition, as the pigment, a pigment having a maximal absorption wavelength in a wavelength range of 400 nm to 2,000 nm is preferable, and a pigment having a maximal absorption wavelength in a wavelength range of 400 nm to 700 nm is more preferable. In addition, in a case of using a pigment (preferably a chromatic pigment) having a maximal absorption wavelength in a wavelength range of 400 nm to 700 nm, the curable composition according to the embodiment of the present disclosure can be preferably used as a curable composition for forming a colored layer in a color filter. Examples of the colored layer include a red-colored layer, a green-colored layer, a blue-colored layer, a magenta-colored layer, a cyan-colored layer, and a yellow-colored layer.

The average primary particle diameter of the pigment is preferably 1 nm to 200 nm. The lower limit is preferably 5 nm or more and more preferably 10 nm or more. The upper limit is preferably 180 nm or less, more preferably 150 nm or less, and still more preferably 100 nm or less. In a case where the average primary particle diameter of the pigment is within the above-described range, dispersion stability of the pigment in the curable composition is good. In the present disclosure, the primary particle diameter of the pigment can be determined from an image obtained by observing primary particles of the pigment using a transmission electron microscope. Specifically, a projected area of the primary particles of the pigment is determined, and the corresponding equivalent circle diameter is calculated as the primary particle diameter of the pigment. In addition, the average primary particle diameter in the present disclosure is the arithmetic average value of the primary particle diameters with respect to 400 primary particles of the pigment. In addition, the primary particle of the pigment refers to a particle which is independent without aggregation.

—Chromatic Pigment—

The chromatic pigment is not particularly limited, and a known chromatic pigment can be used. Examples of the chromatic pigment include a pigment having a maximal absorption wavelength in a wavelength range of 400 nm to 700 nm. Examples thereof include a yellow pigment, an orange pigment, a red pigment, a green pigment, a violet pigment, and a blue pigment. Specific examples of these pigments include the following pigments.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 215, 228 (direct connection-type quinophthalone dimer described in WO2013/098836A), 231, 232 (methine-based), 233 (quinoline-based), 234 (aminoketone-based), 235 (aminoketone-based), 236 (aminoketone-based), and the like (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, 294 (xanthene-based, Organo Ultramarine, Bluish Red), 295 (monoazo-based), 296 (diazo-based), 297 (aminoketone-based), and the like (all of which are red pigments);

C. I. Pigment Green 7, 10, 36, 37, 58, 59, 62, and 63 (all of which are green pigments);

C. I. Pigment Violet 1, 19, 23, 27, 32, 37, 42, 60 (triarylmethane-based), 61 (xanthene-based), and the like (all of which are violet pigments); and C. I. Pigment Blue 1, 2, 15, 15:1, 15:2, 15:3, 15:4, 15:6, 16, 22, 60, 64, 66, 79, 80, 87 (monoazo-based), 88 (methine-based), and the like (all of which are blue pigments).

As the green pigment, a halogenated zinc phthalocyanine compound having an average number of halogen atoms in one molecule of 10 to 14, an average number of bromine atoms in one molecule of 8 to 12, and an average number of chlorine atoms in one molecule of 2 to 5 can also be used. As specific examples thereof, compounds described in WO2015/118720A, compounds described in CN2010-6909027A, a phthalocyanine compound having a phosphoric acid ester as a ligand, and the like can also be used.

In addition, as the green pigment, green pigments described in JP2019-8014A or JP2018-180023A may be used.

An aluminum phthalocyanine compound having a phosphorus atom can also be used as the blue pigment. Specific examples thereof include the compounds described in paragraphs 0022 to 0030 of JP2012-247591A and paragraph 0047 of JP2011-157478A.

In addition, a pigment described in JP2017-201003A and a pigment described in JP2017-197719A can be used as the yellow pigment. In addition, as the yellow pigment, a metal azo pigment which includes at least one kind of an anion selected from the group consisting of an azo compound represented by Formula (Y) and an azo compound having a tautomeric structure of the azo compound represented by Formula (Y), two or more kinds of metal ions, and a melamine compound can be used.

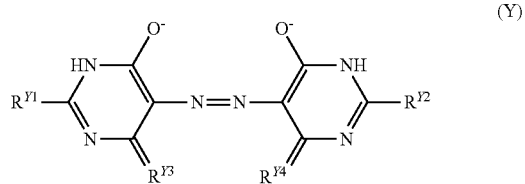

(Y)

In Formula (Y), $R^{Y1}$ and $R^{Y2}$ each independently represent —OH or $NR^{Y5}R^{Y6}$, $R^{Y3}$ and $R^{Y4}$ each independently represent =O or =$NR^{Y7}$, and $R^{Y5}$ to $R^{Y7}$ each independently represent a hydrogen atom or an alkyl group.

The alkyl group represented by $R^{Y5}$ to $R^{Y7}$ preferably has 1 to 10 carbon atoms, more preferably has 1 to 6 carbon atoms, and still more preferably has 1 to 4 carbon atoms. The above-described alkyl group may be linear, branched, or cyclic, and is preferably linear or branched and more preferably linear. The above-described alkyl group may have a substituent. Preferred examples of the substituent include a halogen atom, a hydroxy group, an alkoxy group, a cyano group, and an amino group.

The details of the metal azo pigment can be found in paragraphs 0011 to 0062 and 0137 to 0276 of JP2017-171912A, paragraphs 0010 to 0062 and 0138 to 0295 of JP2017-171913A, paragraphs 0011 to 0062 and 0139 to 0190 of JP2017-171914A, and paragraphs 0010 to 0065 and 0142 to 0222 of JP2017-171915A, the contents of which are incorporated herein by reference.

In addition, as the yellow pigment, a quinophthalone dimer represented by Formula (Q) can also be suitably used. Further, a quinophthalone dimer described in JP6443711B can also be suitably used.

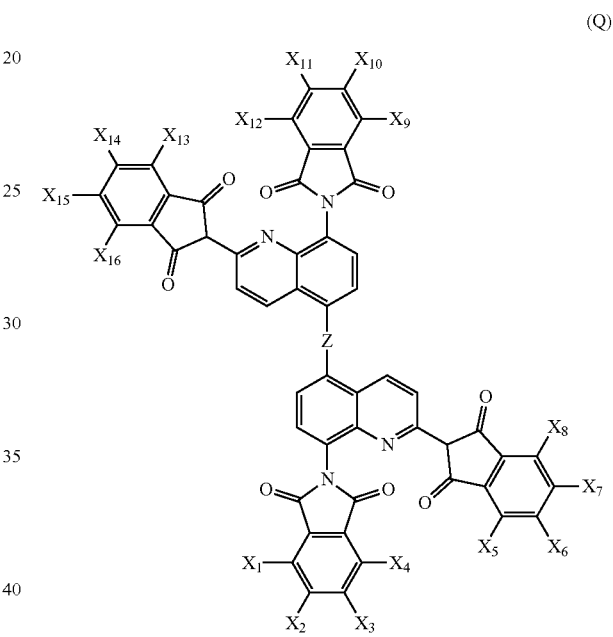

(Q)

In Formula (Q), $X^1$ to $X^{16}$ each independently represent a hydrogen atom or a halogen atom, and Z represents an alkylene group having 1 to 3 carbon atoms.

As the yellow pigment, quinophthalone pigments described in JP2018-203798A, JP2018-62578A, JP6432077B, JP6432076B, JP2018-155881A, JP2018-111757A, JP2018-40835A, JP2017-197640A, JP2016-145282A, JP2014-85565A, JP2014-21139A, JP2013-209614A, JP2013-209435A, JP2013-181015A, JP2013-61622A, JP2013-54339A, JP2013-32486A, JP2012-226110A, JP2008-74987A, JP2008-81565A, JP2008-74986A, JP2008-74985A, JP2008-50420A, JP2008-31281A, or JP1973-32765B (JP-S48-32765B) can also be suitably used.

In addition, as the yellow pigment, quinophthalone compounds described in paragraphs 0011 to 0034 of JP2013-54339A, quinophthalone compounds described in paragraphs 0013 to 0058 of JP2014-26228A, yellow pigments described in JP2019-8014A, quinophthalone compounds described in JP6607427B, compounds described in KR10-2014-0034963A, compounds described in JP2017-095706A, compounds described in TW2019-20495A, compounds described in JP6607427B, and the like can also be used.

In addition, as the yellow pigment, compounds described in JP2018-62644A can also be used. These compounds can also be used as a pigment derivative.

Further, as described in JP2018-155881A, C. I. Pigment Yellow 129 may be added for the purpose of improving weather fastness.

As the red pigment, diketopyrrolopyrrole-based pigments described in JP2017-201384A, in which the structure has at least one substituted bromine atom, diketopyrrolopyrrole-based pigments described in paragraphs 0016 to 0022 of JP6248838B, diketopyrrolopyrrole compounds described in WO2012/102399A, diketopyrrolopyrrole compounds described in WO2012/117965A, naphtholazo compounds described in JP2012-229344, and the like can also be used.

Further, as the red pigment, red pigments described in JP6516119B or JP6525101B can also be suitably used.

In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can be used. As the compound, a compound represented by Formula (DPP1) is preferable, and a compound represented by Formula (DPP2) is more preferable.

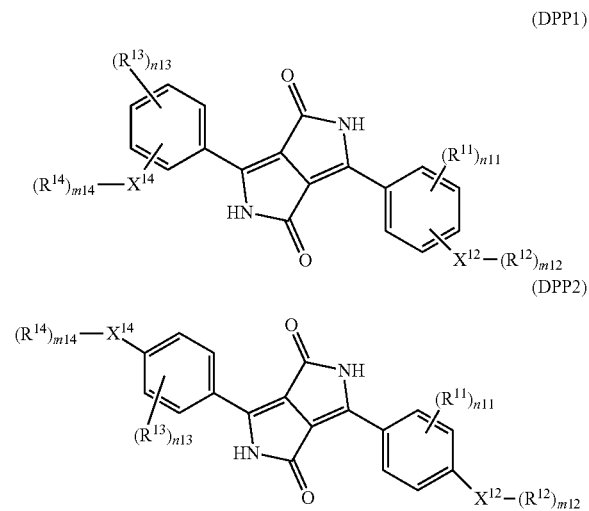

In the formulae, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where $X^{12}$ is an oxygen atom or a sulfur atom, m12 represents 1, in a case where $X^{12}$ is a nitrogen atom, m12 represents 2, in a case where $X^{14}$ is an oxygen atom or a sulfur atom, m14 represents 1, and in a case where $X^{14}$ is a nitrogen atom, m14 represents 2. Preferred specific examples of the substituent represented by $R^{11}$ and $R^{13}$ include an alkyl group, an aryl group, a halogen atom, an acyl group, an alkoxycarbonyl group, an aryloxycarbonyl group, a heteroaryloxycarbonyl group, an amide group, a cyano group, a nitro group, a trifluoromethyl group, a sulfoxide group, and a sulfo group.

In the present disclosure, the chromatic pigment may be used in combination of two or more kinds thereof. In addition, in a case where the chromatic pigment is used in combination of two or more kinds thereof, the combination of two or more chromatic pigments may form black. Examples of such a combination include the following aspects (1) to (7). In a case where two or more chromatic pigments are included in the curable composition and the combination of two or more chromatic pigments forms black, the curable composition according to the embodiment of the present disclosure can be preferably used as an infrared transmitting filter, and can be more preferably used as a near-infrared transmitting filter.

(1) aspect in which a red pigment and a blue pigment are contained.

(2) aspect in which a red pigment, a blue pigment, and a yellow pigment are contained.

(3) aspect in which a red pigment, a blue pigment, a yellow pigment, and a violet pigment are contained.

(4) aspect in which a red pigment, a blue pigment, a yellow pigment, a violet pigment, and a green pigment are contained.

(5) aspect in which a red pigment, a blue pigment, a yellow pigment, and a green pigment are contained.

(6) aspect in which a red pigment, a blue pigment, and a green pigment are contained.

(7) aspect in which a yellow pigment and a violet pigment are contained.

In addition, in a case of a cyan-colored curable composition, as the pigment, it is preferable to include at least one phthalocyanine pigment selected from the group consisting of C. I. Pigment Blue 15:3 and C. I. Pigment Blue 15:4. Hereinafter, C. I. Pigment Blue 15:3 and C. I. Pigment Blue 15:4 are also collectively referred to as a specific phthalocyanine pigment.

From the reason that it is easy to obtain a cured film having spectral characteristics suitable for cyan color by increasing transmittance of visible light, the average secondary particle diameter of the specific phthalocyanine pigment is preferably 50 nm to 100 nm. From the viewpoint of light resistance, the lower limit is preferably 55 nm or more, and more preferably 60 nm or more. From the viewpoint of spectral characteristics, the upper limit is preferably 95 nm or less, and more preferably 90 nm or less.

In the present specification, the average secondary particle diameter of the pigment is measured by directly measuring the size of the secondary particle of the pigment from an electron micrograph using a transmission electron microscope (TEM). Specifically, the minor axis diameter and the major axis diameter of the secondary particle of each pigment are measured, and the average thereof is defined as the particle diameter of the pigment. Next, for each of the 100 pigments, the volume of each pigment is obtained by approximating it to a cube having the obtained particle diameter, and the volume average particle diameter is defined as the average secondary particle diameter.

In a case of a cyan-colored curable composition, the pigment contains the specific phthalocyanine pigment in an amount of preferably 50 mass % or more, more preferably 55 mass % or more, still more preferably 60 mass % or more, and particularly preferably 65 mass % or more with respect to the total mass of the pigment. The upper limit may be 100 mass %, 95 mass % or less, or 90 mass % or less.

In a case where the pigment used in the curable composition according to the embodiment of the present disclosure includes C. I. Pigment Blue 15:3 and C. I. Pigment Blue 15:4, the mass ratio of C. I. Pigment Blue 15:3 and C. I. Pigment Blue 15:4 is preferably 10 parts by mass to 1,000 parts by mass of C. I. Pigment Blue 15:4, more preferably 25 parts by mass to 400 parts by mass of C. I. Pigment Blue 15:4, and still more preferably 50 parts by mass to 200 parts by mass of C. I. Pigment Blue 15:4 with respect to 100 parts by mass of C. I. Pigment Blue 15:3.

—White Pigment—

Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably particles having a titanium atom, more preferably titanium oxide. In addition, the white pigment is preferably a particle having a refractive index of 2.10 or more with respect to light having a wavelength of 589 nm. The above-mentioned refractive index is preferably 2.10 to 3.00 and more preferably 2.50 to 2.75. In addition, as the white pigment, the titanium oxide described in "Titanium Oxide-Physical Properties and Applied Technology, written by Manabu Kiyono, pages 13 to 45, published in Jun. 25, 1991, published by Gihodo Shuppan Co., Ltd." can also be used.

The white pigment is not limited to a compound formed of a single inorganic substance, and may be particles combined with other materials. For example, it is preferable to use a particle having a pore or other materials therein, a particle having a number of inorganic particles attached to a core particle, or a core-shell composite particle composed of a core particle formed of polymer particles and a shell layer formed of inorganic nanoparticles. With regard to the core-shell composite particle composed of a core particle formed of polymer particles and a shell layer formed of inorganic nanoparticles, reference can be made to, for example, the descriptions in paragraphs 0012 to 0042 of JP2015-047520A, the contents of which are incorporated herein by reference.

As the white pigment, hollow inorganic particles can also be used. The hollow inorganic particles refer to inorganic particles having a structure with a cavity therein, and the cavity is enclosed by an outer shell. As the hollow inorganic particles, hollow inorganic particles described in JP2011-075786A, WO2013/061621A, JP2015-164881A, and the like can be used, the contents of which are incorporated herein by reference.

—Black Pigment—

The black pigment is not particularly limited, and a known black pigment can be used. Examples thereof include carbon black, titanium black, and graphite, and carbon black or titanium black is preferable and titanium black is more preferable. The titanium black is black particles containing a titanium atom, and is preferably lower titanium oxide or titanium oxynitride. The surface of the titanium black can be modified, as necessary, according to the purpose of improving dispersibility, suppressing aggregating properties, and the like. For example, the surface of the titanium black can be coated with silicon oxide, titanium oxide, germanium oxide, aluminum oxide, magnesium oxide, or zirconium oxide. In addition, a treatment with a water-repellent substance as described in JP2007-302836A can be performed. Examples of the black pigment include Color Index (C. I.) Pigment Black 1 and 7. It is preferable that the titanium black has a small primary particle diameter of the individual particles and has a small average primary particle diameter. Specifically, the average primary particle diameter thereof is preferably 10 to 45 nm. The titanium black can be used as a dispersion. Examples thereof include a dispersion which includes titanium black particles and silica particles and in which the content ratio of Si atoms to Ti atoms is adjusted to a range of 0.20 to 0.50. With regard to the dispersion, reference can be made to the description in paragraphs. 0020 to 0105 of JP2012-169556A, the contents of which are incorporated herein by reference. Examples of a commercially available product of the titanium black include Titanium black 10S, 12S, 13R, 13M, 13M-C, 13R-N, 13M-T (trade name; manufactured by Mitsubishi Materials Corporation) and Tilack D (trade name; manufactured by Akokasei Co., Ltd.).

—Near-Infrared Absorbing Pigment—

The near-infrared absorbing pigment is preferably an organic pigment. In addition, the near-infrared absorbing pigment preferably has a maximal absorption wavelength in a wavelength range of more than 700 nm and 1,400 nm or less. In addition, the maximal absorption wavelength of the near-infrared absorbing pigment is preferably 1,200 nm or less, more preferably 1,000 nm or less, and still more preferably 950 nm or less. In addition, in the near-infrared absorbing pigment, $A_{550}/A_{max}$, which is a ratio of an absorbance $A_{550}$ at a wavelength of 550 nm to an absorbance $A_{max}$ at the maximal absorption wavelength, is preferably 0.1 or less, more preferably 0.05 or less, still more preferably 0.03 or less, and particularly preferably 0.02 or less. The lower limit is not particularly limited, but for example, may be 0.0001 or more or may be 0.0005 or more. In a case where the ratio of the above-described absorbance is within the above-described range, a near-infrared absorbing pigment excellent in visible transparency and near-infrared shielding properties can be obtained. In the present disclosure, the maximal absorption wavelength of the near-infrared absorbing pigment and values of absorbance at each wavelength are values obtained from an absorption spectrum of a film formed by using a curable composition including the near-infrared absorbing pigment.

The near-infrared absorbing pigment is not particularly limited, and examples thereof include a pyrrolopyrrole compound, a rylene compound, an oxonol compound, a squarylium compound, a cyanine compound, a croconium compound, a phthalocyanine compound, a naphthalocyanine compound, a pyrylium compound, an azurenium compound, an indigo compound, and a pyrromethene compound. Among these, at least one compound selected from the group consisting of a pyrrolopyrrole compound, a squarylium compound, a cyanine compound, a phthalocyanine compound, and a naphthalocyanine compound is preferable, and a pyrrolopyrrole compound or a squarylium compound is more preferable, and a pyrrolopyrrole compound is particularly preferable.

In addition, preferred examples of the pigment used in the present disclosure include a pigment having an X-ray diffraction pattern by a specific CuKα ray. Specific examples thereof include phthalocyanine pigments described in JP6561862B, diketopyrrolopyrrole pigments described in JP6413872B, and azo pigments (C. I. Pigment Red 269) described in JP6281345B.

The content of the pigment in the total solid content of the curable composition is preferably 5 mass % or more, more preferably 10 mass % or more, still more preferably 20 mass % or more, and even more preferably 30 mass % or more, and particularly preferably 40 mass % or more. The upper limit is preferably 80 mass % or less, more preferably 70 mass % or less, and still more preferably 60 mass % or less.

<Dye>

The curable composition according to the embodiment of the present disclosure may include a dye. The dye is not particularly limited and a known dye can be used. The dye may be a chromatic dye or may be a near-infrared absorbing dye. Examples of the chromatic dye include a pyrazolcazo compound, an anilinoazo compound, a triarylmethane compound, an anthraquinone compound, an anthrapyridone compound, a benzylidene compound, an oxonol compound, a pyrazolotriazoleazo compound, a pyridoneazo compound, a cyanine compound, a phenothiazine compound, a pyrrolopyrazoleazomethine compound, a xanthene compound, a phthalocyanine compound, a benzopyran compound, an indigo compound, and a pyrromethene compound. In addition, the thiazole compound described in JP2012-158649A, the azo compound described in JP2011-184493A, or the azo compound described in JP2011-145540A can also be used. In addition, as yellow dyes, the quinophthalone compounds described in paragraphs 0011 to 0034 of JP2013-054339A, or the quinophthalone compounds described in paragraphs 0013 to 0058 of JP2014-026228A can be used. Examples of the near-infrared absorbing dye include a pyrrolopyrrole compound, a rylene compound, an oxonol compound, a squarylium compound, a cyanine compound, a croconium compound, a phthalocyanine compound, a naphthalocyanine compound, a pyrylium compound, an azurenium compound, an indigo compound, and a pyrromethene compound. In addition, the squarylium compounds described in JP2017-197437A, the squarylium compounds described in paragraphs 0090 to 0107 of WO2017/213047A, the pyrrole ring-containing compounds described in paragraphs 0019 to 0075 of JP2018-054760A, the pyrrole ring-containing compounds described in paragraphs 0078 to 0082 of JP2018-040955A, the pyrrole ring-containing compounds described in paragraphs 0043 to 0069 of JP2018-002773A, the squarylium compounds having an aromatic ring at the α-amide position described in paragraphs 0024 to 0086 of JP2018-041047A, the amide-linked squarylium compounds described in JP2017-179131A, the compounds having a pyrrole bis-type squarylium skeleton or a croconium skeleton described in JP2017-141215A, the dihydrocarbazole bis-type squarylium compounds described in JP2017-082029, the asymmetric compounds described in paragraphs 0027 to 0114 of JP2017-068120A, the pyrrole ring-containing compounds (carbazole type) described in JP2017-067963A, the phthalocyanine compounds described in JP6251530B, and the like can be used.

In addition, as the dye, methine dyes described in JP2019-073695A, methine dyes described in JP2019-073696A, methine dyes described in JP2019-073697A, and methine dyes described in JP2019-073698A can also be used.

The content of the dye in the total solid content of the curable composition is preferably 1 mass % or more, more preferably 5 mass % or more, and particularly preferably 10 mass % or more. The upper limit is not particularly limited, but is preferably 70 mass % or less, more preferably 65 mass % or less, and still more preferably 60 mass % or less.

In addition, the content of the dye is preferably 5 to 50 parts by mass with respect to 100 parts by mass of the pigment. The upper limit is preferably 45 parts by mass or less and more preferably 40 parts by mass or less. The lower limit is preferably 10 parts by mass or more and still more preferably 15 parts by mass or more.

In addition, it is also possible that the curable composition according to the embodiment of the present disclosure does not substantially contain the dye. The case where the curable composition according to the embodiment of the present disclosure does not substantially include the dye means that the content of the dye in the total solid content of the curable composition according to the embodiment of the present disclosure is preferably 0.1 mass % or less, more preferably 0.05 mass % or less, and particularly preferably 0 mass %.

In the curable composition according to the embodiment of the present disclosure, a coloring agent multimer can also be used. The coloring agent multimer is preferably a dye which is used after being dissolved in a solvent. In addition, the coloring agent multimer may form a particle. In a case where the coloring agent multimer is a particle, the coloring agent multimer is usually used in a state of being dispersed in a solvent. The coloring agent multimer in the particle state can be obtained by, for example, emulsion polymerization, and specific examples thereof include the compounds and production methods described in JP2015-214682A. The coloring agent multimer has two or more coloring agent structures in one molecule, and preferably has three or more coloring agent structures in one molecule. The upper limit is particularly not limited, but may be 100 or less. A plurality of coloring agent structures included in one molecule may be the same coloring agent structure or different coloring agent structures. The weight-average molecular weight (Mw) of the coloring agent multimer is preferably 2,000 to 50,000. The lower limit is more preferably 3,000 or more and still more preferably 6,000 or more. The upper limit is more preferably 30,000 or less and still more preferably 20,000 or less. As the coloring agent multimer, the compounds described in JP2011-213925A, JP2013-041097A, JP2015-028144A, JP2015-030742A, WO2016/031442A, or the like can also be used.

<Curable Compound>

The curable composition according to the embodiment of the present disclosure includes a curable compound, and from the viewpoint of film hardness and pattern formability, it is preferable to include a curable compound and further include a polymerization initiator described later, and it is more preferable to include a curable compound and further include a photopolymerization initiator described later.

The reaction mechanism in the curing of the curable compound is not particularly limited. Examples thereof include a radical polymerization reaction, a cationic polymerization reaction, a condensation polymerization reaction, a nucleophilic addition reaction, and a crosslinking reaction by a substitution reaction. The curable compound is preferably a compound which is cured by a radical polymerization reaction.

Examples of the polymerizable group include an ethylenically unsaturated group and an epoxy group. Examples of the ethylenically unsaturated group include a vinyl group, a vinyloxy group, an allyl group, a methallyl group, a (meth)acryloyl group, a styrene group, a cinnamoyl group, and a maleimide group. Among these, a (meth)acryloyl group, a styrene group, or a maleimide group is preferable, a (meth)acryloyl group is more preferable, and an acryloyl group is particularly preferable.

In addition, the curable compound preferably includes an ethylenically unsaturated compound.

The curable compound may be either a monomer or a resin such as a polymer. It is also possible to use a monomer type curable compound and a resin type curable compound in combination.

The molecular weight of the curable compound is preferably less than 3,000. The upper limit is more preferably 2,000 or less and still more preferably 1,500 or less. The lower limit is preferably 100 or more, more preferably 150 or more, and still more preferably 250 or more. The curable compound is preferably a compound having 3 or more ethylenically unsaturated groups, more preferably a compound having 3 to 15 ethylenically unsaturated groups, and still more preferably a compound having 3 to 6 ethylenically unsaturated groups. In addition, the curable compound is preferably a trifunctional to pentadecafunctional (meth) acrylate compound and more preferably a trifunctional to hexafunctional (meth)acrylate compound. Specific examples of the polymerizable monomer include the compounds described in paragraphs 0095 to 0108 of JP2009-288705A, paragraph 0227 of JP2013-029760A, paragraphs 0254 to 0257 of JP2008-292970A, paragraphs 0034 to 0038 of JP2013-253224A, paragraph 0477 of JP2012-208494A, JP2017-048367A, JP6057891B, and JP6031807B, the contents of which are incorporated herein by reference.

As the curable compound, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth) acrylate (as a commercially available product, KAYARAD DPHA manufactured by Nippon Kayaku Co., Ltd., NK ESTER A-DPH-12E manufactured by Shin-Nakamura Chemical Co., Ltd.), or a compound having a structure in which these (meth)acryloyl groups are bonded through an ethylene glycol and/or a propylene glycol residue (for example, SR454 and SR499 which are commercially available products from Sartomer) is preferable.

As the curable compound, a compound having an acid group can also be used. By using a curable compound having an acid group, the curable composition layer in a non-exposed portion is easily removed during development and the generation of the development residue can be suppressed.

Examples of the acid group include a carboxy group, a sulfo group, and a phosphoric acid group, and a carboxy group is preferable. Examples of the curable compound having an acid group include succinic acid-modified dipentaerythritol penta(meth)acrylate. Examples of a commercially available product of the polymerizable monomer having an acid group include ARONIX M-510, M-520, and ARONIX TO-2349 (manufactured by TOAGOSEI CO., LTD). The acid value of the polymerizable monomer having an acid group is preferably 0.1 mgKOH/g to 40 mgKOH/g and more preferably 5 mgKOH/g to 30 mgKOH/g. In a case where the acid value of the curable compound is 0.1 mgKOH/g or more, solubility in a developer is good, and in a case where the acid value of the curable compound is 40 mgKOH/g or less, it is advantageous in production and handling.

The curable compound is also preferably a compound having a caprolactone structure. Examples of the curable compound having a caprolactone structure include DPCA-20, DPCA-30, DPCA-60, and DPCA-120, each of which is commercially available as KAYARAD DPCA series from Nippon Kayaku Co., Ltd.

As the curable compound, a compound having an alkyleneoxy group can also be used. The curable compound having an alkyleneoxy group is preferably a compound having an ethyleneoxy group and/or a propylencoxy group, more preferably a compound having an ethyleneoxy group, and still more preferably a trifunctional to hexafunctional (meth)acrylate compound having 4 to 20 ethyleneoxy groups. Examples of a commercially available product of the curable compound having an alkyleneoxy group include SR-494 manufactured by Sartomer, which is a tetrafunctional (meth)acrylate having 4 ethyleneoxy groups, and KAYARAD TPA-330 manufactured by Nippon Kayaku Co., Ltd., which is a trifunctional (meth)acrylate having 3 isobutyleneoxy groups.

As the curable compound, it is also preferable to use a compound which does not substantially include environmentally regulated substances such as toluene. Examples of a commercially available product of such a compound include KAYARAD DPHA LT and KAYARAD DPEA-12 LT (manufactured by Nippon Kayaku Co., Ltd.).

The urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable as the curable compound. In addition, the compounds having an amino structure or a sulfide structure in the molecule, described in JP1988-277653A (JP-S63-277653A), JP1988-260909A (JP-S63-260909A), or JP1989-105238A (JP-H01-105238A), are also preferably used. In addition, as the curable compound, commercially available products such as UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600, AI-600, and LINC-202UA (manufactured by KYOEISHA CHEMICAL Co., Ltd.) can also be used.

As a compound having an epoxy group (hereinafter, also referred to as an epoxy compound) which is used as the curable compound, a compound having two or more epoxy groups in one molecule is preferably used. The upper limit of epoxy groups of the epoxy compound is preferably 100 or less, more preferably 10 or less, and still more preferably 5 or less.

The epoxy equivalent (=the molecular weight of the compound having an epoxy group/the number of epoxy groups) of the epoxy compound is preferably 500 g/eq or less, more preferably 100 g/eq to 400 g/eq, and still more preferably 100 g/eq to 300 g/eq.

The epoxy compound may be a low-molecular-weight compound (for example, molecular weight: less than 1,000) or a high-molecular weight compound (macromolecule; for example, molecular weight: 1,000 or more, and in the case of a polymer, weight-average molecular weight: 1,000 or more). The molecular weight (in a case of the polymer, the weight-average molecular weight) of the epoxy compound is preferably 200 to 100,000 and more preferably 500 to 50,000. The upper limit of the molecular weight (in a case of the polymer, the weight-average molecular weight) is preferably 3,000 or less, more preferably 2,000 or less, and still more preferably 1,500 or less.

The curable compound may be used alone or in combination of two or more kinds thereof.

The content of the curable compound is preferably 0.1 mass % to 40 mass % with respect to the total solid content of the curable composition. The lower limit is preferably 1 mass % or more and more preferably 2 mass % or more. The upper limit is preferably 30 mass % or less, more preferably 20 mass % or less, and still more preferably 10 mass % or less.

In addition, in a case where the epoxy compound is used as the curable compound, the content of the epoxy compound is preferably 0.1 mass % to 40 mass % with respect to the total solid content of the curable composition. The lower limit is, for example, more preferably 1 mass % or more and still more preferably 2 mass % or more. The upper limit is, for example, more preferably 30 mass % or less and still more preferably 20 mass % or less. The epoxy compound may be used singly or in combination of two or more thereof. In addition, in a case where the ethylenically unsaturated compound and the compound having an epoxy group are used in combination, the proportion (mass ratio) between the compounds is preferably the mass of the ethylenically unsaturated compound: the mass of the compound having an epoxy group=100:1 to 100:400, more preferably 100:1 to 100:100, and still more preferably 100:1 to 100:50.

<Polymerization Initiator>

The curable composition according to the embodiment of the present disclosure preferably further includes a polymerization initiator, and more preferably further includes a photopolymerization initiator. In particular, in a case where the ethylenically unsaturated compound is used as the curable compound, it is particularly preferable that the curable composition according to the embodiment of the present disclosure further includes a photopolymerization initiator. The polymerization initiator is not particularly limited, and can be appropriately selected from known photopolymerization initiators and thermal polymerization initiators. As the photopolymerization initiator, a compound having photosensitivity to light in a range from an ultraviolet ray range to a visible range is preferable. In addition, the photopolymerization initiator is preferably a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. From the viewpoint of exposure sensitivity, the photopolymerization initiator preferably includes at least one compound selected from the group consisting of a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, and a 3-aryl-substituted coumarin compound, more preferably includes at least one compound selected from the group consisting of an oxime compound, an α-hydroxyketone compound, an α-aminoketone compound, and an acylphosphine compound, and still more preferably includes an oxime compound. Examples of the photopolymerization initiator include photopolymerization initiators described in paragraphs 0065 to 0111 of JP2014-130173A, photopolymerization initiators described in JP6301489B, peroxide-based photopolymerization initiators described in MATERIAL STAGE, pp. 37 to 60, vol. 19, No. 3, 2019, photopolymerization initiators described in WO2018/221177A, photopolymerization initiators described in WO2018/110179A, photopolymerization initiators described in JP2019-043864A, photopolymerization initiators described in JP2019-044030A, and organic peroxides described in JP2019-167313A, the contents of which are incorporated herein by reference.

Examples of a commercially available product of the α-hydroxyketone compound include IRGACURE-184, DAROCUR-1173, IRGACURE-500, IRGACURE-2959, and IRGACURE-127 (all manufactured by BASF). Examples of a commercially available product of the α-aminoketone compound include IRGACURE-907, IRGACURE-369, IRGACURE-379, and IRGACURE-379EG (all manufactured by BASF). Examples of a commercially available product of the acylphosphine compound include IRGACURE-819 and DAROCUR-TPO (both manufactured by BASF).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, the compounds described in paragraphs 0025 to 0038 of WO2017/164127A, and the compounds described in WO2013/167515A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy) iminobutane-2-one, and 2-ethoxycarbonyloxyimino-1-phenylpropane-1-one.

Examples of a commercially available product include IRGACURE OXE01, IRGACURE OXE02, IRGACURE OXE03, and IRGACURE OXE04 (all of which are manufactured by BASF), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no colorability or a compound having high transparency and being resistant to discoloration. Examples of a commercially available product include ADEKA ARKLS NCI-730, NCI-831, and NCI-930 (all of which are manufactured by ADEKA Corporation).

In addition, an oxime compound having a fluorene ring can also be used as the photopolymerization initiator. Specific examples of the oxime compound having a fluorene ring include the compounds described in JP2014-137466A. The contents of the publications are incorporated herein by reference.

In addition, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compound (C-3) described in JP2013-164471A. The contents of the publications are incorporated herein by reference.

Further, an oxime compound having a nitro group can be used as the photopolymerization initiator. The oxime compound having a nitro group is also preferably used in the form of a dimer. Specific examples of the oxime compound having a nitro group include the compounds described in paragraphs 0031 to 0047 of JP2013-114249A and paragraphs 0008 to 0012 and 0070 to 0079 of JP2014-137466A, the compounds described in paragraphs 0007 to 0025 of JP4223071B, and ADEKA ARKLS NCI-831 (manufactured by ADEKA Corporation).

An oxime compound having a benzofuran skeleton can also be used as the photopolymerization initiator. Specific examples thereof include OE-01 to OE-75 described in WO2015/036910A.

Specific examples of the oxime compound preferably used are shown below, but the oxime compound is not limited thereto.

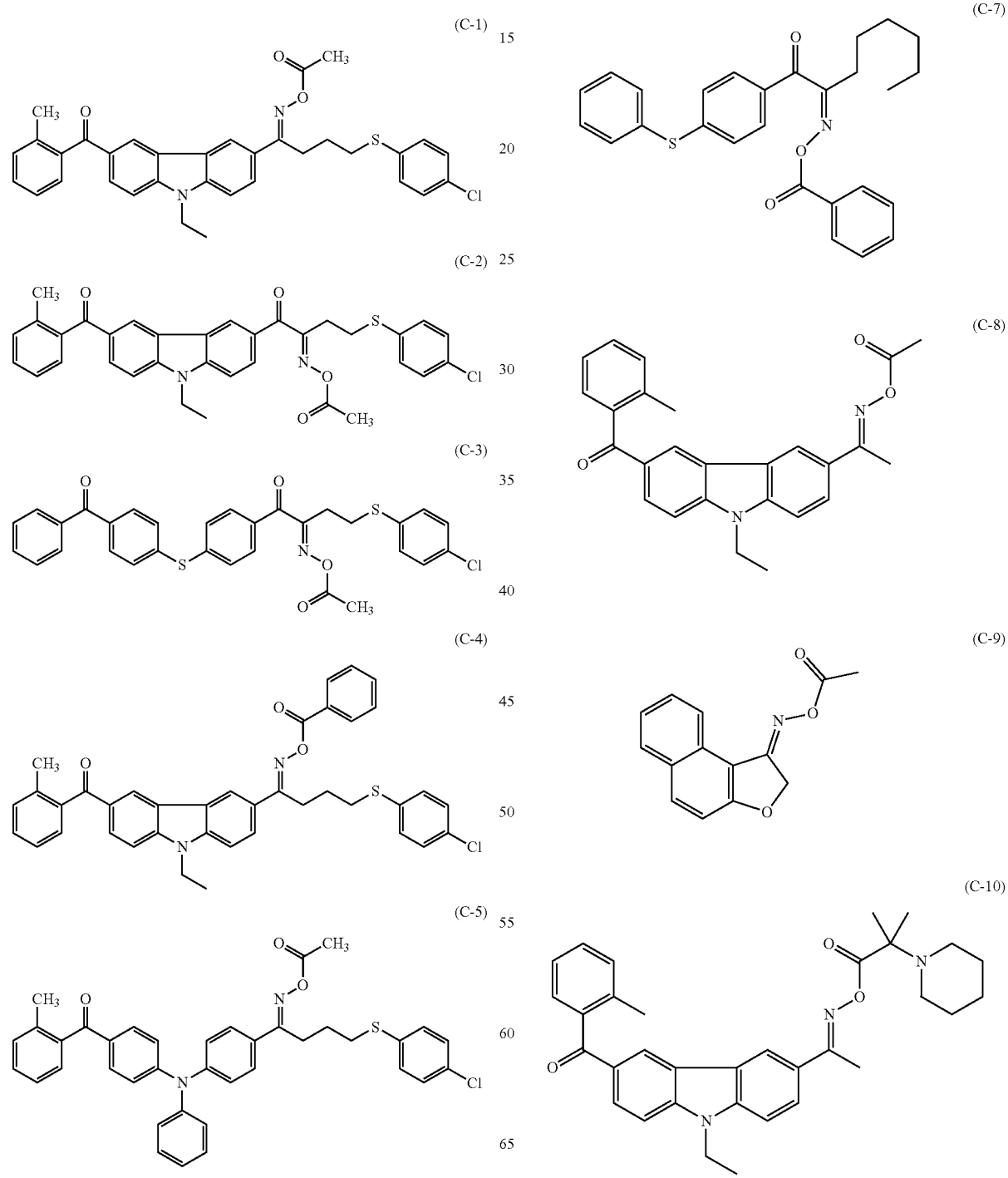

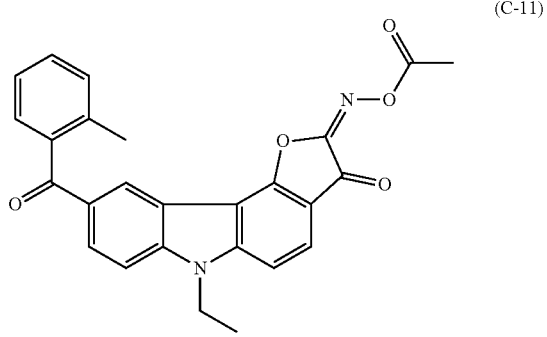
(C-11)

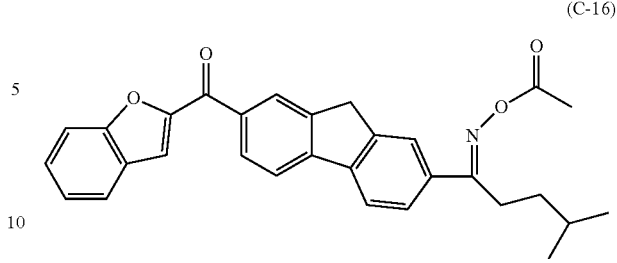
(C-16)

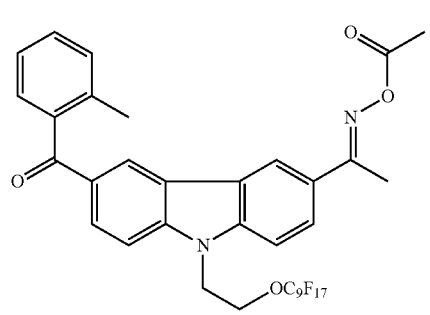
(C-12)

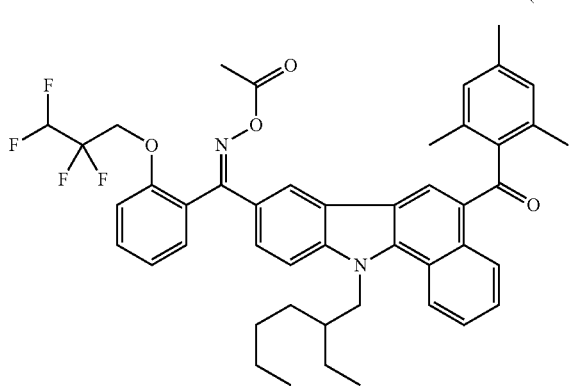
(C-13)

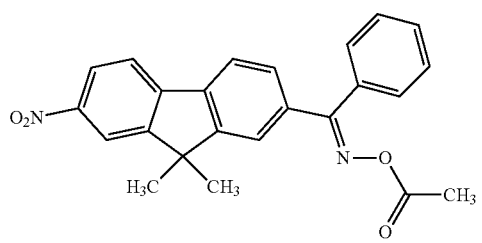
(C-14)

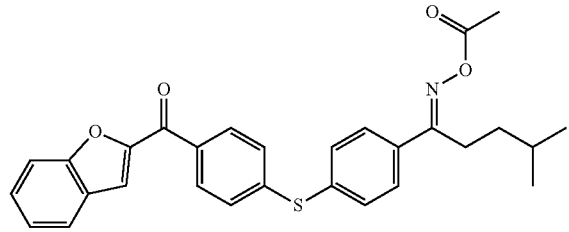
(C-15)

The oxime compound is preferably a compound having a maximal absorption wavelength in a wavelength range of 350 nm to 500 nm and more preferably a compound having a maximal absorption wavelength in a wavelength range of 360 nm to 480 nm. In addition, from the viewpoint of sensitivity, the molar absorption coefficient of the oxime compound at a wavelength of 365 nm or 405 nm is preferably high, more preferably 1,000 to 300,000, still more preferably 2,000 to 300,000, and particularly preferably 5,000 to 200,000. The molar absorption coefficient of a compound can be measured using a known method. For example, the molar absorption coefficient is preferably measured by a spectrophotometer (Cary-5 spectrophotometer, manufactured by Varian) using an ethyl acetate solvent at a concentration of 0.01 g/L.

In addition, examples of the thermal polymerization initiator or a polymerization initiator which can be polymerized with both light and heat include peroxide compounds described in MATERIAL STAGE p. 37 to 60, vol. 19, No. 3, 2019, WO2018/221177A, WO2018/110179A, or JP2019-43864A.

As the photopolymerization initiator, a bifunctional or tri- or higher functional photoradical polymerization initiator may be used. By using such a photoradical polymerization initiator, two or more radicals are generated from one molecule of the photoradical polymerization initiator, and as a result, good sensitivity is obtained. In addition, in a case of using a compound having an asymmetric structure, crystallinity is reduced so that solubility in a solvent or the like is improved, precipitation is to be difficult over time, and temporal stability of the curable composition can be improved. Specific examples of the bifunctional or tri- or higher functional photoradical polymerization initiator include dimers of the oxime compounds described in JP2010-527339A, JP2011-524436A, WO2015/004565A, paragraphs 0407 to 0412 of JP2016-532675A, and paragraphs 0039 to 0055 of WO2017/033680A; the compound (E) and compound (G) described in JP2013-522445A; Cmpd 1 to 7 described in WO2016/034963A; the oxime ester photoinitiators described in paragraph 0007 of JP2017-523465A; the photoinitiators described in paragraphs 0020 to 0033 of JP2017-167399A; the photopolymerization initiator (A) described in paragraphs 0017 to 0026 of JP2017-151342A; and the oxime ester photoinitiators described in JP6469669B.

The content of the polymerization initiator in the total solid content of the curable composition according to the embodiment of the present disclosure is preferably 0.1 mass % to 30 mass %. The lower limit is preferably 0.5 mass % or more and more preferably 1 mass % or more. The upper limit is preferably 20 mass % or less and more preferably 15 mass % or less. In the curable composition according to the embodiment of the present disclosure, the polymerization initiator may be used singly or in combination of two or more kinds thereof. In a case where two or more kinds thereof are used, the total amount thereof is preferably within the above-described range.

<Pigment Derivative>

From the viewpoint of dispersion stability, the curable composition according to the embodiment of the present disclosure preferably further includes a pigment derivative.

Examples of the pigment derivative include a compound having a structure in which a portion of a pigment is substituted with an acid group, a basic group, or a phthalimidomethyl group.

As the pigment derivative, compounds described in JP1981-118462A (JP-S56-118462A), JP1988-264674A (JP-S63-264674A), JP1989-217077A (JP-H01-217077A), JP1991-009961A (JP-H03-009961A), JP1991-026767A (JP-H03-026767A), JP1991-153780A (JP-H03-153780A), JP1991-045662A (JP-H03-045662A), JP1992-285669A (JP-H04-285669A), JP1994-145546A (JP-H06-145546A), JP1994-212088A (JP-H06-212088A), JP1994-240158A (JP-H06-240158A), JP1998-030063A (JP-H10-030063A), JP1998-195326A (JP-H10-195326A), paragraphs 0086 to 0098 of WO2011/024896A, paragraphs 0063 to 0094 of WO2012/102399A, paragraph 0082 of WO2017/038252A, paragraph 0171 of JP2015-151530A, JP2019-133154A, and the like can be used, the contents of which are incorporated herein by reference.

In addition, the pigment derivative preferably has, as a chromophore, a coloring agent skeleton such as a quinoline-based skeleton, a benzimidazolone-based skeleton, a diketopyrrolopyrrole-based skeleton, an azo-based skeleton, a phthalocyanine-based skeleton, an anthraquinone-based skeleton, a quinacridone-based skeleton, a dioxazine-based skeleton, a perinone-based skeleton, a perylene-based skeleton, a thioindigo-based skeleton, an isoindoline-based skeleton, an isoindolinone-based skeleton, a quinophthalone-based skeleton, a threne-based skeleton, and a metal complex-based skeleton. Among these, a quinoline-based skeleton, a benzimidazolone-based skeleton, a diketopyrrolopyrrole-based skeleton, an azo-based skeleton, a quinophthalone-based skeleton, an isoindoline-based skeleton, or a phthalocyanine-based skeleton is preferable, and an azo-based skeleton or a benzimidazolone-based skeleton is more preferable. As the acid group included in the pigment derivative, a sulfo group or a carboxy group is preferable and a sulfo group is more preferable. As the basic group included in the pigment derivative, an amino group is preferable and a tertiary amino group is more preferable.

The pigment derivative preferably includes a pigment derivative having a basic group (also referred to as a "basic pigment derivative"). In addition, from the viewpoint of developability and dispersion stability, the curable compound according to the embodiment of the present disclosure more preferably includes a binder polymer (dispersant) having an acid group and the pigment derivative having a basic group.

The content of the pigment derivative is preferably 1 part by mass to 50 parts by mass with respect to 100 parts by mass of the pigment. The lower limit value is preferably 3 parts by mass or more and more preferably 5 parts by mass or more. The upper limit value is preferably 40 parts by mass or less and more preferably 30 parts by mass or less. In a case where the content of the pigment derivative is within the above-described range, dispersibility of the pigment can be enhanced, and aggregation of the pigment can be efficiently suppressed. The pigment derivative may be used singly or in combination of two or more kinds thereof. In a case of using two or more kinds thereof, the total amount thereof is preferably within the above-described range.

<Binder Polymer>

The curable composition according to the embodiment of the present disclosure preferably includes a binder polymer.

The weight-average molecular weight (Mw) of the binder polymer is preferably 2,000 to 2,000,000. The upper limit is preferably 1,000,000 or less and more preferably 500,000 or less. The lower limit is preferably 3,000 or more and more preferably 5,000 or more.

Examples of the binder polymer include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamidoimide resin, a polyolefin resin, a cyclic olefin resin, a polyester resin, and a styrene resin. These resins may be used singly or as a mixture of two or more kinds thereof.

The binder polymer may have an acid group. Examples of the acid group include a carboxy group, a phosphoric acid group, a sulfo group, and a phenolic hydroxy group, and a carboxy group is preferable. Among these acid groups, one kind may be used alone, or two or more kinds may be used in combination. The resin having an acid group can also be used as an alkali-soluble resin.

The resin having an acid group is preferably a polymer having a carboxy group in the side chain. Specific examples thereof include methacrylic acid copolymers, acrylic acid copolymers, itaconic acid copolymers, crotonic acid copolymers, maleic acid copolymers, partially esterified maleic acid copolymers, alkali-soluble phenol resins such as novolak resin, acidic cellulose derivatives having a carboxy group in the side chain, and resins in which an acid anhydride is added to a polymer having a hydroxy group. In particular, a copolymer of a (meth)acrylic acid and another monomer copolymerizable therewith is suitable as the alkali-soluble resin. Examples of another monomer copolymerizable with the (meth)acrylic acid include alkyl (meth)acrylate, aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, and glycidyl (meth)acrylate. Examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer. In addition, as other monomers, the N-position-substituted maleimide monomers described in JP1998-300922A (JP-H10-300922A), such as N-phenylmaleimide and N-cyclohexylmaleimide, can also be used. Such other monomers copolymerizable with (meth) acrylic acids may be used singly or in combination of two or more kinds thereof.

As the resin having an acid group, a benzyl (meth)acrylate/(meth)acrylic acid copolymer, a benzyl (meth)acrylate/(meth)acrylic acid/2-hydroxyethyl (meth)acrylate copolymer, or a multicomponent copolymer formed of benzyl (meth)acrylate/(meth)acrylic acid/other monomers can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

Preferred examples of the resin having an acid group also include polymers described in paragraphs 0153 to 0167 of JP2018-173660A.

With regard to the resin having an acid group, reference can be made to the description in paragraphs 0558 to 0571 of JP2012-208494A (paragraphs 0685 to 0700 of the corresponding US2012/0235099A) and the description in paragraphs 0076 to 0099 of JP2012-198408A, the contents of which are incorporated herein by reference. A commercially available product can also be used as the resin having an acid group.

The acid value of the resin having an acid group is preferably 30 mgKOH/g to 200 mgKOH/g. The lower limit is preferably 50 mgKOH/g or more and more preferably 70 mgKOH/g or more. The upper limit is preferably 150 mgKOH/g or less and more preferably 120 mgKOH/g or less.

The curable composition according to the embodiment of the present disclosure may include only one kind of binder polymer or two or more kinds thereof.

In addition, the content of the binder polymer is preferably 1 mass % to 50 mass % with respect to the total solid content of the curable composition. The lower limit is preferably 3 mass % or more, more preferably 5 mass % or more, and still more preferably 10 mass % or more. The upper limit is preferably 45 mass % or less and more preferably 40 mass % or less.

<Silane Coupling Agent>

The curable composition according to the embodiment of the present disclosure can contain a silane coupling agent. According to this aspect, adhesiveness of a cured film to be obtained with a support can be improved. The silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group. Examples of the functional group other than the hydrolyzable group include a vinyl group, a (meth)allyl group, a (meth)acryloyl group, a mercapto group, an epoxy group, an oxetanyl group, an amino group, a ureido group, a sulfide group, an isocyanate group, and a phenyl group, and an amino group, a (meth)acryloyl group, or an epoxy group is preferable. Specific examples of the silane coupling agent include the compounds described in paragraphs 0018 to 0036 of JP2009-288703A and the compounds described in paragraphs 0056 to 0066 of JP2009-242604A, the contents of which are incorporated herein by reference.

The content of the silane coupling agent in the total solid content of the curable composition is preferably 0.1 mass % to 5 mass %. The upper limit is preferably 3 mass % or less and more preferably 2 mass % or less. The lower limit is preferably 0.5 mass % or more and more preferably 1 mass % or more. The silane coupling agent may be used singly or in combination of two or more kinds thereof. In a case of using two or more kinds thereof, the total amount thereof is preferably within the above-described range.

<Solvent>

The curable composition according to the embodiment of the present disclosure can contain a solvent.

Examples of the solvent include an organic solvent. Basically, the solvent is not particularly limited as long as it satisfies solubility of the respective components or application properties of the curable composition. Examples of the organic solvent include an ester-based solvent, a ketone-based solvent, an alcohol-based solvent, an amide-based solvent, an ether-based solvent, and a hydrocarbon-based solvent. With regard to details thereof, reference can be made to the description in paragraph 0223 of WO2015/166779A, the contents of which are incorporated herein by reference. In addition, an ester-based solvent substituted with a cyclic alkyl group or a ketone-based solvent substituted with a cyclic alkyl group can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, propylene glycol monomethyl ether acetate, 3-methoxy-N,N-dimethylpropanamide, and 3-butoxy-N,N-dimethylpropanamide. However, it may be preferable that the content of aromatic hydrocarbons (such as benzene, toluene, xylene, and ethylbenzene) as the solvent is low (for example, 50 parts per million (ppm) by mass or less, 10 ppm by mass or less, or 1 ppm by mass or less with respect to the total amount of the organic solvent) in consideration of environmental aspects and the like.

In the curable composition according to the embodiment of the present disclosure, a solvent having a low metal content is preferably used. For example, the metal content in the solvent is preferably 10 ppb (parts per billion) by mass or less. A solvent in which the metal content is at a level of ppt (parts per trillion) by mass may be used as desired, and such a high-purity solvent is provided by, for example, Toyo Kasei Kogyo Co., Ltd. (The Chemical Daily, Nov. 13, 2015).

Examples of a method for removing impurities such as a metal from the solvent include distillation (such as molecular distillation and thin-film distillation) and filtration using a filter. The filter pore size of the filter used for the filtration is preferably 10 μm or less, more preferably 5 μm or less, and still more preferably 3 μm or less. As a material of the filter, polytetrafluoroethylene, polyethylene, or nylon is preferable.

The solvent may include isomers (compounds having the same number of atoms and different structures). In addition, only one kind of isomers may be included, or a plurality of isomers may be included.

The organic solvent preferably has the content of peroxides of 0.8 mmol/L or less, and more preferably, the organic solvent does not substantially include peroxides.

The content of the solvent in the curable composition is preferably 10 mass % to 95 mass %, more preferably 20 mass % to 90 mass %, and still more preferably 30 mass % to 90 mass %.

In addition, from the viewpoint of environmental regulation, it is preferable that the curable composition according to the embodiment of the present disclosure does not substantially contain environmentally regulated substances. In the present disclosure, the description "does not substantially contain environmentally regulated substances" means that the content of the environmentally regulated substances in the coloring composition is 50 ppm by mass or less, preferably 30 ppm by mass or less, still more preferably 10 ppm by mass or less, and particularly preferably 1 ppm by mass or less.

<Polymerization Inhibitor>

The curable composition according to the embodiment of the present disclosure preferably further includes a polymerization inhibitor.

Examples of the polymerization inhibitor include hydroquinone, p-methoxyphenol, di-tert-butyl-p-cresol, 2,2,6,6-tetramethylpiperidin-1-oxyl, 2,2,6,6-tetramethyl-4-hydroxypiperidin-1-oxyl, pyrogallol, tert-butyl catechol, benzoquinone, 4,4'-thiobis(3-methyl-6-tert-butylphenol), 2,2'-methylenebis(4-methyl-6-t-butylphenol), and an N-nitrosophenylhydroxylamine salt (an ammonium salt, a cerous salt, or the like). Among these, it is preferable to include at least one compound selected from the group consisting of 2,2,6,6-tetramethylpiperidin-1-oxyl and 2,2,6,6-tetramethyl-4-hydroxypiperidin-1-oxyl. The content of the polymerization inhibitor in the total solid content of the curable composition is preferably 0.0001 mass % to 5 mass %.

<Surfactant>

The curable composition according to the embodiment of the present disclosure can contain a surfactant.

As the surfactant, various surfactants such as a fluorine-based surfactant, a nonionic surfactant, a cationic surfactant, an anionic surfactant, and a silicon-based surfactant can be used. With regard to the surfactant, reference can be made to the description in paragraphs 0238 to 0245 of WO2015/166779A and paragraphs 0253 to 0260 of JP2018-173660A, the contents of which are incorporated herein by reference.

It is preferable that the surfactant is a fluorine-based surfactant. By containing a fluorine-based surfactant in the curable composition, liquid characteristics (particularly, fluidity) are further improved, and liquid saving properties can be further improved. In addition, it is possible to form a film with a small thickness unevenness.

The fluorine atom content in the fluorine-based surfactant is preferably 3 mass % to 40 mass %, more preferably 5 mass % to 30 mass %, and particularly preferably 7 mass % to 25 mass %. The fluorine-based surfactant in which the fluorine atom content is within the above-described range is effective in terms of the evenness of the thickness of the coating film or liquid saving properties and the solubility of the surfactant in the curable composition is also good.

The content of the surfactant in the total solid content of the curable composition is preferably 0.001 mass % to 5.0 mass % and more preferably 0.005 mass % to 3.0 mass %. The surfactant may be used singly or in combination of two or more kinds thereof. In a case of using two or more kinds thereof, the total amount thereof is preferably within the above-described range.

<Ultraviolet Absorber>

The curable composition according to the embodiment of the present disclosure preferably includes an ultraviolet absorber.

As the ultraviolet absorber, a conjugated diene compound, an aminodiene compound, a salicylate compound, a benzophenone compound, a benzotriazole compound, an acrylonitrile compound, a hydroxyphenyltriazine compound, an indole compound, a triazine compound, or the like can be used. With regard to details thereof, reference can be made to the description in paragraphs 0052 to 0072 of JP2012-208374A, paragraphs 0317 to 0334 of JP2013-068814A, and paragraphs 0061 to 0080 of JP2016-162946A, the contents of which are incorporated herein by reference.

Examples of a commercially available product of the ultraviolet absorber include UV-503 (manufactured by Daito Chemical Co., Ltd). In addition, examples of the benzotriazole compound include MYUA series manufactured by Miyoshi Oil & Fat Co., Ltd. (The Chemical Daily, Feb. 1, 2016). In addition, as the ultraviolet absorber, compounds described in paragraphs 0049 to 0059 of JP6268967B can also be used.

The content of the ultraviolet absorber in the total solid content of the curable composition is preferably 0.01 mass % to 10 mass % and more preferably 0.01 mass % to 5 mass %. The ultraviolet absorber may be used singly or in combination of two or more kinds thereof. In a case where two or more kinds thereof are used, it is preferable that the total amount thereof is within the above-described range.

<Antioxidant>

The curable composition according to the embodiment of the present disclosure can contain an antioxidant.

Examples of the antioxidant include a phenol compound, a phosphite ester compound, and a thioether compound. As the phenol compound, any phenol compound which is known as a phenol-based antioxidant can be used. Preferred examples of the phenol compound include a hindered phenol compound. A compound having a substituent at a site (ortho position) adjacent to a phenolic hydroxy group is preferable. As the substituent, a substituted or unsubstituted alkyl group having 1 to 22 carbon atoms is preferable. In addition, as the antioxidant, a compound having a phenol group and a phosphite ester group in the same molecule is also preferable. In addition, as the antioxidant, a phosphorus antioxidant can also be suitably used. Examples of the phosphorus antioxidant include tris[2-[2,4,8,10-tetrakis(1,1-dimethylethyl) dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-di-tert-butyl-6-methylphenyl) phosphite. Examples of a commercially available product of the antioxidant include ADK STAB AO-20, ADK STAB AO-30, ADK STAB AO-40, ADK STAB AO-50, ADK STAB AO-50F, ADK STAB AO-60, ADK STAB AO-60G, ADK STAB AO-80, and ADK STAB AO-330 (all of which are manufactured by ADEKA Corporation). In addition, as the antioxidant, compounds described in paragraphs 0023 to 0048 of JP6268967B, compounds described in KR10-2019-0059371A, and the like can also be used.

The content of the antioxidant in the total solid content of the curable composition is preferably 0.01 mass % to 20 mass % and more preferably 0.3 mass % to 15 mass %. The antioxidant may be used singly or in combination of two or more kinds thereof. In a case where two or more kinds thereof are used, it is preferable that the total amount thereof is within the above-described range.

<Other Components>

Optionally, the curable composition according to the embodiment of the present disclosure may further contain a sensitizer, a curing accelerator, a filler, a thermal curing accelerator, a plasticizer, and other auxiliary agents (for example, conductive particles, an antifoaming agent, a flame retardant, a leveling agent, a peeling accelerator, an aromatic chemical, a surface tension adjuster, or a chain transfer agent). By appropriately containing these components, properties such as film properties can be adjusted. The details of the components can be found in, for example, paragraphs 0183 and later of JP2012-003225A (corresponding to paragraph 0237 of US2013/0034812A) and paragraphs 0101 to 0104 and 0107 to 0109 of JP2008-250074A, the contents of which are incorporated herein by reference.

In addition, optionally, the curable composition according to the embodiment of the present disclosure may contain a potential antioxidant. Examples of the potential antioxidant include a compound in which a site functioning as an antioxidant is protected by a protective group, and the protective group is eliminated by heating the compound at 100° C. to 250° C. or heating the compound at 80° C. to 200° C. in the presence of an acid or base catalyst so that the compound functions as an antioxidant. Examples of the potential antioxidant include the compounds described in WO2014/021023A, WO2017/030005A, and JP2017-008219A. Examples of a commercially available product thereof include ADEKA ARKLS GPA-5001 (manufactured by ADEKA Corporation).

In addition, in order to adjust the refractive index of a film to be obtained, the curable composition according to the embodiment of the present disclosure may contain a metal oxide. Examples of the metal oxide include $TiO_2$, $ZrO_2$, $Al_2O_3$, and $SiO_2$. The primary particle diameter of the metal oxide is preferably 1 nm to 100 nm, more preferably 3 nm to 70 nm, and most preferably 5 nm to 50 nm. The metal oxide may have a core-shell structure, and in this case, the core portion may be hollow.

In addition, the curable composition according to the embodiment of the present disclosure may include a light-resistance improver.

For example, in a case where a film is formed by application, the viscosity (25° C.) of the curable composition according to the embodiment of the present disclosure is preferably 1 mPa·s to 100 mPa·s. The lower limit is more preferably 2 mPa·s or more and still more preferably 3 mPa·s or more. The upper limit is more preferably 50 mPa·s or less, still more preferably 30 mPa·s or less, and particularly preferably 15 mPa·s or less.

In the curable composition according to the embodiment of the present disclosure, the content of liberate metal which is not bonded to or coordinated with a pigment or the like is preferably 100 ppm or less, more preferably 50 ppm or less, and still more preferably 10 ppm or less, it is particularly preferable to not contain the liberate metal substantially. According to this aspect, effects such as stabilization of pigment dispersibility (restraint of aggregation), improvement of spectral characteristics due to improved dispersibility, restraint of conductivity fluctuation due to stabilization of curable components or elution of metal atoms and metal ions, and improvement of display characteristics can be expected.

It is also preferable that the curable composition according to the embodiment of the present disclosure does not substantially include terephthalic acid ester. Here, the "does not substantially include" means that the content of terephthalic acid ester is 1,000 mass ppb or less in the total mass of the curable composition, and it is more preferable to be 100 mass ppb or less and particularly preferable to be 0.

The moisture content of the curable composition in the present disclosure is preferably 3 mass % or less, more preferably 0.01 mass % to 1.5 mass %, and particularly preferably 0.1 mass % to 1.0 mass %. The moisture content can be measured by a Karl Fischer method.

<Storage Container>

A storage container of the curable composition according to the embodiment of the present disclosure is not particularly limited, and a known storage container can be used. In addition, as the storage container, it is also preferable to use a multilayer bottle having a container interior wall constituted with six layers from six kinds of resins or a bottle having a 7-layer structure from 6 kinds of resins for the purpose of suppressing infiltration of impurities into raw materials or curable compositions. Examples of such a container include the containers described in JP2015-123351A.

In addition, for the curable composition according to the embodiment of the present disclosure or a composition used for manufacturing an image sensor, for the purpose of preventing metal elution from the container interior wall, improving storage stability of the composition, and suppressing the alteration of components, it is also preferable that the interior wall of the storage container is formed of glass, stainless steel, or the like.

<Method for Producing Curable Composition>

The curable composition according to the embodiment of the present disclosure can be produced by mixing the above-described components. During the production of the curable composition, all the components may be dissolved and/or dispersed in a solvent at the same time to produce the curable composition. Optionally, two or more solutions or dispersion liquids in which the respective components are appropriately blended may be prepared, and the solutions or dispersion liquids may be mixed with each other during use (during application) to produce the curable composition.

In addition, in the production of the curable composition, a process of dispersing the pigment is preferably included. In the process for dispersing the pigment, examples of a mechanical force which is used for dispersing the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. In addition, in the pulverization of the pigment in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment.

During the production of the curable composition, it is preferable that the curable composition is filtered through a filter, for example, in order to remove foreign matters or to reduce defects. As the filter, any filters that have been used in the related art for filtration use and the like may be used without particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including a high-density polypropylene) and nylon are preferable.

The pore size of the filter is preferably 0.01 µm to 7.0 µm, more preferably 0.01 µm to 3.0 µm, and still more preferably 0.05 µm to 0.5 µm. In a case where the pore size of the filter is within the above-described range, fine foreign matters can be reliably removed. With regard to the pore size value of the filter, reference can be made to a nominal value of filter manufacturers. As the filter, various filters provided by Nihon Pall Corporation (DFA4201NIEY and the like), Advantec Toyo Kaisha., Ltd., Nihon Entegris G.K. (formerly Nippon Microlith Co., Ltd.), Kitz Microfilter Corporation, and the like can be used.

In addition, it is preferable that a fibrous filter material is used as the filter. Examples of the fibrous filter material include a polypropylene fiber, a nylon fiber, and a glass fiber. Examples of a commercially available product include SBP type series (SBP008 and the like), TPR type series (TPR002, TPR005, and the like), or SHPX type series (SHPX003 and the like), all manufactured by Roki Techno Co., Ltd.

In a case of using a filter, different filters (for example, a first filter, a second filter, and the like) may be combined. In this case, the filtration with each of the filters may be performed once or may be performed twice or more times. In addition, filters having different pore sizes within the above-described range may be combined. In addition, the filtration through the first filter may be performed with only a dispersion liquid, the other components may be mixed therewith, and then the filtration through the second filter may be performed.

(Cured Product)

The cured product according to the embodiment of the present disclosure is a cured product obtained by curing the curable composition according to the embodiment of the present disclosure.

The cured product according to the embodiment of the present disclosure can be suitably used in a color filter or the like. Specifically, the cured product according to the embodiment of the present invention can be preferably used as a colored layer (pixel) of a color filter.

The cured product according to the embodiment of the present disclosure is preferably a film-like cured product (cured film), and the film thickness thereof can be appropriately adjusted depending on the purposes. For example, the film thickness is preferably 20 µm or less, more preferably 10 µm or less, and still more preferably 5 µm or less. The lower limit of the film thickness is preferably 0.1 µm or more, more preferably 0.2 µm or more, and still more preferably 0.3 µm or more.

(Color Filter)

Next, the color filter according to an embodiment of the present disclosure will be described.

The color filter according to the embodiment of the present disclosure has the cured product according to the embodiment of the present disclosure, and it is preferable to have the cured product according to the embodiment of the present disclosure as a pixel of the color filter. The color filter according to the embodiment of the present disclosure can be used for a solid-state imaging element such as a charge coupled device (CCD) and a complementary metal-oxide semiconductor (CMOS), an image display device, or the like.

The above-described pixel of the color filter is not particularly limited, and examples thereof include a red pixel, a green pixel, a blue pixel, a cyan pixel, a yellow pixel, and a magenta pixel.

In the color filter according to the embodiment of the present disclosure, the thickness of a film consisting of the cured product according to the embodiment of the present disclosure can be appropriately adjusted depending on the purposes. The film thickness is preferably 20 µm or less, more preferably 10 µm or less, and still more preferably 5 µm or less. The lower limit of the film thickness is preferably 0.1 µm or more, more preferably 0.2 µm or more, and still more preferably 0.3 µm or more.

In the color filter according to the embodiment of the present disclosure, the width of the pixel is preferably 0.5 µm to 20.0 µm. The lower limit is preferably 1.0 µm or more and more preferably 2.0 µm or more. The upper limit is preferably 15.0 µm or less and more preferably 10.0 µm or less. In addition, the Young's modulus of the pixel is preferably 0.5 GPa to 20 GPa and more preferably 2.5 GPa to 15 GPa.

Each pixel included in the color filter according to the embodiment of the present disclosure preferably has high flatness. Specifically, the surface roughness Ra of the pixel is preferably 100 nm or less, more preferably 40 nm or less, and still more preferably 15 nm or less. The lower limit is not specified, but is preferably, for example, 0.1 nm or more. The surface roughness of the pixel can be measured, for example, using an atomic force microscope (AFM) Dimension 3100 manufactured by Veeco Instruments, Inc. In addition, the contact angle of water on the pixel can be appropriately set to a preferred value and is typically in the range of 50° to 110°. The contact angle can be measured, for example, using a contact angle meter CV-DT-A Model (manufactured by Kyowa Interface Science Co., Ltd.). In addition, it is preferable that the volume resistivity value of the pixel is high. Specifically, the volume resistivity value of the pixel is preferably $10^9$ Ω×cm or more and more preferably $10^{11}$ Ω×cm or more. The upper limit is not specified, but is, for example, preferably $10^{14}$ Ω×cm or less. The volume resistivity value of the pixel can be measured, for example, using an ultra-high resistance meter 5410 (manufactured by Advantest Corporation).

In addition, the pixel obtained by curing the curable composition according to the embodiment of the present disclosure can also be suitably used in a pixel configuration described in WO2019/102887A.

In addition, in the color filter according to the embodiment of the present disclosure, a protective layer may be provided on a surface of the cured product according to the embodiment of the present disclosure. By providing the protective layer, various functions such as oxygen shielding, low reflection, hydrophilicity/hydrophobicity, and shielding of light (ultraviolet rays, near-infrared rays, and the like) having a specific wavelength can be imparted. The thickness of the protective layer is preferably 0.01 µm to 10 µm and more preferably 0.1 µm to 5 µm. Examples of a method for forming the protective layer include a method of forming the protective layer by applying a resin composition dissolved in an organic solvent, a chemical vapor deposition method, and a method of attaching a molded resin with an adhesive. Examples of components constituting the protective layer include a (meth)acrylic resin, an ene-thiol resin, a polycarbonate resin, a polyether resin, a polyarylate resin, a polysulfone resin, a polyethersulfone resin, a polyphenylene ether resin, a polyarylene ether phosphine oxide resin, a polyimide resin, a polyamidoimide resin, a polyolefin resin, a cyclic olefin resin, a polyester resin, a styrene resin, a polyol resin, a polyvinylidene chloride resin, a melamine resin, a urethane resin, an aramid resin, a polyamide resin, an alkyd resin, an epoxy resin, a modified silicone resin, a fluororesin, a polycarbonate resin, a polyacrylonitrile resin, a cellulose resin, Si, C, W, $Al_2O_3$, Mo, $SiO_2$, and $Si_3N_4$, and two or more kinds of these components may be contained. For example, in a case of a protective layer for oxygen shielding, it is preferable that the protective layer contains a polyol resin, $SiO_2$, and $Si_3N_4$. In addition, in a case of a protective layer for low reflection, it is preferable that the protective layer contains a (meth)acrylic resin and a fluororesin.

In a case of forming the protective layer by applying a resin composition, as a method for applying the resin composition, a known method such as a spin coating method, a casting method, a screen printing method, and an ink jet method can be used. As the organic solvent included in the resin composition, a known organic solvent (for example, propylene glycol 1-monomethylether-2-acetate, cyclopentanone, ethyl lactate, and the like) can be used. In a case of forming the protective layer by a chemical vapor deposition method, as the chemical vapor deposition method, a known chemical vapor deposition method (thermochemical vapor deposition method, plasma chemical vapor deposition method, and photochemical vapor deposition method) can be used.

The protective layer may contain, as desired, an additive such as organic or inorganic particles, an absorber of a specific wavelength (for example, ultraviolet rays, near-infrared rays, and the like), a refractive index adjusting agent, an antioxidant, an adhesive agent, and a surfactant. Examples of the organic or inorganic particles include polymer fine particles (for example, silicone resin particles, polystyrene particles, and melamine resin particles), titanium oxide, zinc oxide, zirconium oxide, indium oxide, aluminum oxide, titanium nitride, titanium oxynitride, magnesium fluoride, hollow silica, silica, calcium carbonate, and barium sulfate. As the absorber of a specific wavelength, a known absorber can be used. Examples of the ultraviolet absorber and near-infrared absorber include the above-described materials. The content of these additives can be appropriately adjusted, but is preferably 0.1 mass % to 70 mass % and more preferably 1 mass % to 60 mass % with respect to the total weight of the protective layer.

In addition, as the protective layer, the protective layers described in paragraphs 0073 to 0092 of JP2017-151176A can also be used.

The color filter may have a base layer. The base layer can be formed, for example, of a composition obtained by removing the colorant from the above-described curable composition according to the embodiment of the present disclosure, and the composition forming the base layer preferably includes at least one selected from the group consisting of the above-described binder polymer, surfactant, and curable compound.

Further, a surface contact angle of the base layer in the color filter, preferably in a color filter having red, green, and blue (RGB) pixels, is preferably 20° to 70° in a case of being measured with diiodomethane, and preferably 30° to 80° in a case of being measured with water. Within the above-described range of contact angle, coating properties in a case of forming the color filter are appropriate, and application properties of the composition forming the base layer are also excellent. In order to set the contact angle within the above-described range, a method such as addition of a surfactant can be mentioned.

<Method for Manufacturing Color Filter>

Next, a method for manufacturing the color filter according to the embodiment of the present disclosure will be described.

The color filter according to the embodiment of the present disclosure can be suitably manufactured through a step of forming a curable composition layer on a support using the curable composition according to the embodiment of the present disclosure, and a step of forming a pattern on the curable composition layer by a photolithography method or a dry etching method.

—Photolithography Method—

First, a case of forming a pattern by a photolithography method to manufacture a color filter will be described.

Pattern formation by a photolithography method preferably includes a step of forming a curable composition layer on a support using the curable composition according to the embodiment of the present disclosure, a step of exposing the curable composition layer in a patterned manner, and a step of removing a non-exposed portion of the curable composition layer by development to form a pattern (pixel). A step (pre-baking step) of baking the curable composition layer and a step (post-baking step) of baking the developed pattern (pixel) may be provided, as desired.

In the step of forming a curable composition layer, a coloring composition layer is formed on a support using the curable composition according to the embodiment of the present disclosure. The support is not particularly limited, and can be appropriately selected depending on applications. Examples thereof include a glass substrate and a silicon substrate, and a silicon substrate is preferable. In addition, a charge coupled device (CCD), a complementary metal-oxide semiconductor (CMOS), a transparent conductive film, or the like may be formed on the silicon substrate. In some cases, a black matrix for isolating each pixel is formed on the silicon substrate. In addition, an undercoat layer may be provided on the silicon substrate so as to improve adhesiveness to an upper layer, prevent the diffusion of materials, or planarize the surface of the substrate.

As a method for applying the curable composition, a known method can be used. Examples thereof include a dropping method (drop casting); a slit coating method; a spray method; a roll coating method; a spin coating method (spin coating); a cast coating method; a slit and spin method; a pre-wet method (for example, a method described in JP2009-145395A), various printing methods such as an ink jet (for example, on-demand type, piezo type, thermal type), a discharge printing such as nozzle jet, a flexo printing, a screen printing, a gravure printing, a reverse offset printing, and a metal mask printing; a transfer method using molds and the like; and a nanoimprinting method. A method for applying the ink jet is not particularly limited, and examples thereof include a method described in "Extension of Use of Ink Jet—Infinite Possibilities in Patent—" (February 2005, S. B. Research Co., Ltd.) (particularly pp. 115 to 133) and methods described in JP2003-262716A, JP2003-185831A, JP2003-261827A, JP2012-126830A, and JP2006-169325A. In addition, with regard to the method for applying the curable composition, reference can be made to the description in WO2017/030174A and WO2017/018419A, the contents of which are incorporated herein by reference.

The curable composition layer formed on the support may be dried (pre-baked). In a case of producing a film by a low-temperature process, pre-baking may not be performed. In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. The pre-baking time is preferably 10 seconds to 300 seconds, more preferably 40 seconds to 250 seconds, and still more preferably 80 seconds to 220 seconds. The pre-baking can be performed using a hot plate, an oven, or the like.

<<Exposing Step>>

Next, the curable composition layer is exposed in a patterned manner (exposing step). For example, the curable composition layer can be exposed in a patterned manner using a stepper exposure device or a scanner exposure device through a mask having a predetermined mask pattern. Thus, the exposed portion can be cured.

Examples of the radiation (light) which can be used during the exposure include g-rays and i-rays. In addition, light (preferably light having a wavelength of 180 nm to 300 nm) having a wavelength of 300 nm or less can be used. Examples of the light having a wavelength of 300 nm or less include KrF-rays (wavelength: 248 nm) and ArF-rays (wavelength: 193 nm), and KrF-rays (wavelength: 248 nm) are preferable. In addition, a long-wave light source of 300 nm or more can be used.

The irradiation amount (exposure amount) is, for example, preferably 0.03 J/cm$^2$ to 2.5 J/cm$^2$ and more preferably 0.05 J/cm$^2$ to 1.0 J/cm$^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. In addition, the exposure illuminance can be appropriately set, and can be preferably selected from a range of 1,000 W/m$^2$ to 100,000 W/m$^2$ (for example, 5,000 W/m$^2$, 15,000 W/m$^2$, or 35,000 W/m$^2$). Appropriate conditions of each of the oxygen concentration and the exposure illuminance may be combined, and for example, a combination of the oxygen concentration of 10% by volume and the illuminance of 10,000 W/m$^2$, a combination of the oxygen concentration of 35% by volume and the illuminance of 20,000 W/m$^2$, or the like is available.

Next, the non-exposed portion of the curable composition layer is removed by development to form a pattern (pixel). The non-exposed portion of the curable composition layer can be removed by development using a developer. Thus, the curable composition layer of the non-exposed portion in the exposing step is eluted into the developer, and as a result, only a photocured portion remains. As the developer, an organic alkali developer causing no damage on a base of element, circuit, or the like is desirable. The temperature of the developer is preferably, for example, 20° C. to 30° C. The development time is preferably 20 seconds to 180 seconds. In addition, in order to improve residue removing properties, a step of removing the developer by shaking off per 60 seconds and supplying a fresh developer may be repeated multiple times.

As the developer, an aqueous alkaline solution (alkali developer) obtained by diluting an alkali agent with pure water is preferable. Examples of the alkali agent include organic alkaline compounds such as ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, cthyltrimethylammonium hydroxide, benzyltrimethylammonium hydroxide, dimethylbis(2-hydroxyethyl) ammonium hydroxide, choline, pyrrole, piperidine, and 1,8-diazabicyclo[5.4.0]-7-undecene, and inorganic alkaline compounds such as sodium hydroxide, potassium hydroxide, sodium carbonate, sodium hydrogen carbonate, sodium silicate, and sodium metasilicate. In consideration of environmental aspects and safety aspects, the alkali agent is preferably a compound having a high molecular weight. The concentration of the alkali agent in the aqueous alkaline solution is preferably 0.001 to 10 mass % and more preferably 0.01 to 1 mass %. In addition, the developer may further contain a surfactant. Examples of the surfactant include the surfactants described above, and the surfactant is preferably a nonionic surfactant.

After the development, it is preferable to carry out an additional exposure treatment or a heating treatment (post-baking) after carrying out drying. The additional exposure treatment or the post-baking is a curing treatment after development in order to complete curing. The heating temperature in the post-baking is preferably, for example, 100° C. to 240° C. and more preferably 200° C. to 240° C. The post-baking can be performed continuously or batchwise by using a heating unit such as a hot plate, a convection oven (hot-air circulation dryer), and a high-frequency heater so that the film after development satisfies the conditions. In a case of carrying out the additional exposure treatment, light used for the exposure is preferably light having a wavelength of 400 nm or less. In addition, the additional exposure treatment may be carried out by the method described in KR2017-0122130A.

—Dry Etching Method—

Next, a case of forming a pattern by a dry etching method to manufacture a color filter will be described. Pattern formation by a dry etching method preferably includes a step of forming a curable composition layer on a support using the curable composition according to the embodiment of the present disclosure and curing the entire curable composition layer to form a cured composition layer, a step of forming a photoresist layer on the cured composition layer, a step of exposing the photoresist layer in a patterned manner and then developing the photoresist layer to form a resist pattern, and a step of dry-etching the cured composition layer through this resist pattern as a mask and using an etching gas. It is preferable that pre-baking treatment is further performed in order to form the photoresist layer. In particular, as the forming process of the photoresist layer, it is desirable that a heating treatment after exposure and a heating treatment after development (post-baking treatment) are performed. The details of the pattern formation by the dry etching method can be found in paragraphs 0010 to 0067 of JP2013-064993A, the content of which is incorporated herein by reference.

<Solid-State Imaging Element>

It is preferable that the solid-state imaging element according to the embodiment of the present disclosure includes the cured product according to the embodiment of the present disclosure and has the color filter according to the embodiment of the present disclosure.

Examples of a preferred aspect of the solid-state imaging element according to the embodiment of the present disclosure include an aspect in which at least one pixel selected from the group consisting of a red pixel, a green pixel, and a blue pixel is the cured product according to the embodiment of the present disclosure (RGB pixels).

In addition, examples of another preferred aspect of the solid-state imaging element according to the embodiment of the present disclosure include an aspect in which at least one pixel selected from the group consisting of a cyan pixel, a yellow pixel, and a magenta pixel is the cured product according to the embodiment of the present disclosure (CMY pixels).

The configuration of the solid-state imaging element according to the embodiment of the present disclosure is not particularly limited as long as the solid-state imaging element is configured to include the cured product according to the embodiment of the present disclosure and functions as a solid-state imaging element. Examples of the configuration include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving section of the photodiodes on the photodiodes and the transfer electrodes; have a device-protective film formed of silicon nitride or the like, which is formed to coat the entire surface of the light-shielding film and the light receiving section of the photodiodes, on the light-shielding film; and have a color filter on the device-protective film. Further, the solid-state imaging element may also be configured, for example, such that it has a light collecting unit (for example, a microlens, which is the same hereinafter) on a device-protective film under a color filter (a side closer to the substrate), or has a light collecting unit on a color filter. In addition, the color filter may have a structure in which each colored pixel is embedded in a space partitioned in, for example, a lattice shape by a partition wall. The partition wall in this case preferably has a low refractive index for each colored pixel. Examples of an imaging device having such a structure include the devices described in JP2012-227478A, JP2014-179577A, and WO2018/043654A. An imaging device including the solid-state imaging element according to the embodiment of the present disclosure can also be used as a vehicle camera or a surveillance camera, in addition to a digital camera or electronic apparatus (mobile phones or the like) having an imaging function.

In addition, in the solid-state imaging element according to the embodiment of the present disclosure, by providing an ultraviolet absorbing layer (UV cut filter) in the structure of the solid-state imaging element, as described in JP2019-211559A, light resistance of the color filter may be improved.

(Image Display Device)

It is preferable that the image display device according to the embodiment of the present disclosure includes the cured product according to the embodiment of the present disclosure and has the color filter according to the embodiment of the present disclosure. Examples of the image display device include a liquid crystal display device or an organic electroluminescent display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd.)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device is not particularly limited, and examples thereof include various liquid crystal display devices described in "Liquid Crystal Display Technology for Next Generation".

EXAMPLES

Hereinafter, the present disclosure will be described in detail with reference to examples, but the present disclosure is not limited thereto.

In the examples, "%" and "parts" respectively indicate "mass %" and "parts by mass" unless otherwise specified. In a polymer compound, the molecular weight indicates the weight-average molecular weight (Mw) and the proportion of constitutional units indicates mole percentage unless otherwise specified.

In addition, the ethylenically unsaturated bonding value (C=C value) was measured by the method described above.

<Measurement of Weight-Average Molecular Weight (Mw)>

The weight-average molecular weight (Mw) of a resin was measured by gel permeation chromatography (GPC) according to the following conditions.

Types of columns: columns formed by connection of TSKgel Super HZM-H (manufactured by Tosoh Corporation), TSKgel Super HZ4000 (manufactured by Tosoh Corporation), and TSKgel Super HZ2000 (manufactured by Tosoh Corporation)

Developing solvent: tetrahydrofuran

Column temperature: 40° C.

Flow rate (amount of a sample to be injected): 1.0 µL (sample concentration: 0.1 mass %)

Device name: HLC-8220GPC manufactured by Tosoh Corporation

Detector: refractive index (RI) detector

Calibration curve base resin: polystyrene resin

<Method of Measuring Acid Value>

The acid value of a resin represents a mass of potassium hydroxide required to neutralize acidic components per 1 g of solid content of the sample. The acid value of the resin was measured as follows. That is, a measurement sample was dissolved in a mixed solvent of tetrahydrofuran/water=9/1 (mass ratio), and the obtained solution was subjected to neutralization titration with a 0.1 mol/L sodium hydroxide aqueous solution at 25° C. using a potentiometric titrator (trade name: AT-510, manufactured by KYOTO ELECTRONICS MANUFACTURING CO., LTD.). An inflection point of a titration pH curve was set as a titration end point, and the acid value was calculated from the following equation.

$$A = 56.11 \times Vs \times 0.5 \times f/w$$

A: acid value (mgKOH/g)

Vs: amount (mL) of the 0.1 mol/L sodium hydroxide aqueous solution used for the titration f: titer of the 0.1 mol/L sodium hydroxide aqueous solution w: mass (g) of the measurement sample (expressed in terms of solid contents)

<Production of Dispersion Liquid>

(Production of Dispersion Liquid G1)

230 parts by mass of zirconia beads having a diameter of 0.3 mm were added to a mixed solution obtained by mixing 8.75 parts by mass of C. I. Pigment Green 36 as a G pigment, 3.85 parts by mass of C. I. Pigment Yellow 185 as a Y pigment, 1.40 parts by mass of a derivative A1 as a pigment derivative, 18.7 parts by mass (equivalent to 5.61 parts by mass of solid content) of a dispersant 1 as a resin, and 67.3 parts by mass of propylene glycol monomethyl ether acetate as a solvent, the mixture was subjected to a dispersion treatment for 5 hours using a paint shaker, and the beads were separated by filtration to produce a dispersion liquid G1.

Derivative 1: compound having the following structure (in the following structural formula, Et represents an ethyl group)

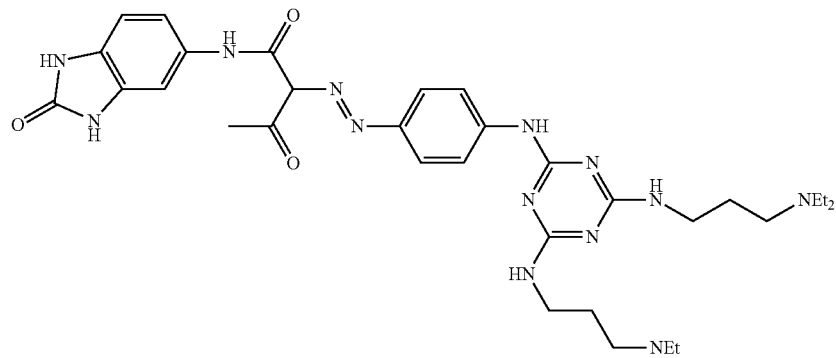

(Production of Dispersion Liquids G2 to G48, G81 to G83, and Comparative Dispersion Liquids G1 to G4)

Each dispersion liquid was produced in the same manner as in the dispersion liquid G1, except that the type and blending amount of the resin, and the type of the solvent were changed as shown in Tables 1 and 2 below.

(Production of Dispersion Liquids G49 to G62)

230 parts by mass of zirconia beads having a diameter of 0.3 mm were added to a mixed solution obtained by mixing the type of G pigment listed in Table 3 in an amount of parts by mass described in Table 3, the type of Y pigment listed in Table 3 in an amount of parts by mass described in Table 3, the type of pigment derivative listed in Table 3 in an amount of parts by mass described in Table 3, 18.7 parts by mass (equivalent to 5.61 parts by mass of solid content) of the above-described dispersant B4, and 67.3 parts by mass of propylene glycol monomethyl ether acetate as a solvent were mixed, the mixture was subjected to a dispersion treatment for 5 hours using a paint shaker, and the beads were separated by filtration to produce a dispersion liquid.

(Production of Dispersion Liquids R1 to R12, Y1, and comparative dispersion liquids R1 to R4)

230 parts by mass of zirconia beads having a diameter of 0.3 mm were added to a mixed solution obtained by mixing the type of pigment listed in Table 4 in an amount of parts by mass described in Table 4, the type of pigment derivative listed in Table 4 in an amount of parts by mass described in Table 4, the type of dispersant listed in Table 4 in an amount of parts by mass described in Table 4, and 60 parts by mass of propylene glycol monomethyl ether acetate as a solvent were mixed, the mixture was subjected to a dispersion treatment for 5 hours using a paint shaker, and the beads were separated by filtration to produce a dispersion liquid.

(Production of dispersion liquids BI to B6 and comparative dispersion liquids B1 to B4)

230 parts by mass of zirconia beads having a diameter of 0.3 mm were added to a mixed solution obtained by mixing the type of pigment listed in Table 5 in an amount of parts by mass described in Table 5, the derivative 4 in an amount of parts by mass described in Table 5, the type of dispersant listed in Table 5 in an amount of parts by mass described in Table 5, and 60 parts by mass of propylene glycol monomethyl ether acetate as a solvent were mixed, the mixture was subjected to a dispersion treatment for 5 hours using a paint shaker, and the beads were separated by filtration to produce a dispersion liquid.

TABLE 1

| Dispersion liquid | Resin | | | | | |
| --- | --- | --- | --- | --- | --- | --- |
| | Type | Content (part by mass) | C=C value (mmol/g) | Acid value (mgKOH/g) | Molecular weight Mw | Solvent |
| Dispersion liquid G1 | Dispersant A1 | 18.7 | 0.22 | 36.5 | 8,000 | PGEMA |
| Dispersion liquid G2 | Dispersant A1 | 18.7 | 0.22 | 36.5 | 8,000 | PGME |
| Dispersion liquid G3 | Dispersant A1 | 18.7 | 0.22 | 36.5 | 8,000 | Cyclohexanone |
| Dispersion liquid G4 | Dispersant A2 | 18.7 | 0.22 | 36.5 | 12,000 | PGEMA |
| Dispersion liquid G5 | Dispersant A3 | 18.7 | 0.22 | 36.5 | 18,000 | PGEMA |
| Dispersion liquid G6 | Dispersant A4 | 18.7 | 0.51 | 39.9 | 8,000 | PGEMA |
| Dispersion liquid G7 | Dispersant A5 | 18.7 | 0.21 | 71.8 | 8,000 | PGEMA |
| Dispersion liquid G8 | Dispersant A6 | 18.7 | 0.48 | 81.0 | 8,000 | PGEMA |
| Dispersion liquid G9 | Dispersant A7 | 18.7 | 0.20 | 36.8 | 8,200 | PGEMA |
| Dispersion liquid G10 | Dispersant A8 | 18.7 | 0.24 | 33.8 | 8,000 | PGEMA |
| Dispersion liquid G11 | Dispersant A9 | 18.7 | 0.28 | 32.0 | 8,000 | PGEMA |
| Dispersion liquid G12 | Dispersant A10 | 18.7 | 0.14 | 39.3 | 8,200 | PGEMA |
| Dispersion liquid G13 | Dispersant A11 | 18.7 | 0.21 | 41.6 | 8,400 | PGEMA |
| Dispersion liquid G14 | Dispersant A12 | 18.7 | 0.22 | 35.3 | 8,000 | PGEMA |
| Dispersion liquid G15 | Dispersant A13 | 18.7 | 0.21 | 37.0 | 8,000 | PGEMA |
| Dispersion liquid G16 | Dispersant A14 | 18.7 | 0.22 | 35.2 | 8,000 | PGEMA |
| Dispersion liquid G17 | Dispersant A15 | 18.7 | 0.21 | 36.8 | 9,000 | PGEMA |
| Dispersion liquid G18 | Dispersant A16 | 18.7 | 0.21 | 35.7 | 7500 | PGEMA |
| Dispersion liquid G19 | Dispersant A17 | 18.7 | 0.22 | 37.5 | 8000 | PGEMA |
| Dispersion liquid G20 | Dispersant A18 | 18.7 | 0.22 | 35.2 | 8000 | PGEMA |

TABLE 1-continued

| Dispersion liquid | Type | Resin Content (part by mass) | C=C value (mmol/g) | Acid value (mgKOH/g) | Molecular weight Mw | Solvent |
|---|---|---|---|---|---|---|
| Dispersion liquid G21 | Dispersant A19 | 18.7 | 0.22 | 35.2 | 8000 | PGEMA |
| Dispersion liquid G22 | Dispersant A20 | 18.7 | 0.22 | 35.2 | 8000 | PGEMA |

TABLE 2

| Dispersion liquid | Type | Resin Content (part by mass) | C=C value (mmol/g) | Acid value (mgKOH/g) | Molecular weight Mw | Solvent |
|---|---|---|---|---|---|---|
| Dispersion liquid G23 | Dispersant B1 | 18.7 | 0.19 | 48.7 | 8,000 | PGMEA |
| Dispersion liquid G24 | Dispersant B2 | 18.7 | 0.19 | 48.7 | 12,000 | PGMEA |
| Dispersion liquid G25 | Dispersant B3 | 18.7 | 0.19 | 48.7 | 18,000 | PGMEA |
| Dispersion liquid G26 | Dispersant B4 | 18.7 | 0.51 | 48.7 | 8,000 | PGMEA |
| Dispersion liquid G27 | Dispersant B5 | 18.7 | 0.80 | 46.0 | 8,000 | PGMEA |
| Dispersion liquid G28 | Dispersant B6 | 18.7 | 0.20 | 73.4 | 8,000 | PGMEA |
| Dispersion liquid G29 | Dispersant B7 | 18.7 | 0.20 | 85.0 | 8,000 | PGMEA |
| Dispersion liquid G30 | Dispersant B8 | 18.7 | 1.20 | 80.0 | 7,500 | PGMEA |
| Dispersion liquid G31 | Dispersant B9 | 18.7 | 0.20 | 48.0 | 8,500 | PGMEA |
| Dispersion liquid G32 | Dispersant B10 | 18.7 | 0.20 | 46.7 | 8,500 | PGMEA |
| Dispersion liquid G33 | Dispersant B11 | 18.7 | 0.20 | 46.5 | 8,500 | PGMEA |
| Dispersion liquid G34 | Dispersant B12 | 18.7 | 0.20 | 45.8 | 8,700 | PGMEA |
| Dispersion liquid G35 | Dispersant B13 | 18.7 | 0.21 | 47.4 | 8,700 | PGMEA |
| Dispersion liquid G36 | Dispersant B14 | 18.7 | 0.20 | 47.2 | 8,800 | PGMEA |
| Dispersion liquid G37 | Dispersant B15 | 18.7 | 0.20 | 46.9 | 8,000 | PGMEA |
| Dispersion liquid G38 | Dispersant B16 | 18.7 | 0.19 | 47.4 | 8,000 | PGMEA |
| Dispersion liquid G39 | Dispersant B17 | 18.7 | 0.19 | 47.4 | 8,000 | PGMEA |
| Dispersion liquid G40 | Dispersant B18 | 18.7 | 0.19 | 48.8 | 9,000 | PGMEA |
| Dispersion liquid G41 | Dispersant B19 | 18.7 | 0.19 | 47.5 | 7,500 | PGMEA |
| Dispersion liquid G42 | Dispersant B20 | 18.7 | 0.20 | 50.0 | 8,000 | PGMEA |
| Dispersion liquid G43 | Dispersant B21 | 18.7 | 0.19 | 47.4 | 8,000 | PGMEA |
| Dispersion liquid G44 | Dispersant B22 | 18.7 | 0.19 | 47.4 | 8,000 | PGMEA |
| Dispersion liquid G45 | Dispersant B23 | 18.7 | 0.21 | 46.5 | 8,000 | PGMEA |
| Dispersion liquid G46 | Dispersant C1 | 18.7 | 0.33 | 40.0 | 8,000 | PGMEA |
| Dispersion liquid G47 | Dispersant C2 | 18.7 | 0.49 | 32.0 | 8,500 | PGMEA |
| Dispersion liquid G48 | Dispersant C3 | 18.7 | 0.40 | 38.0 | 8,500 | PGMEA |
| Comparative dispersion liquid G1 | Comparative dispersant 1 | 18.7 | 0 | 41.0 | 8,000 | PGMEA |
| Comparative dispersion liquid G2 | Comparative dispersant 2 | 18.7 | 0.30 | 66.0 | 10,000 | PGMEA |
| Comparative dispersion liquid G3 | Comparative dispersant 3 | 18.7 | 1.00 | 26.0 | 12,000 | PGMEA |
| Comparative dispersion liquid G4 | Comparative dispersant 4 | 18.7 | 0.20 | 118.0 | 7,000 | PGMEA |
| Dispersion liquid G81 | Dispersant B1 | 16.3 | 0.19 | 48.7 | 8,000 | PGMEA |
| Dispersion liquid G82 | Dispersant B1 | 14.0 | 0.19 | 48.7 | 8,000 | PGMEA |
| Dispersion liquid G83 | Dispersant B1 | 23.3 | 0.19 | 48.7 | 8,000 | PGMEA |

TABLE 3

| | G PIGMENT | | | | | | Y pigment | | | Pigment derivative | | | |
|---|---|---|---|---|---|---|---|---|---|---|---|---|---|
| | PG36 | PG58 | PG7 | PG59 | PG62 | PG63 | PY139 | PY150 | PY185 | Derivative 1 | Derivative 4 | Derivative 5 | Resin |
| Dispersion liquid G49 | 8.75 | — | — | — | — | — | 3.85 | — | — | 1.4 | — | — | Dispersant B4 |
| Dispersion liquid G50 | 8.75 | — | — | — | — | — | — | 3.85 | — | 1.4 | — | — | Dispersant B4 |
| Dispersion liquid G51 | 8.75 | — | — | — | — | — | — | — | 3.85 | — | 1.4 | — | Dispersant B4 |
| Dispersion liquid G52 | 8.75 | — | — | — | — | — | — | — | 3.85 | — | — | 1.4 | Dispersant B4 |
| Dispersion liquid G53 | — | 8.75 | — | — | — | — | 3.85 | — | — | 1.4 | — | — | Dispersant B4 |
| Dispersion liquid G54 | — | 8.75 | — | — | — | — | — | 3.85 | — | 1.4 | — | — | Dispersant B4 |
| Dispersion liquid G55 | — | 8.75 | — | — | — | — | — | — | 3.85 | 1.4 | — | — | Dispersant B4 |

TABLE 3-continued

| | G PIGMENT | | | | | | Y pigment | | | Pigment derivative | | | |
|---|---|---|---|---|---|---|---|---|---|---|---|---|---|
| | | | | | | | | | | Derivative | Derivative | Derivative | |
| | PG36 | PG58 | PG7 | PG59 | PG62 | PG63 | PY139 | PY150 | PY185 | 1 | 4 | 5 | Resin |
| Dispersion liquid G56 | — | — | 8.75 | — | — | — | — | — | 3.85 | 1.4 | — | — | Dispersant B4 |
| Dispersion liquid G57 | — | — | — | 8.75 | — | — | — | — | 3.85 | 1.4 | — | — | Dispersant B4 |
| Dispersion liquid G58 | — | — | — | — | 8.75 | — | — | — | 3.85 | 1.4 | — | — | Dispersant B4 |
| Dispersion liquid G59 | — | — | — | — | — | 8.75 | — | — | 3.85 | 1.4 | — | — | Dispersant B4 |
| Dispersion liquid G60 | 4.65 | 4.15 | — | — | — | — | — | — | 3.85 | 1.4 | — | — | Dispersant B4 |
| Dispersion liquid G61 | 8.75 | — | — | — | — | — | — | 1.3 | 2.55 | 1.4 | — | — | Dispersant B4 |
| Dispersion liquid G62 | 4.65 | 4.15 | — | — | — | — | 0.65 | 0.65 | 2.55 | 1.4 | — | — | Dispersant B4 |

TABLE 4

| | Pigment | | | | | | | Pigment derivative | | | Resin | Added amount (part by mass) | Solvent PGMEA |
|---|---|---|---|---|---|---|---|---|---|---|---|---|---|
| | PR254 | PR264 | PR272 | PR122 | PY139 | PY150 | PO71 | Derivative 1 | Derivative 2 | Derivative 3 | Type | | |
| Dispersion liquid R1 | 9 | — | — | — | 4.5 | — | — | 1.5 | — | — | Dispersant A1 | 25 | 60 |
| Dispersion liquid R2 | 9 | — | — | — | 4.5 | — | — | 1.5 | — | — | Dispersant A4 | 25 | 60 |
| Dispersion liquid R3 | 9 | — | — | — | 4.5 | — | — | 1.5 | — | — | Dispersant A14 | 25 | 60 |
| Dispersion liquid R4 | 9 | — | — | — | 4.5 | — | — | 1.5 | — | — | Dispersant B1 | 25 | 60 |
| Dispersion liquid R5 | 9 | — | — | — | 4.5 | — | — | 1.5 | — | — | Dispersant B4 | 25 | 60 |
| Dispersion liquid R6 | 9 | — | — | — | 4.5 | — | — | 1.5 | — | — | Dispersant B17 | 25 | 60 |
| Dispersion liquid R7 | 9 | — | — | — | 3 | — | 1.5 | 1.5 | — | — | Dispersant B4 | 25 | 60 |
| Dispersion liquid R8 | — | — | 10 | — | 3.5 | — | — | — | 1.5 | — | Dispersant B4 | 25 | 60 |
| Dispersion liquid R9 | — | — | — | 13.5 | — | — | — | — | — | 1.5 | Dispersant A | 25 | 60 |
| Dispersion liquid R10 | 14 | — | — | — | — | — | — | — | 1 | — | Dispersant B4 | 25 | 60 |
| Dispersion liquid R11 | — | 9 | — | — | 4.5 | — | — | 1.5 | — | — | Dispersant B4 | 25 | 60 |
| Dispersion liquid R12 | 9 | — | — | — | 4.5 | — | — | 1.5 | — | — | Dispersant B4 | 25 | 60 |
| Dispersion liquidY1 | — | — | — | — | — | 13.5 | — | 1.5 | — | — | Dispersant B4 | 25 | 60 |
| Comparative dispersion liquid R1 | 9 | — | — | — | 4.5 | — | — | 1.5 | — | — | Comparative dispersant 1 | 25 | 60 |

TABLE 4-continued

| | Pigment | | | | | | | Pigment derivative | | | Resin | | Solvent |
|---|---|---|---|---|---|---|---|---|---|---|---|---|---|
| | PR254 | PR264 | PR272 | PR122 | PY139 | PY150 | PO71 | Derivative 1 | Derivative 2 | Derivative 3 | Type | Added amount (part by mass) | PGMEA |
| Comparative dispersion liquid R2 | 9 | — | — | — | 4.5 | — | — | 1.5 | — | — | Comparative dispersant 2 | 25 | 60 |
| Comparative dispersion liquid R3 | 9 | — | — | — | 4.5 | — | — | 1.5 | — | — | Comparative dispersant 3 | 25 | 60 |
| Comparative dispersion liquid R4 | 9 | — | — | — | 4.5 | — | — | 1.5 | — | — | Comparative dispersant 4 | 25 | 60 |

TABLE 5

| | Pigment | | Pigment derivative | Resin | | Solvent |
|---|---|---|---|---|---|---|
| | PB15:6 | PV23 | Derivative 4 | Type | Added amount (part by mass) | PGMEA |
| Dispersion liquid B1 | 9 | 4.5 | 1.5 | Dispersant A1 | 25 | 60 |
| Dispersion liquid B2 | 9 | 4.5 | 1.5 | Dispersant A4 | 25 | 60 |
| Dispersion liquid B3 | 9 | 4.5 | 1.5 | Dispersant A14 | 25 | 60 |
| Dispersion liquid B4 | 9 | 4.5 | 1.5 | Dispersant B1 | 25 | 60 |
| Dispersion liquid B5 | 9 | 4.5 | 1.5 | Dispersant B4 | 25 | 60 |
| Dispersion liquid B6 | 9 | 4.5 | 1.5 | Dispersant B17 | 25 | 60 |
| Comparative dispersion liquid B1 | 9 | 4.5 | 1.5 | Comparative dispersant 1 | 25 | 60 |
| Comparative dispersion liquid B2 | 9 | 4.5 | 1.5 | Comparative dispersant 2 | 25 | 60 |
| Comparative dispersion liquid B3 | 9 | 4.5 | 1.5 | Comparative dispersant 3 | 25 | 60 |
| Comparative dispersion liquid B4 | 9 | 4.5 | 1.5 | Comparative dispersant 4 | 25 | 60 |

The raw materials indicated by abbreviations shown in Tables 1 to 5 are as follows.

<Resin>

Dispersants A1 to A20, B1 to B23, C1 to C3:30 mass % PGMEA solution of the above-described dispersants A1 to A20, B1 to B23, and C1 to C3

Comparative dispersants 1 to 4: dispersants synthesized by the methods shown below <Production Method of Comparative Dispersant 1>

75 parts by mass of methyl methacrylate, 75 parts by mass of n-butyl acrylate, and 68.1 parts by mass of propylene glycol monomethyl ether acetate (PGMEA) were charged into a reaction container equipped with gas inlet pipe, thermometer, condenser, and stirrer, and the inside of the reaction container was replaced with nitrogen gas. The inside of the reaction container was heated to 70° C., 9 parts by mass of 3-mercapto-1,2-propanediol was added thereto, 0.18 parts by mass of azobisisobutyronitrile (AIBN) was further added thereto, and the mixture was reacted for 12 hours. It was confirmed by solid content measurement that 95% thereof was reacted. Subsequently, 14.6 parts by mass of pyromellitic acid anhydride, 105.5 parts by mass of PGMEA, and 0.3 parts by mass of 1,8-diazabicyclo-[5.4.0]-7-undecene (DBU) as a reaction catalyst were added thereto, and the mixture was reacted at 120° C. for 7 hours. It was confirmed by acid value measurement that 98% or more of the acid anhydride was half-esterified, and the reaction was terminated. PGMEA was added thereto to adjust the concentration of solid contents to be 30%, thereby obtaining a comparative dispersant 1 having an acid value of 41 mgKOH/g and a weight-average molecular weight of 8,800.

<Production Method of Comparative Dispersant 2>

372 parts of n-butyl acrylate, 372 parts of methyl methacrylate, and 1,236 parts of propylene glycol monomethyl ether acetate (PGMAc) were charged into a reaction container equipped with gas inlet pipe, thermometer, condenser, and stirrer, and the reaction container was replaced with nitrogen gas. The inside of the reaction container was heated to 80° C., 80 parts of 1-thioglycerol and 0.75 parts of 2,2'-azobisisobutyronitrile were added thereto, and the mixture was reacted for 12 hours (first step). It was confirmed by solid content measurement that 95% thereof was reacted. Next, 130 parts of pyromellitic acid anhydride, 195 parts of PGMAc, and 1.0 part (1,000 ppm) of 1,8-diazabicyclo-[5.4.0]-7-undecene as a catalyst were added thereto, and the mixture was reacted at 120° C. for 7 hours (second step). It was confirmed by acid value measurement that 98% or more of the acid anhydride was half-esterified. Finally, 46 parts of 2-methacryloyloxyethyl isocyanate (MOI) and 69 parts of PGMAc were added thereto, and the reaction was performed until disappearance of a peak of 2,270 cm-1 based on the isocyanate group was confirmed by infrared spectroscopic analysis (IR) (third step). After confirming the disappearance of the peak, the reaction solution was cooled, and the solid content was adjusted with PGMAc, thereby obtaining a solution of a comparative dispersant 2 having a solid content of 30%.

<Production Method of Comparative Dispersant 3>

8 parts of 3-mercapto-1,2-propanediol, 12 parts of pyromellitic acid anhydride, 80 parts of propylene glycol monomethyl ether acetate (PGMAc), and 0.2 parts of monobutyltin oxide as a reaction catalyst were charged into a reaction container equipped with gas inlet pipe, thermometer, condenser, and stirrer, the reaction container was replaced with nitrogen gas, and the mixture was reacted at 120° C. for 5 hours. It was confirmed by acid value measurement that 95% or more of the acid anhydride was half-esterified.

Next, 30 parts of methyl methacrylate (MMA), 10 parts of t-butyl acrylate (tBA), 10 parts of ethyl acrylate (EA), 5 parts of methacrylic acid (MAA), 10 parts of benzyl methacrylate (BzMA), and 35 parts of 2-hydroxyethyl methacrylate (HEMA) were added thereto, the inside of the reaction container was heated to 80° C., 1 part of 2,2'-azobis(2,4-dimethylvaleronitrile) was added thereto, and the mixture was reacted for 12 hours.

It was confirmed by solid content measurement that 95% thereof was reacted.

Next, the inside of the flask was replaced with air, 38.0 parts of 2-methacryloyloxyethyl isocyanate (MOI) and 0.1 parts of hydroquinone were added thereto, and the mixture was reacted at 70° C. for 4 hours. After confirming by IR that a peak of 2,270 cm$^{-1}$ based on the isocyanate group disappeared, the reaction solution was cooled, and the solid content was adjusted with PGMAc, thereby obtaining a solution of a comparative dispersant 3 having a solid content of 30%.

The acid value of the obtained comparative dispersant 3 was 40 mgKOH/g and the weight-average molecular weight was 12,000.

<Production Method of Comparative Dispersant 4>

87 parts of 1-thioglycerol, 24 parts of 1,6-hexanediol, 235 parts of 3,3',4,4'-biphenyltricarboxylic acid anhydride, 650 parts of PGMAc, and 0.2 parts of monobutyltin oxide as a reaction catalyst were charged into a reaction container equipped with gas inlet pipe, thermometer, condenser, and stirrer, the reaction container was replaced with nitrogen gas, and the mixture was reacted at 120° C. for 5 hours (first step). It was confirmed by acid value measurement that 95% or more of the acid anhydride was half-esterified.

Next, 523 parts of the compound obtained in the first step expressed in terms of solid contents, 100 parts of 2-hydroxypropyl methacrylate, 50 parts of ethyl acrylate, 300 parts of methyl methacrylate, 300 parts of n-butyl methacrylate, 200 parts of benzyl methacrylate, 50 parts of methacrylic acid, and 663 parts of PGMAc were added thereto, the inside of the reaction container was heated to 80° C., 1.2 parts of 2,2'-azobis(2,4-dimethylvaleronitrile) was added thereto, and the mixture was reacted for 12 hours (second step). It was confirmed by solid content measurement that 95% thereof was reacted.

Finally, 500 parts of 50% PGMEA solution of the compound obtained in the second step, 31.0 parts of 2-acryloyloxyethyl isocyanate (AOI), and 0.1 parts of hydroquinone were added thereto, and the reaction was performed until the disappearance of a peak of 2270 cm$^{-1}$ based on the isocyanate group was confirmed by IR (third step). After confirming the disappearance of the peak, the reaction solution was cooled, and the solid content was adjusted with PGMAc, thereby obtaining a solution of a comparative dispersant 4 having a solid content of 30%. The acid value of the obtained comparative dispersant 4 was 118 mgKOH/g, the C=C value was 1,274 mmol/g, and the weight-average molecular weight was 7,000.

<Pigment Derivative>

Derivatives 2 to 5: compounds shown below

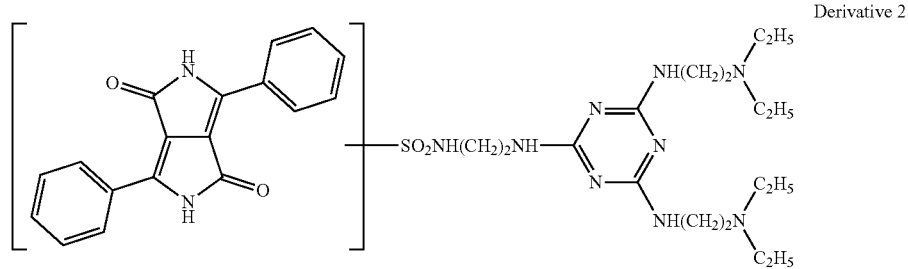

Derivative 2

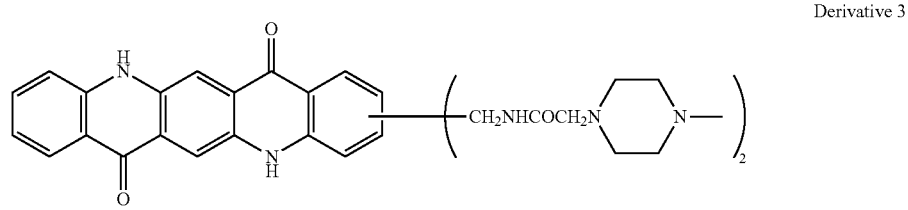

Derivative 3

-continued

Derivative 4

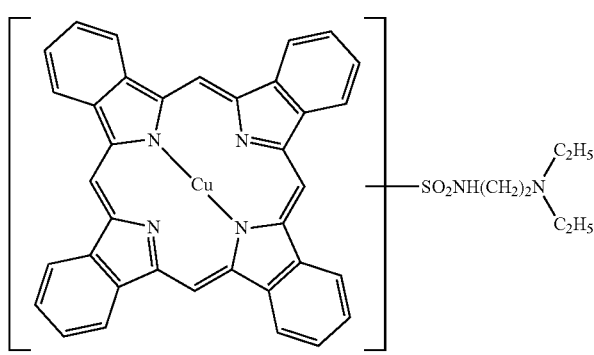

Derivative 5

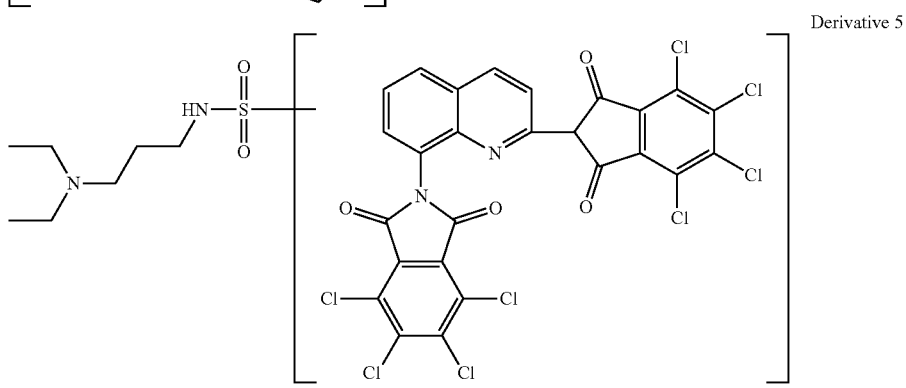

<G Pigment>
  PG36: C. I. Pigment Green 36
  PG58: C. I. Pigment Green 58
  PG7: C. I. Pigment Green 7
  PG59: C. I. Pigment Green 59
  PG62: C. I. Pigment Green 62
  PG63: C. I. Pigment Green 63:
<Y Pigment>
  PY139: C. 1. Pigment Yellow 139
  PY150: C. I. Pigment Yellow 150
  PY185: C. I. Pigment Yellow 185
<Other Pigments>
  PR254: C. I. Pigment Red 254
  PR264: C. I. Pigment Red 264
  PR272: C. I. Pigment Red 272
  PO71: C. I. Pigment Orange 71
  PB15:6: C. I. Pigment Blue 15:6
  PV23: C. I. Pigment Violet 23
<Solvent>
  PGMEA: propylene glycol monomethyl ether acetate
  PGME: Propylene glycol monomethyl ether Examples G1 to G62 and G81 to G83, and Comparative Examples G1 to G4

<Production of Curable Composition>
The following raw materials were mixed to prepare a curable composition.
  Dispersion liquid shown in Tables 7 to 10:39.4 parts by mass
  Resin C1: 0.58 parts by mass
  Polymerizable compound E1: 0.54 parts by mass
  Photopolymerization initiator F3: 0.33 parts by mass
  Surfactant H1: 4.17 parts by mass
  p-methoxyphenol: 0.0006 parts by mass
  Propylene glycol monomethyl ether acetate (PGMEA): 7.66 parts by mass Details of the materials indicated by the above abbreviations are as follows.

Resin C1: resin shown below, Mw: 10,000; the numerical value added to the main chain is the molar ratio, and the numerical value in the lower right of the parentheses in the ethyleneoxy unit represents the average repetition number

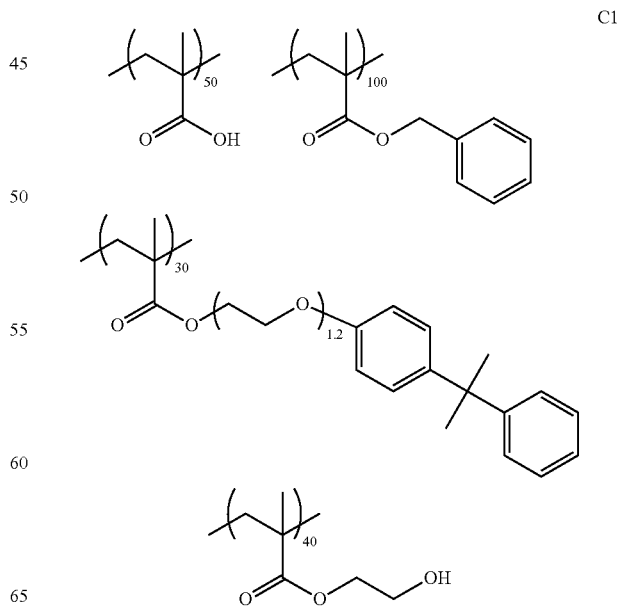

C1

Polymerizable Compound E1: KAYARAD DPHA (Manufactured by Nippon Kayaku Co., Ltd.)

Photopolymerization initiator F3: compound having the following structure

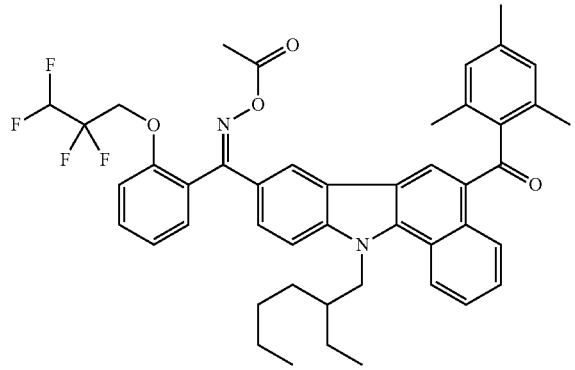 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

Surfactant H1:1 Mass % PGMEA Solution of the Following Mixture (Mw=14,000).

In the following formula, "%" representing the proportion of a repeating unit is mol %.

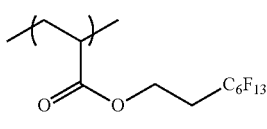

62%

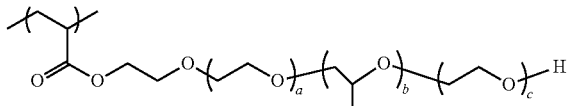

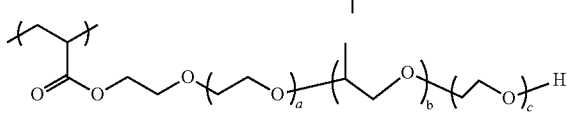

38% a + c = 14
b = 17

Examples G63 to G80

<Production of Curable Composition>

Each curable composition was prepared in the same manner as in Example G23, except that the types and amounts of dispersion liquid, resin, curable compound, photopolymerization initiator, and solvent used were changed as shown in Table 6.

TABLE 6

| Curable composition | Dispersion liquid Type | Part by mass | Resin Type | Part by mass | Curable compound Type | Part by mass | Photopolymerization initiator Type | Part by mass | Solvent Type | Part by mass |
|---|---|---|---|---|---|---|---|---|---|---|
| Composition G63 | Dispersion liquid G23 | 39.4 | C1 | 0.58 | E1 | 0.54 | F3 | 0.33 | PGMEA | 7.66 |
| Composition G64 | Dispersion liquid G23 | 39.4 | C2 | 0.58 | E1 | 0.54 | F3 | 0.33 | PGMEA | 7.66 |
| Composition G65 | Dispersion liquid G23 | 39.4 | C1 C2 | 0.29 0.29 | E1 | 0.54 | F3 | 0.33 | PGMEA | 7.66 |
| Composition G66 | Dispersion liquid G23 | 39.4 | C1 | 0.58 | E2 | 0.54 | F3 | 0.33 | PGMEA | 7.66 |
| Composition G67 | Dispersion liquid G23 | 39.4 | C1 | 0.58 | E3 | 0.54 | F3 | 0.33 | PGMEA | 7.66 |
| Composition G68 | Dispersion liquid G23 | 39.4 | C1 | 0.58 | E4 | 0.54 | F3 | 0.33 | PGMEA | 7.66 |
| Composition G69 | Dispersion liquid G23 | 39.4 | C1 | 0.58 | E5 | 0.54 | F3 | 0.33 | PGMEA | 7.66 |
| Composition G70 | Dispersion liquid G23 | 39.4 | C1 | 0.58 | E1 E2 | 0.27 0.27 | F3 | 0.33 | PGMEA | 7.66 |
| Composition G71 | Dispersion liquid G23 | 39.4 | C1 | 0.58 | E1 | 0.54 | F1 | 0.33 | PGMEA | 7.66 |
| Composition G72 | Dispersion liquid G23 | 39.4 | C1 | 0.58 | E1 | 0.54 | F2 | 0.33 | PGMEA | 7.66 |
| Composition G73 | Dispersion liquid G23 | 39.4 | C1 | 0.58 | E1 | 0.54 | F4 | 0.33 | PGMEA | 7.66 |
| Composition G74 | Dispersion liquid G23 | 39.4 | C1 | 0.58 | E1 | 0.54 | F5 | 0.33 | PGMEA | 7.66 |
| Composition G75 | Dispersion liquid G23 | 39.4 | C1 | 0.58 | E1 | 0.54 | F3 F4 | 0.22 0.11 | PGMEA | 7.66 |
| Composition G76 | Dispersion liquid G23 | 39.4 | C1 | 0.58 | E1 | 0.54 | F3 F4 | 0.22 0.11 | PGMEA Cyclohexanone | 3.83 3.83 |
| Composition G77 | Dispersion liquid G23 | 39.4 | C1 | 0.29 | E1 | 0.83 | F4 | 0.33 | PGMEA | 7.66 |
| Composition G78 | Dispersion liquid G23 | 39.4 | C1 | 0.87 | E1 | 0.25 | F4 | 0.33 | PGMEA | 7.66 |
| Composition G79 | Dispersion liquid G23 | 39.4 | C1 | 0.58 | E1 | 0.37 | F4 | 0.50 | PGMEA | 7.66 |
| Composition G80 | Dispersion liquid G23 | 39.4 | C1 | 0.58 | E1 | 0.65 | F4 | 0.22 | PGMEA | 7.66 |

Details of the compounds shown in Table 6 other than those described above are shown below.

Resin C2: resin shown below, Mw: 11,000; the numerical value added to the main chain is the molar ratio, and the numerical value in the lower right of the parentheses in the ethyleneoxy unit represents the average repetition number

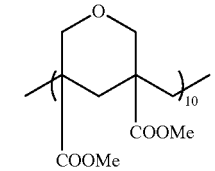

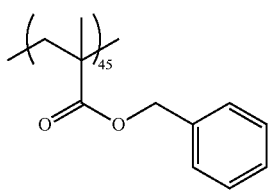

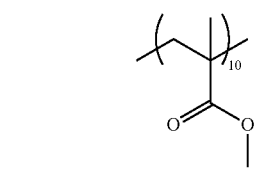

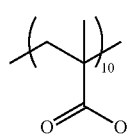

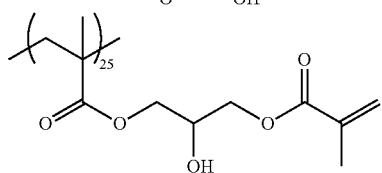

E2: compound having the following structure

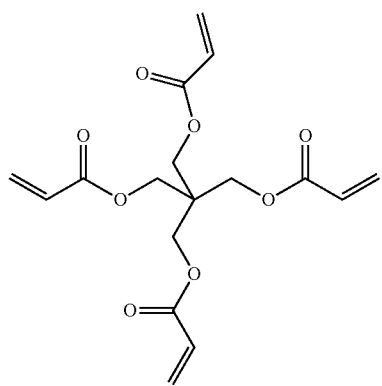 [SMILES: C=CC(=O)OCC(COC(=O)C=C)(COC(=O)C=C)COC(=O)C=C]

E3: compound having the following structure

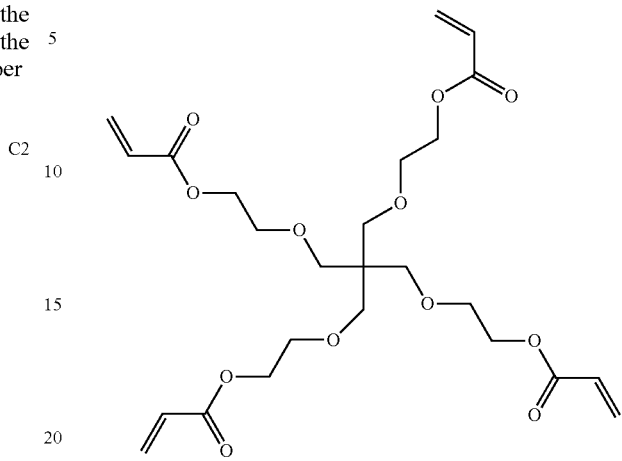

E4: compound having the following structure

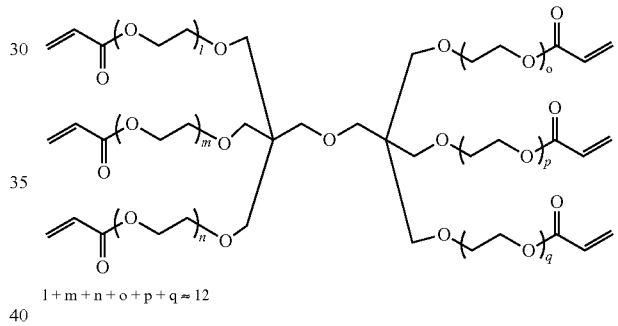

$l + m + n + o + p + q \approx 12$

E5: ARONIX TO-2349 (manufactured by TOAGOSEI CO., LTD.)

F1: IRGACURE-OXE 01 (manufactured by BASF), compound having the following structure F2: IRGACURE-OXE 02 (manufactured by BASF), compound having the following structure F4: IRGACURE 369 (manufactured by BASF), compound having the following structure F5: compound having the following structure

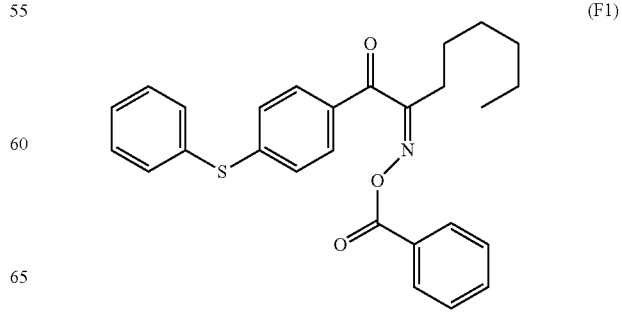

(F1)

-continued

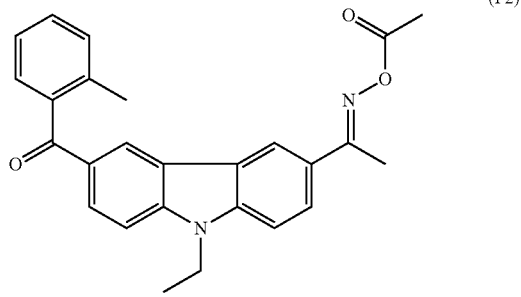
(F2)

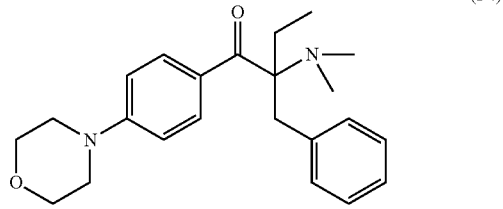
(F4)

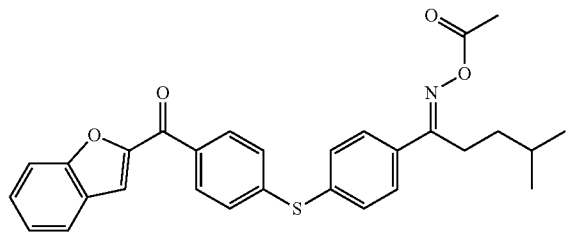
(F5)

Examples R1 to R12 and Comparative Examples R1 to R4

<Production of Curable Composition>

The following raw materials were mixed to prepare a curable composition.

Dispersion liquid shown in Table 11:60.0 parts by mass
Resin C1:10.0 parts by mass
Polymerizable compound E1: 3.10 parts by mass
Photopolymerization initiator F3: 0.80 parts by mass
Surfactant H1: 5.00 parts by mass
p-methoxyphenol: 0.001 parts by mass
Propylene glycol monomethyl ether acetate (PGMEA): 21.1 parts by mass Examples B1 to B6 and Comparative Examples B1 to B4

<Production of Curable Composition>

The following raw materials were mixed to prepare a curable composition.

Dispersion liquid shown in Table 12:65.0 parts by mass
Resin C1: 7.00 parts by mass
Polymerizable compound E1: 2.60 parts by mass
Photopolymerization initiator F3: 0.70 parts by mass
Surfactant H1: 5.00 parts by mass
p-methoxyphenol: 0.001 parts by mass
Propylene glycol monomethyl ether acetate (PGMEA): 19.7 parts by mass The following evaluations were carried out using the obtained curable compositions. The evaluation results are shown in Tables 7 to 12.

<Dispersion Stability>

An initial viscosity (V0) of the curable composition obtained above was measured with "RE-85L" manufactured by TOKI SANGYO CO., LTD. Next, the curable composition was allowed to stand at 45° C. for 3 days, and then a viscosity (V1) after standing was measured. The viscosity increase rate (%) of the curable composition after standing was calculated from the following expression, and the dispersion stability was evaluated according to the following evaluation standard. It can be said that the smaller the numerical value of the viscosity increase rate (%), the better the dispersion stability. The viscosity of the curable composition was measured in a state in which the temperature was adjusted to 25° C.

Viscosity increase rate (%)=[(Viscosity ($V1$) after standing−Initial viscosity ($V0$))/Initial viscosity ($V0$)]×100

A: 0≤viscosity increase rate≤3%
B: 3%<viscosity increase rate≤5%
C: 5%<viscosity increase rate≤10%
D: 10%<viscosity increase rate≤15%
E: 15%<viscosity increase rate <Moisture Resistance>

Each curable composition was applied to a silicon wafer using a spin coater such that the film thickness after pre-baking was 0.7 μm, and a heating treatment (pre-baking) was performed for 120 seconds using a hot plate at 100° C. Next, using an i-ray stepper exposure device FPA-3000 i5+ (manufactured by Canon Inc.), the silicon wafer was irradiated with light having a wavelength of 365 nm to perform exposure thereon with an exposure amount of 500 mJ/cm$^2$. Next, a heating treatment (post-baking) was performed for 300 seconds using a hot plate at 220° C., thereby forming a film. The obtained film was subjected to a moisture resistance test for 250 hours under conditions of a temperature of 130° C. and a humidity of 85% RH using a moisture resistance tester (HAST device PC-304R8, manufactured by HIRAYAMA Manufacturing Corporation), and then the film thickness after the moisture resistance test was measured.

In a case where [Film thickness after moisture resistance test]/[Film thickness before moisture resistance test]=X, the moisture resistance was evaluated according to the following standard.

AA: X≥0.99
A: 0.95≤X<0.99
B: 0.9≤X<0.95
C: 0.8≤X<0.9
D: 0.7≤X<0.8
E: X<0.7

<Adhesiveness>

CT-4000 (manufactured by Fujifilm Electronic Materials Co., Ltd.) was applied to a silicon wafer by a spin coating method so that a film thickness was 0.1 μm, and the silicon wafer was heated at 220° C. for 1 hour using a hot plate to form a base layer. Each curable composition was applied to this silicon wafer with a base layer by a spin coating method, and then the silicon wafer with a base layer was heated at 100° C. for 2 minutes using a hot plate to obtain a composition layer having a film thickness of 0.5 μm. Using an i-ray stepper FPA-3000 i5+ (manufactured by Canon Inc.), the composition layer was irradiated with light having a wavelength of 365 nm through a mask pattern in which each of the square pixels with a side length of 1.1 μm was arranged on the substrate in a region of 4 mm×3 mm to perform exposure thereon with an exposure amount of 500 mJ/cm$^2$. The composition layer after exposure was subjected to puddle development for 60 seconds at 23° C. using a 0.3 mass % of aqueous solution of tetramethylammonium hydroxide. Next, the composition layer was rinsed by spin showering with water and was cleaned with pure water. Thereafter, water droplets were splashed by high-pressure air, and the silicon wafer was naturally dried. Next, post-baking was performed for 300 seconds at 220° C. using a hot plate to form a pattern. The obtained pattern was observed using an optical microscope, and among all patterns, patterns closely attached with each other were counted to evaluate the adhesiveness.

A: all patterns were closely attached with each other.

B: patterns closely attached with each other were 95% or more and less than 100% of all patterns.

C: patterns closely attached with each other were 90% or more and less than 95% of all patterns.

D: patterns closely attached with each other were 85% or more and less than 90% of all patterns.

E: patterns closely attached with each other were less than 85% of all patterns.

<Developability>

CT-4000 (manufactured by Fujifilm Electronic Materials Co., Ltd.) was applied to a silicon wafer by a spin coating method so that a film thickness was 0.1 μm, and the silicon wafer was heated at 220° C. for 1 hour using a hot plate to form a base layer. Each curable composition was applied to this silicon wafer with a base layer by a spin coating method, and then the silicon wafer with a base layer was heated at 100° C. for 2 minutes using a hot plate to obtain a composition layer having a film thickness of 1 μm. Using an i-ray stepper FPA-3000 i5+ (manufactured by Canon Inc.), the composition layer was irradiated with light having a wavelength of 365 nm through a mask pattern in which each of the square pixels with a side length of 1.1 μm was arranged on the substrate in a region of 4 mm×3 mm to perform exposure thereon with an exposure amount of 200 mJ/cm². The composition layer after exposure was subjected to puddle development for 60 seconds at 23° C. using a 0.3 mass % of aqueous solution of tetramethylammonium hydroxide. Next, the composition layer was rinsed by spin showering with water and was cleaned with pure water. Thereafter, water droplets were splashed by high-pressure air, and the silicon wafer was naturally dried. Next, post-baking was performed for 300 seconds at 200° C. using a hot plate to form a pattern. The presence or absence of residues between the patterns was observed to evaluate the developability.

The area (non-exposed portion) other than the pattern formation area was observed with a scanning electron microscope (SEM) (magnification: 10,000 times), the number of residues having a diameter of 0.1 μm or more per an area (one area) of 5 μm×5 μm of the non-exposed portion was counted, and the residue was evaluated according to the following evaluation standard.

A: there was no residue per one area.

B: number of residues per one area was less than 10.

C: number of residues per one area was 10 or more and less than 20.

D: number of residues per one area was 20 or more and less than 30.

E: number of residues per one area was 30 or more and less than 100.

F: development was not possible at all.

TABLE 7

| | Dispersion liquid | Dispersion stability | Moisture resistance | Adhesiveness | Developability |
|---|---|---|---|---|---|
| Example G1 | Dispersion liquid G1 | A | A | B | A |
| Example G2 | Dispersion liquid G2 | A | A | B | A |
| Example G3 | Dispersion liquid G3 | A | A | B | A |
| Example G4 | Dispersion liquid G4 | A | A | B | B |
| Example G5 | Dispersion liquid G5 | B | A | A | B |
| Example G6 | Dispersion liquid G6 | A | A | A | A |
| Example G7 | Dispersion liquid G7 | B | A | B | A |
| Example G8 | Dispersion liquid G8 | B | A | B | A |
| Example G9 | Dispersion liquid G9 | A | B | B | A |
| Example G10 | Dispersion liquid G10 | A | A | B | A |
| Example G11 | Dispersion liquid G11 | A | B | B | A |
| Example G12 | Dispersion liquid G12 | A | B | B | A |
| Example G13 | Dispersion liquid G13 | A | B | B | A |
| Example G14 | Dispersion liquid G14 | A | A | B | A |
| Example G15 | Dispersion liquid G15 | A | B | B | A |
| Example G16 | Dispersion liquid G16 | A | A | B | A |
| Example G17 | Dispersion liquid G17 | B | A | B | A |
| Example G18 | Dispersion liquid G18 | B | A | B | A |
| Example G19 | Dispersion liquid G19 | A | A | B | A |
| Example G20 | Dispersion liquid G20 | A | A | B | A |
| Example G21 | Dispersion liquid G21 | A | A | B | A |
| Example G22 | Dispersion liquid G22 | B | AA | B | B |

TABLE 8

| | Dispersion liquid | Dispersion stability | Moisture resistance | Adhesiveness | Developability |
|---|---|---|---|---|---|
| Example G23 | Dispersion liquid G23 | A | AA | B | A |
| Example G24 | Dispersion liquid G24 | A | AA | B | A |
| Example G25 | Dispersion liquid G25 | B | AA | A | B |
| Example G26 | Dispersion liquid G26 | A | AA | A | A |
| Example G27 | Dispersion liquid G27 | B | AA | A | B |
| Example G28 | Dispersion liquid G28 | B | AA | B | A |
| Example G29 | Dispersion liquid G29 | B | A | B | A |

TABLE 8-continued

|  | Dispersion liquid | Dispersion stability | Moisture resistance | Adhesiveness | Developability |
|---|---|---|---|---|---|
| Example G30 | Dispersion liquid G30 | B | AA | B | A |
| Example G31 | Dispersion liquid G31 | A | A | B | A |
| Example G32 | Dispersion liquid G32 | A | A | B | A |
| Example G33 | Dispersion liquid G33 | A | A | B | A |
| Example G34 | Dispersion liquid G34 | A | B | B | A |
| Example G35 | Dispersion liquid G35 | A | A | B | A |
| Example G36 | Dispersion liquid G36 | A | A | B | A |
| Example G37 | Dispersion liquid G37 | A | AA | B | A |
| Example G38 | Dispersion liquid G38 | A | A | B | A |
| Example G39 | Dispersion liquid G39 | A | AA | B | A |
| Example G40 | Dispersion liquid G40 | B | AA | B | A |
| Example G41 | Dispersion liquid G41 | B | AA | B | A |
| Example G42 | Dispersion liquid G42 | A | AA | B | A |
| Example G43 | Dispersion liquid G43 | A | AA | B | A |
| Example G44 | Dispersion liquid G44 | A | AA | B | A |
| Example G45 | Dispersion liquid G45 | B | AA | B | B |
| Example G46 | Dispersion liquid G46 | A | A | A | A |
| Example G47 | Dispersion liquid G47 | A | A | B | A |
| Example G48 | Dispersion liquid G48 | B | A | B | A |
| Comparative example G1 | Comparative dispersion liquid G1 | A | E | C | B |
| Comparative example G2 | Comparative dispersion liquid G2 | B | D | B | B |
| Comparative example G3 | Comparative dispersion liquid G3 | E | B | B | C |
| Comparative example G4 | Comparative dispersion liquid G4 | D | C | D | A |

TABLE 9

|  | Dispersion liquid | Dispersion stability | Moisture resistance | Adhesiveness | Developability |
|---|---|---|---|---|---|
| Example G49 | Dispersion liquid G49 | A | AA | A | A |
| Example G50 | Dispersion liquid G50 | A | AA | A | A |
| Example G51 | Dispersion liquid G51 | A | AA | A | A |
| Example G52 | Dispersion liquid G52 | A | AA | A | A |
| Example G53 | Dispersion liquid G53 | A | AA | A | A |
| Example G54 | Dispersion liquid G54 | A | AA | A | A |
| Example G55 | Dispersion liquid G55 | A | AA | A | A |
| Example G56 | Dispersion liquid G56 | A | AA | A | A |
| Example G57 | Dispersion liquid G57 | A | AA | A | A |
| Example G58 | Dispersion liquid G58 | A | AA | A | A |
| Example G59 | Dispersion liquid G59 | A | AA | A | A |
| Example G60 | Dispersion liquid G60 | A | AA | A | A |
| Example G61 | Dispersion liquid G61 | A | AA | A | A |
| Example G62 | Dispersion liquid G62 | A | AA | A | A |

TABLE 10

|  | Curable composition | Dispersion stability | Moisture resistance | Adhesiveness | Developability |
|---|---|---|---|---|---|
| Example G63 | Composition G63 | A | AA | B | A |
| Example G64 | Composition G64 | A | AA | B | A |
| Example G65 | Composition G65 | A | AA | B | A |
| Example G66 | Composition G66 | A | AA | B | A |
| Example G67 | Composition G67 | A | AA | B | A |
| Example G68 | Composition G68 | A | AA | B | A |
| Example G69 | Composition G69 | A | AA | B | A |
| Example G70 | Composition G70 | A | AA | B | A |
| Example G71 | Composition G71 | A | AA | B | A |
| Example G72 | Composition G72 | A | AA | B | A |
| Example G73 | Composition G73 | A | AA | B | A |
| Example G74 | Composition G74 | A | AA | B | A |
| Example G75 | Composition G75 | A | AA | B | A |
| Example G76 | Composition G76 | A | AA | B | A |
| Example G77 | Composition G77 | A | AA | B | A |

TABLE 10-continued

|  | Curable composition | Dispersion stability | Moisture resistance | Adhesiveness | Developability |
|---|---|---|---|---|---|
| Example G78 | Composition G78 | A | AA | B | A |
| Example G79 | Composition G79 | A | AA | B | A |
| Example G80 | Composition G80 | A | AA | B | A |
| Example G81 | Dispersion liquid G81 | A | AA | B | A |
| Example G82 | Dispersion liquid G82 | A | AA | B | A |
| Example G83 | Dispersion liquid G83 | A | AA | B | A |

TABLE 11

|  | Dispersion liquid | Dispersion stability | Moisture resistance | Adhesiveness | Developability |
|---|---|---|---|---|---|
| Example R1 | Dispersion liquid R1 | A | A | B | A |
| Example R2 | Dispersion liquid R2 | A | A | A | A |
| Example R3 | Dispersion liquid R3 | A | A | B | A |
| Example R4 | Dispersion liquid R4 | A | AA | B | A |
| Example R5 | Dispersion liquid R5 | A | AA | A | A |
| Example R6 | Dispersion liquid R6 | A | AA | B | A |
| Example R7 | Dispersion liquid R7 | A | AA | A | A |
| Example R8 | Dispersion liquid R8 | A | AA | A | A |
| Example R9 | Dispersion liquid R9 | A | AA | A | A |
| Example R10 | Dispersion liquid R10 | A | AA | A | A |
| Example R11 | Dispersion liquid R11 | A | AA | A | A |
| Example R12 | Dispersion liquid R12 | A | AA | A | A |
| Comparative example R1 | Comparative dispersion liquid R1 | A | E | C | B |
| Comparative example R2 | Comparative dispersion liquid R2 | B | D | B | B |
| Comparative example R3 | Comparative dispersion liquid R3 | E | B | B | C |
| Comparative example R4 | Comparative dispersion liquid R4 | D | C | D | A |

TABLE 12

|  | Dispersion liquid | Dispersion stability | Moisture resistance | Adhesiveness | Developability |
|---|---|---|---|---|---|
| Example B1 | Dispersion liquid B1 | A | A | B | A |
| Example B2 | Dispersion liquid B2 | A | A | A | A |
| Example B3 | Dispersion liquid B3 | A | A | B | A |
| Example B4 | Dispersion liquid B4 | A | AA | B | A |
| Example B5 | Dispersion liquid B5 | A | AA | A | A |
| Example B6 | Dispersion liquid B6 | A | AA | B | A |
| Comparative example B1 | Comparative dispersion liquid B1 | A | E | C | B |
| Comparative example B2 | Comparative dispersion liquid B2 | B | D | B | B |
| Comparative example B3 | Comparative dispersion liquid B3 | E | B | B | C |
| Comparative example B4 | Comparative dispersion liquid B4 | D | C | D | A |

As shown in Tables 7 to 12, the curable compositions of Examples were superior in dispersion stability and moisture resistance of the cured product to be obtained, as compared with the curable compositions of Comparative Examples.

In addition, as shown in Tables 7 to 12, the curable compositions of Examples were excellent in developability and adhesiveness of the cured product to be obtained.

Example Y1

In Example G23, the same effects could be obtained even in a case where the dispersion liquid Y1 was used instead of the dispersion liquid G23.

Examples G101 to G183, R101 to R112, and B101 to B106

In Examples G101 to G183, R101 to R112, and B101 to B106, the curable compositions of Examples G1 to G83, R1 to R12, and B1 to B6 were used, respectively.

Such that color did not overlap with color of the curable composition, overlapping color compositions of Red composition, Green composition, and Blue composition, which will be described later, were used in place of the above-described curable compositions, respectively. For example, the color of the curable compositions of Examples G1 to G83 was Green, the color of the curable compositions of Examples R1 to R12 was Red, and the color of the curable compositions of Examples B1 to B6 was Blue.

A silicon wafer was coated with a Red composition by a spin coating method so that the thickness of a film after film formation was 1.0 µm. Next, the silicon wafer was heated using a hot plate at 100° C. for 2 minutes. Next, using an i-ray stepper exposure device FPA-3000 i5+ (manufactured by Canon Inc.), exposure was performed at 1,000 mJ/cm$^2$ through a mask having a dot pattern of 2 µm square. Next, puddle development was performed at 23° C. for 60 seconds using a 0.3 mass % of tetramethylammonium hydroxide (TMAH) aqueous solution. Next, the coating film was rinsed by spin showering and was cleaned with pure water. Next, the coating film was heated using a hot plate at 200° C. for 5 minutes. As a result, the Red composition was patterned on the pattern of the infrared cut filter. Likewise, a Green composition and a Blue composition were sequentially patterned to form red, green, and blue colored patterns (Bayer pattern).

The Bayer pattern refers to a pattern, as disclosed in the specification of U.S. Pat. No. 3,971,065A, in which a 2×2 array of color filter element having one Red element, two Green elements, and one Blue element is repeated.

This filter was incorporated into a solid-state imaging element using a known method.

The obtained solid-state imaging element was irradiated with infrared rays by an infrared light emitting diode (infrared LED) in a low-illuminance environment (0.001 Lux) to acquire images. Next, the imaging performance of the solid-state imaging element was evaluated.

In a case where any of the curable compositions obtained in Examples G1 to G83, R1 to R12, or B1 to B6 was used, a solid-state imaging element having suitable image recognition ability and moisture resistance was obtained.

The Red composition, the Green composition, and the Blue composition other than the curable compositions of Examples G to G83, R1 to R12, and B1 to B6, which were used in Examples G101 to G183, R101 to R112, and B101 to B106, are as follows.

—Red Composition—

The following components were mixed and stirred, and the obtained mixture was filtered through a nylon filter (manufactured by Nihon Pall Corporation) having a pore size of 0.45 µm to prepare a Red composition.

Red pigment dispersion liquid: 51.7 parts by mass
Resin 4 (40 mass % PGMEA solution): 0.6 parts by mass
Polymerizable compound 4:0.6 parts by mass
Photopolymerization initiator 1:0.3 parts by mass
Surfactant 1:4.2 parts by mass
PGMEA: 42.6 parts by mass —Green Composition—

The following components were mixed and stirred, and the obtained mixture was filtered through a nylon filter (manufactured by Nihon Pall Corporation) having a pore size of 0.45 µm to prepare a Green composition.

Green pigment dispersion liquid: 73.7 parts by mass
Resin 4 (40 mass % PGMEA solution): 0.3 parts by mass
Polymerizable compound 1:1.2 parts by mass
Photopolymerization initiator 1:0.6 parts by mass
Surfactant 1:4.2 parts by mass
Ultraviolet absorber (UV-503, manufactured by Daito Chemical Co., Ltd.): 0.5 parts by mass
PGMEA: 19.5 parts by mass —Blue Composition—

The following components were mixed and stirred, and the obtained mixture was filtered through a nylon filter (manufactured by Nihon Pall Corporation) having a pore size of 0.45 µm to prepare a Blue composition.

Blue pigment dispersion liquid: 44.9 parts by mass
Resin 4 (40 mass % PGMEA solution): 2.1 parts by mass
Polymerizable compound 1:1.5 parts by mass
Polymerizable compound 4:0.7 parts by mass
Photopolymerization initiator 1:0.8 parts by mass
Surfactant 1:4.2 parts by mass
PGMEA: 45.8 parts by mass Raw materials used in the Red composition, the Green composition, and the Blue composition are as follows.

Red Pigment Dispersion Liquid

A mixed solution consisting of 9.6 parts by mass of C. I. Pigment Red 254, 4.3 parts by mass of C. I. Pigment Yellow 139, 6.8 parts by mass of a dispersant (Disperbyk-161, manufactured by BYK Chemie), and 79.3 parts by mass of PGMEA was mixed and dispersed using a beads mill (zirconia beads; diameter: 0.3 mm) for 3 hours to prepare a pigment dispersion liquid. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2,000 kg/cm$^3$ at a flow rate of 500 g/min. This dispersion treatment was repeated 10 times, thereby obtaining a Red pigment dispersion liquid.

Green Pigment Dispersion Liquid

A mixed solution consisting of 6.4 parts by mass of C. I. Pigment Green 36, 5.3 parts by mass of C. I. Pigment Yellow 150, 5.2 parts by mass of a dispersant (Disperbyk-161, manufactured by BYK Chemie), and 83.1 parts by mass of PGMEA was mixed and dispersed using a beads mill (zirconia beads; diameter: 0.3 mm) for 3 hours to prepare a pigment dispersion liquid. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2,000 kg/cm$^3$ at a flow rate of 500 g/min. This dispersion treatment was repeated 10 times. As a result, a Green pigment dispersion liquid was obtained.

Blue Pigment Dispersion Liquid

A mixed solution consisting of 9.7 parts by mass of C. I. Pigment Blue 15:6, 2.4 parts by mass of C. I. Pigment Violet 23, 5.5 parts of a dispersant (Disperbyk-161, manufactured by BYK Chemie), and 82.4 parts of PGMEA was mixed and dispersed using a beads mill (zirconia beads; diameter: 0.3 mm) for 3 hours to prepare a pigment dispersion liquid. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2,000 kg/cm$^3$ at a flow rate of 500 g/min. This dispersion treatment was repeated 10 times, thereby obtaining a Blue pigment dispersion liquid.

Polymerizable compound 1: KAYARAD DPHA (mixture of dipentaerythritol hexaacrylate and dipentaerythritol pentaacrylate, manufactured by Nippon Kayaku Co., Ltd.)

Polymerizable compound 4: following structure

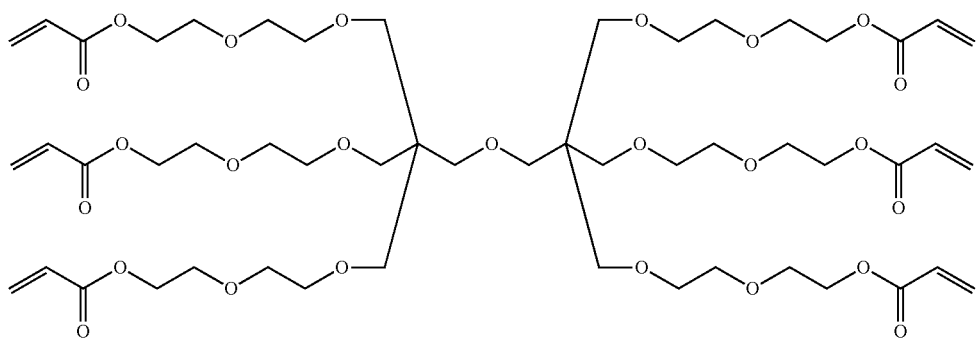 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Polymerizable compound 5: following structure (mixture in which a molar ratio between a left compound and a right compound is 7:3)

Resin 4: following structure (acid value: 70 mgKOH/g, Mw=11,000; a ratio in a constitutional unit is a molar ratio)

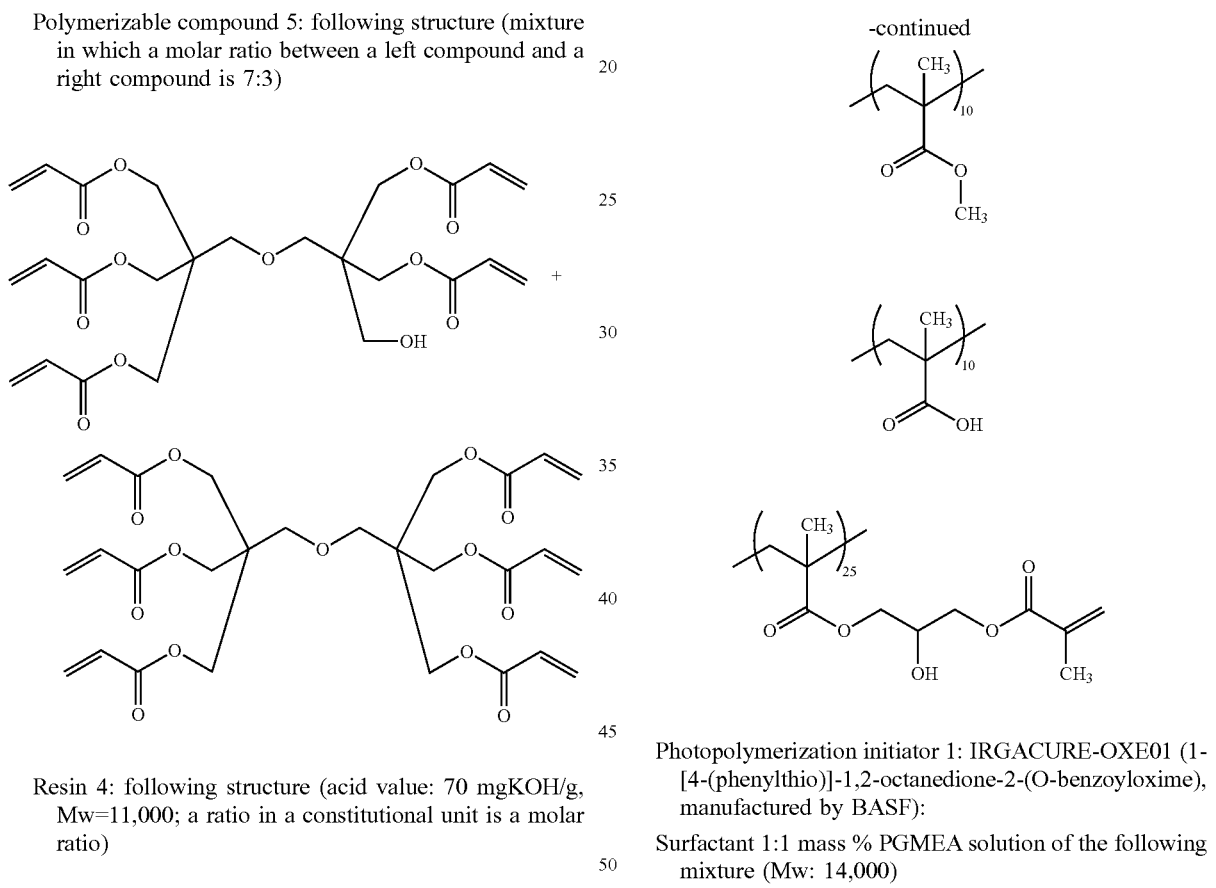

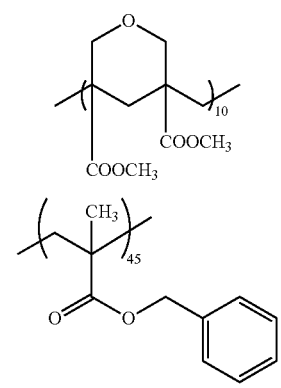

Photopolymerization initiator 1: IRGACURE-OXE01 (1-[4-(phenylthio)]-1,2-octanedione-2-(O-benzoyloxime), manufactured by BASF):

Surfactant 1:1 mass % PGMEA solution of the following mixture (Mw: 14,000)

In the following formula, the unit of % (62% and 38%) indicating the proportion of a constitutional unit is mass %.

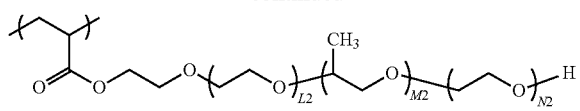

L1 + N1 + L2 + N2 = 14
M1 + M2 = 17

38%

Example 201

<Production of Curable Composition>

The following raw materials were mixed to prepare a curable composition.

2.1 parts by mass of C. I. Pigment Blue 15:3, 3.5 parts by mass of the dispersant B1, and propylene glycol monomethyl ether acetate were mixed, and 230 parts by mass of zirconia beads having a diameter of 0.3 mm were added thereto to perform a dispersion treatment for 5 hours using a paint shaker. The beads were separated by filtration, and a pigment dispersion liquid having a solid content of 20 weight % was produced.

Next, the obtained pigment dispersion liquid, propylene glycol monomethyl ether acetate in a total added amount of 90.0 parts by mass with the above-described added amount, 1.1 parts by mass of the dispersant B1, 2.7 parts by mass of a polymerizable compound M2 (the following compound), 0.5 parts by mass of a photopolymerization initiator I2 (the following compound), 0.10 parts by mass of an ultraviolet absorber U1 (the following compound), and 0.01 parts by mass of the surfactant 1 (the above-described compound) were mixed to prepare a curable composition (cyan color).

In a case where the same evaluations as above were carried out using the obtained curable composition, the same evaluation results as in Example G23 were obtained.

M2: mixture of a compound having the following structure (compound on the left: compound on the right=7:3 (mass ratio))

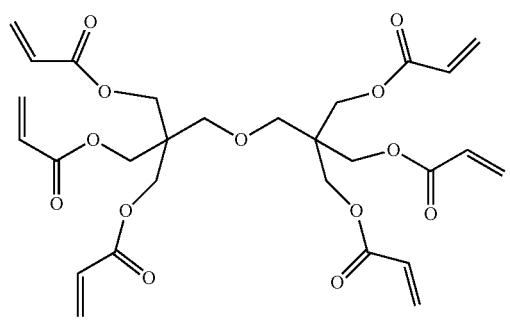

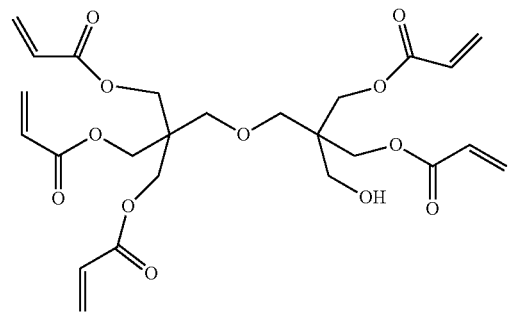

I2: compound having the following structure (oxime compound)

U1: compound having the following structure (conjugated diene compound)

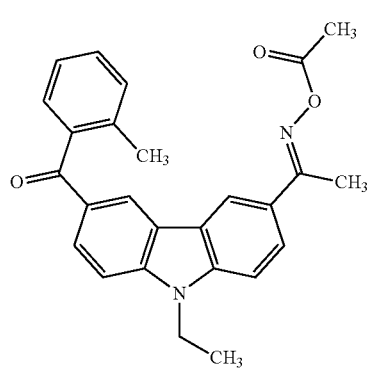

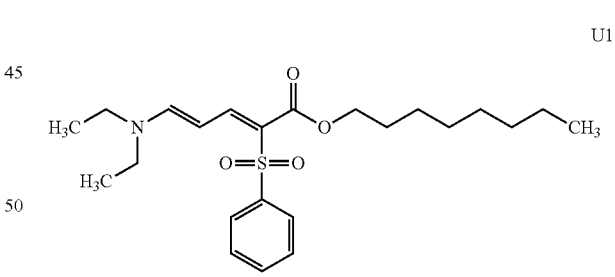

[Production of Dispersion Liquid]

<Dispersion Liquid G301>

A dispersion liquid was produced in the same manner as in the dispersion liquid G23, except that the G pigment was changed to a pigment 1.

<Dispersion Liquid G302>

A dispersion liquid was produced in the same manner as in the dispersion liquid G23, except that the G pigment was changed to a pigment 2.

Structures of the pigment 1 and the pigment 2 are as follows.

Pigment 1

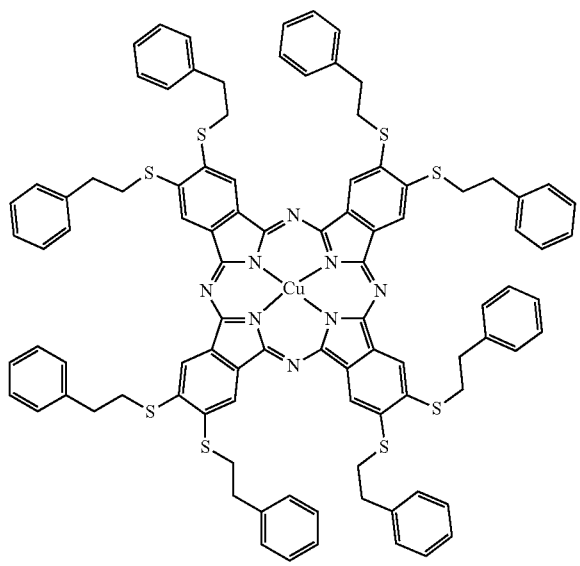

Pigment 2

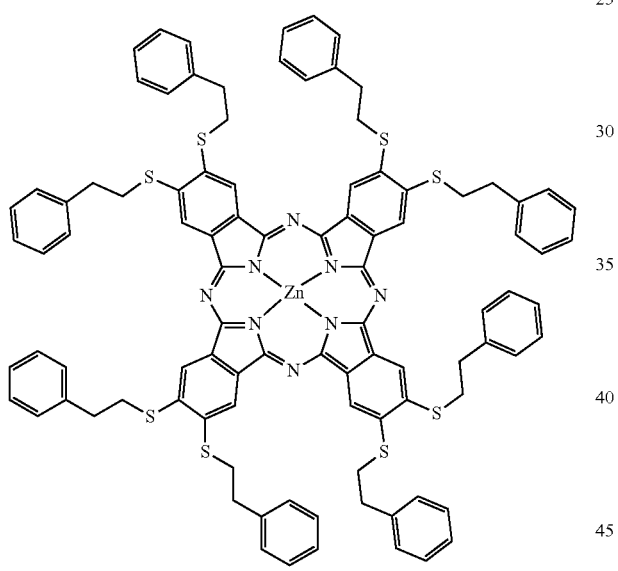

Example G301

A curable composition was produced in the same manner as in Example G1, except that the dispersion liquid G1 was changed to the dispersion liquid G301, and in a case where the same evaluations as above were carried out using the obtained curable composition, the same evaluation results as in Example G23 were obtained.

Example G302

A curable composition was produced in the same manner as in Example G1, except that the dispersion liquid G1 was changed to the dispersion liquid G302, and in a case where the same evaluations as above were carried out using the obtained curable composition, the same evaluation results as in Example G23 were obtained.

The disclosure of Japanese Patent Application No. 2019-154275 filed on Aug. 27, 2019 is incorporated in the present specification by reference.

All documents, patent applications, and technical standards described in the present specification are incorporated herein by reference to the same extent as in a case of being specifically and individually noted that individual documents, patent applications, and technical standards are incorporated by reference.

What is claimed is:

1. A curable composition comprising:

a pigment;

a curable compound; and a resin A having a constitutional unit represented by Formula (1), a constitutional unit represented by Formula (2), and a constitutional unit which has a molecular weight of 1,000 or less and is represented by at least one selected from formulas 3-A to 3-R,

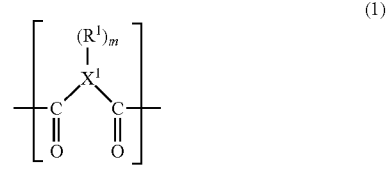

(1)

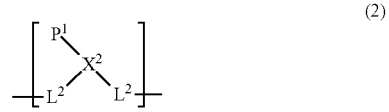

(2)

in Formulae (1) to (2), $X^1$ represents an (m+2)-valent organic group, $X^2$ represents a trivalent organic group, m represents an integer of 1 to 4, $L^2$'s each independently represent O or NR, R represents a hydrogen atom, an alkyl group, or an aryl group, $P^1$ represents a group having a polymer chain, and $R^1$'s each independently represent a substituent,

3-A

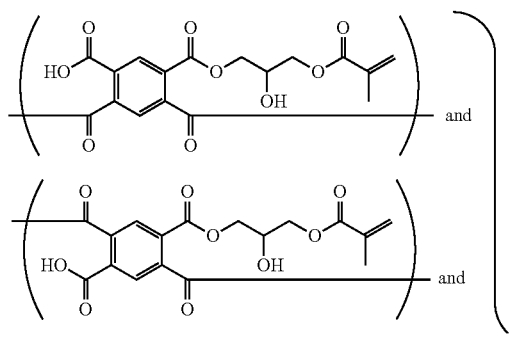

-continued
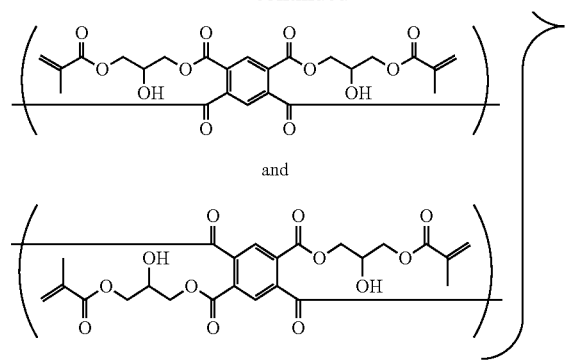
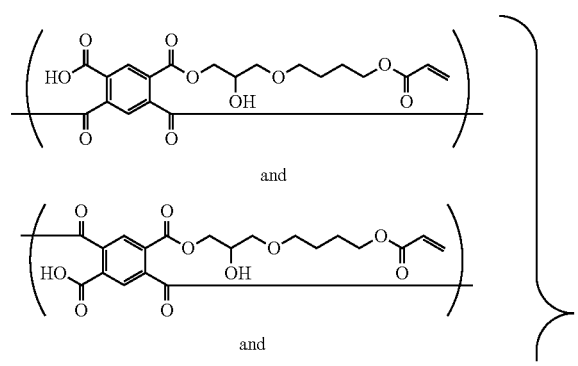
3-B
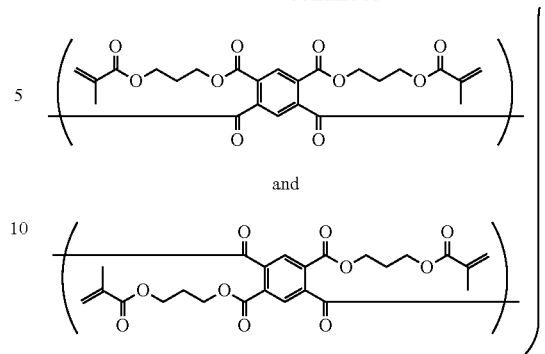
3-D
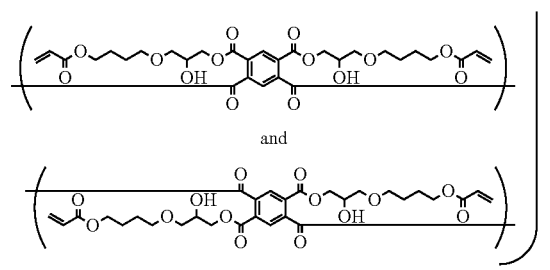
3-C

3-E
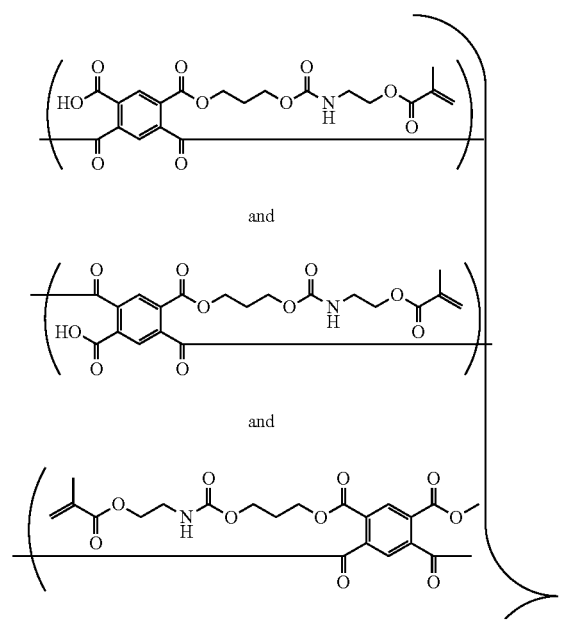
and
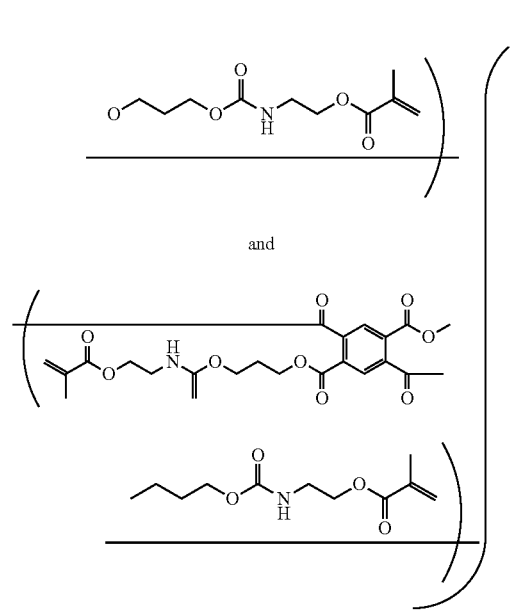
3F
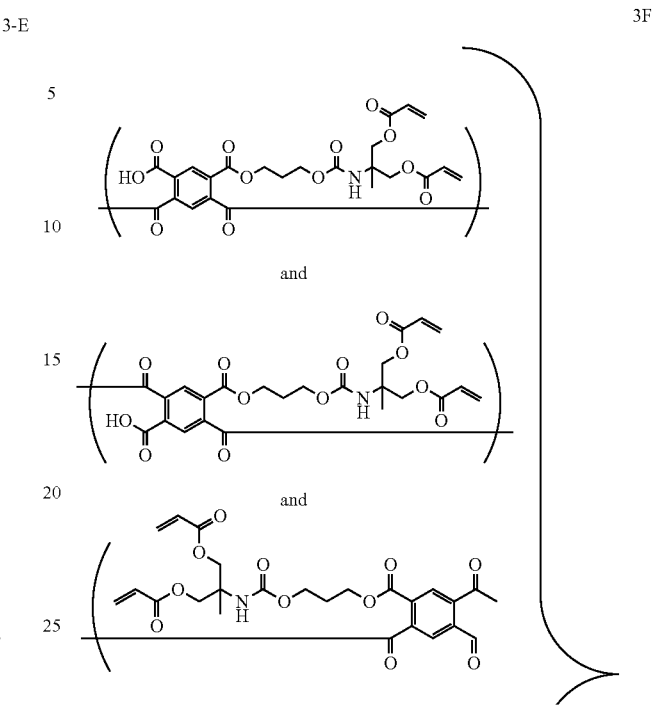
and
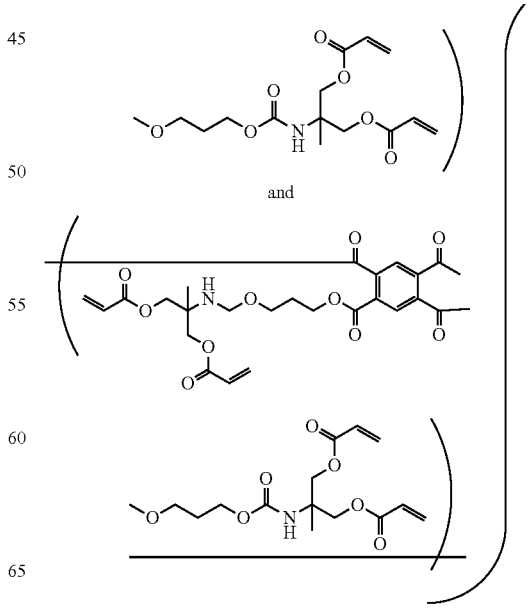

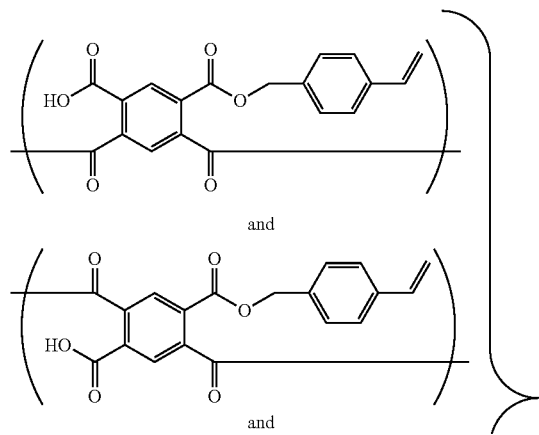
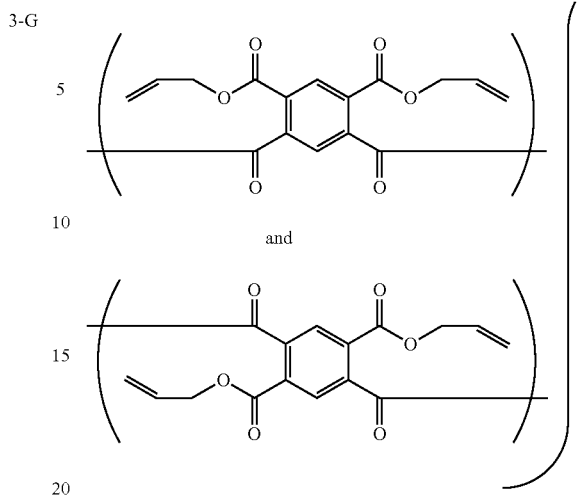
3-G
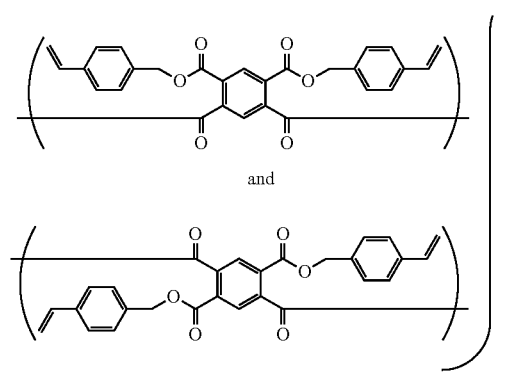
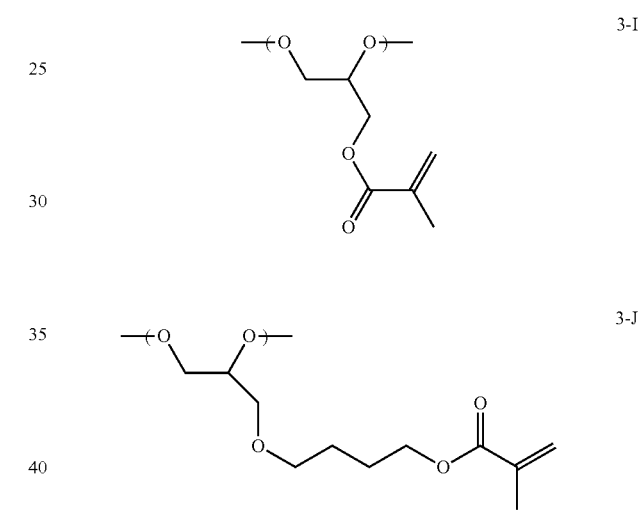
3-I
3-J
3-H
3-K
3-L
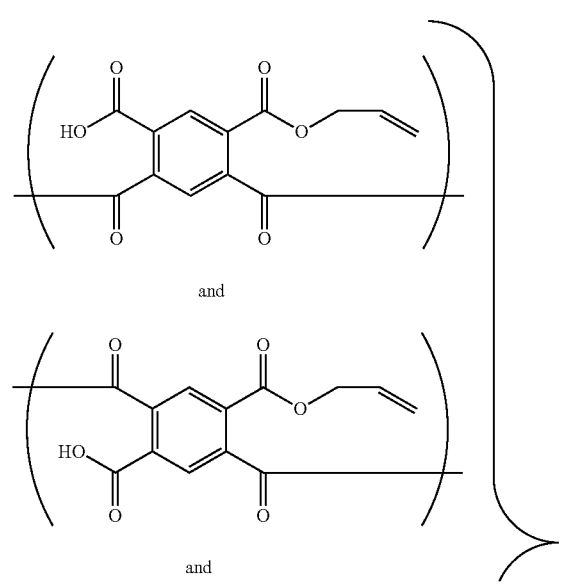
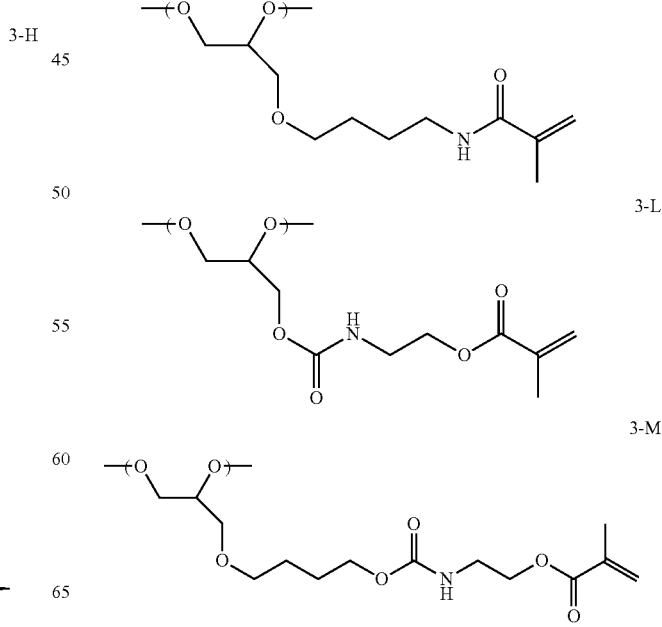
3-M

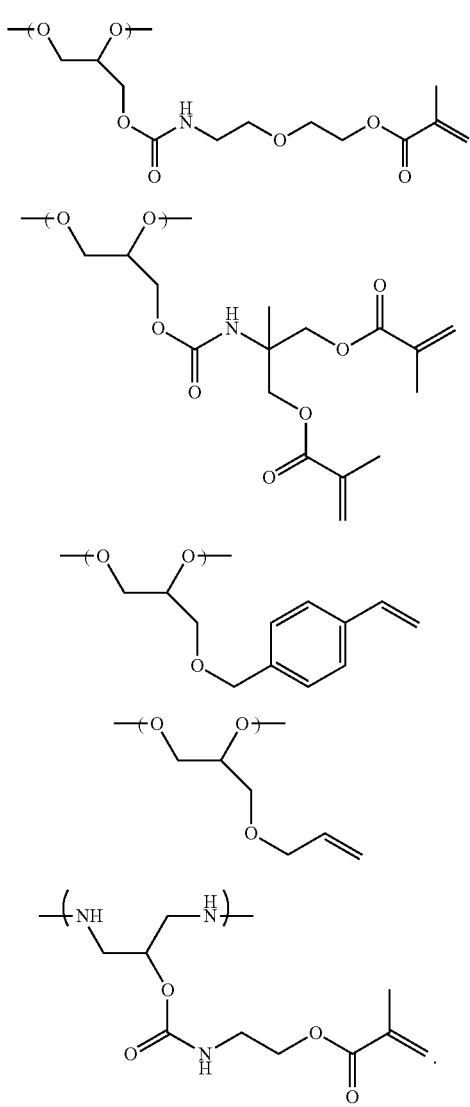

2. The curable composition according to claim 1, wherein $R^1$'s are each independently an acid group or a salt of an acid group.

3. The curable composition according to claim 1, wherein $R^1$'s are each independently a carboxy group or a salt of a carboxy group.

4. The curable composition according to claim 1, wherein $X^1$ is an (m+2)-valent organic group having an aromatic ring.

5. The curable composition according to claim 1, wherein m is 2.

6. The curable composition according to claim 1, wherein $L^2$ is O or NH.

7. The curable composition according to claim 1, wherein $X^2$ is a trivalent aliphatic group having a thioether bond.

8. The curable composition according to claim 1, wherein $P^1$ is a group having an acrylic resin chain, a polyester chain, or a polyether chain.

9. The curable composition according to claim 1, wherein the constitutional unit which has a molecular weight of 1,000 or less and is represented by at least one selected from formulas 3-A to 3-H.

10. The curable composition according to claim 1, wherein the constitutional unit which has a molecular weight of 1,000 or less and is represented by at least one selected from formulas 3-I to 3-R.

11. The curable composition according to claim 1, further comprising:
a polymerization initiator.

12. The curable composition according to claim 11, wherein the polymerization initiator includes an oxime compound.

13. The curable composition according to claim 1, further comprising:
a pigment derivative.

14. A cured product obtained by curing the curable composition according to claim 1.

15. A color filter comprising:
the cured product according to claim 14.

16. A solid-state imaging element comprising:
the color filter according to claim 15.

17. An image display device comprising:
the color filter according to claim 15.

* * * * *